US010068962B2

(12) United States Patent
Abe et al.

(10) Patent No.: US 10,068,962 B2
(45) Date of Patent: Sep. 4, 2018

(54) METHOD OF MANUFACTURING SEMICONDUCTOR DEVICE

(71) Applicant: Renesas Electronics Corporation, Tokyo (JP)

(72) Inventors: Satoshi Abe, Tokyo (JP); Hiraku Chakihara, Tokyo (JP); Kyoko Umeda, Tokyo (JP); Yoshiyuki Kawashima, Tokyo (JP); Kentaro Saito, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 8 days.

(21) Appl. No.: 14/992,067

(22) Filed: Jan. 11, 2016

(65) Prior Publication Data

US 2016/0260795 A1    Sep. 8, 2016

(30) Foreign Application Priority Data

Mar. 3, 2015    (JP) .................................. 2015-040931

(51) Int. Cl.
| | |
|---|---|
| *H01L 29/78* | (2006.01) |
| *H01L 27/108* | (2006.01) |
| *H01L 49/02* | (2006.01) |
| *H01L 27/11573* | (2017.01) |
| *H01L 27/06* | (2006.01) |

(52) U.S. Cl.
CPC .......... *H01L 28/60* (2013.01); *H01L 27/0629* (2013.01); *H01L 27/11573* (2013.01)

(58) Field of Classification Search
CPC ......... H01L 27/10829; H01L 27/10835; H01L 28/60; H01L 28/87; H01L 28/91; H01G 4/30; H01G 4/302; H01G 4/304; H01G 4/306

USPC ................. 257/303, 306, 307, 532
See application file for complete search history.

(56) References Cited

U.S. PATENT DOCUMENTS

| | | | | |
|---|---|---|---|---|
| 4,470,099 A | * | 9/1984 | Sawairi | ..................... H01G 4/38 |
| | | | | 361/328 |
| 4,914,546 A | * | 4/1990 | Alter | ................... H01L 27/0805 |
| | | | | 257/306 |
| 5,191,510 A | * | 3/1993 | Huffman | ........... H01L 27/11502 |
| | | | | 257/295 |

(Continued)

FOREIGN PATENT DOCUMENTS

| | | |
|---|---|---|
| JP | 2003-309182 A | 10/2003 |
| JP | 2009-99640 A | 5/2009 |

*Primary Examiner* — Earl Taylor
(74) *Attorney, Agent, or Firm* — Sughrue Mion, PLLC

(57) ABSTRACT

In a semiconductor device including a nonvolatile memory, a novel stacked capacitive element is provided. The semiconductor device includes the stacked capacitive element including a first capacitive electrode made of an n-type well region formed in a semiconductor substrate, a second capacitive electrode formed so as to overlap the first capacitive electrode via a first capacitive insulating film, a third capacitive electrode formed so as to overlap the second capacitive electrode via a second capacitive insulating film, and a fourth capacitive electrode formed so as to overlap the third capacitive electrode via a third capacitive insulating film. To the first and third capacitive electrodes, a first potential is applied and, to the second and fourth capacitive electrodes, a second potential different from the first potential is applied.

15 Claims, 25 Drawing Sheets

(56) References Cited

U.S. PATENT DOCUMENTS

| | | | | |
|---|---|---|---|---|
| 5,206,788 A * | 4/1993 | Larson | H01G 7/06 | 257/295 |
| 5,367,430 A * | 11/1994 | DeVoe | H01G 4/38 | 257/E23.004 |
| 5,414,588 A * | 5/1995 | Barbee, Jr. | C23C 14/0036 | 361/304 |
| 5,457,598 A * | 10/1995 | Radford | H01G 4/306 | 361/305 |
| 5,486,277 A * | 1/1996 | Barbee, Jr. | C23C 14/0036 | 204/192.15 |
| 5,978,206 A * | 11/1999 | Nishimura | H01L 23/5223 | 257/E21.012 |
| 6,178,083 B1 * | 1/2001 | Appeltans | H01G 4/38 | 257/532 |
| 6,370,013 B1 * | 4/2002 | Iino | H01G 4/2325 | 257/E23.062 |
| 6,411,494 B1 * | 6/2002 | Watt | H01L 23/49822 | 257/E23.062 |
| 6,577,492 B2 * | 6/2003 | O'Bryan, Jr. | H01G 4/18 | 361/311 |
| 6,611,419 B1 * | 8/2003 | Chakravorty | H01L 23/49822 | 257/E23.062 |
| 6,724,611 B1 * | 4/2004 | Mosley | H01G 4/228 | 257/E27.116 |
| 6,727,535 B1 * | 4/2004 | Sengupta | H01G 7/06 | 257/295 |
| 6,761,963 B2 * | 7/2004 | Casper | H01L 28/60 | 174/257 |
| 6,770,969 B2 * | 8/2004 | Mosley | H01G 4/30 | 257/691 |
| 6,775,150 B1 * | 8/2004 | Chakravorty | H01L 23/49822 | 174/254 |
| 6,801,422 B2 * | 10/2004 | Mosley | H01G 4/30 | 361/306.3 |
| 6,890,629 B2 * | 5/2005 | Casper | H01L 23/5223 | 174/257 |
| 6,970,362 B1 * | 11/2005 | Chakravorty | H01L 23/50 | 257/E23.079 |
| 6,998,696 B2 * | 2/2006 | Casper | H01L 21/4846 | 257/528 |
| 7,015,090 B2 | 3/2006 | Okazaki et al. | | |
| 7,029,962 B2 * | 4/2006 | Mosley | H01G 4/30 | 361/320 |
| 7,118,984 B2 * | 10/2006 | Honda | H01G 4/33 | 257/E23.067 |
| 7,120,031 B2 * | 10/2006 | Chakravorty | H01L 23/49822 | 174/258 |
| 7,326,989 B2 * | 2/2008 | Kurihara | H01G 4/33 | 257/310 |
| 7,327,582 B2 * | 2/2008 | Casper | H01L 23/49822 | 257/528 |
| 7,339,798 B2 * | 3/2008 | Chakravorty | H01L 23/50 | 257/E23.079 |
| 7,425,877 B2 * | 9/2008 | Casper | H01L 27/016 | 257/E27.116 |
| 7,446,388 B2 * | 11/2008 | Casper | H01L 21/4846 | 257/528 |
| 7,531,439 B2 * | 5/2009 | Rieger | H01L 21/76838 | 257/E21.575 |
| 7,535,728 B2 * | 5/2009 | Chakravorty | H01L 23/49822 | 361/761 |
| 7,936,553 B2 * | 5/2011 | Oakes | H01G 2/00 | 361/273 |
| 7,981,759 B2 * | 7/2011 | Cervin-Lawry | H01G 4/33 | 257/E21.004 |
| 8,008,161 B2 * | 8/2011 | Bachmann | H01L 27/0805 | 257/E21.004 |
| 8,084,800 B2 | 12/2011 | Kawashima et al. | | |
| 8,183,616 B2 * | 5/2012 | Fujiwara | H01L 27/10852 | 257/306 |
| 8,194,387 B2 * | 6/2012 | Capanu | H01G 7/06 | 361/277 |
| 8,299,518 B2 * | 10/2012 | Oyamada | H01G 4/40 | 257/307 |
| 8,400,752 B2 * | 3/2013 | Oakes | H01G 2/00 | 361/277 |
| 8,467,169 B2 * | 6/2013 | Oakes | H01G 7/06 | 361/277 |
| 8,680,649 B2 * | 3/2014 | Guegan | H01L 28/60 | 257/303 |
| 8,693,162 B2 * | 4/2014 | Capanu | H01G 7/06 | 361/277 |
| 8,842,411 B2 * | 9/2014 | Zhang | H01G 4/35 | 361/301.4 |
| 8,953,299 B2 * | 2/2015 | Oakes | H01G 7/06 | 361/273 |
| 8,981,232 B2 * | 3/2015 | Hertel | H01L 23/49822 | 174/255 |
| 8,997,321 B2 * | 4/2015 | Komuro | H01G 4/228 | 29/25.03 |
| 9,070,434 B2 * | 6/2015 | Hioka | G11C 5/063 | |
| 9,142,355 B2 * | 9/2015 | Oakes | | |
| 9,269,496 B2 * | 2/2016 | Oakes | H01G 7/06 | |
| 9,299,498 B2 * | 3/2016 | Armstrong | H05K 3/328 | |
| 9,305,709 B2 * | 4/2016 | Koutsaroff | H01G 4/33 | |
| 9,318,266 B2 * | 4/2016 | Capanu | H01G 7/06 | |

\* cited by examiner

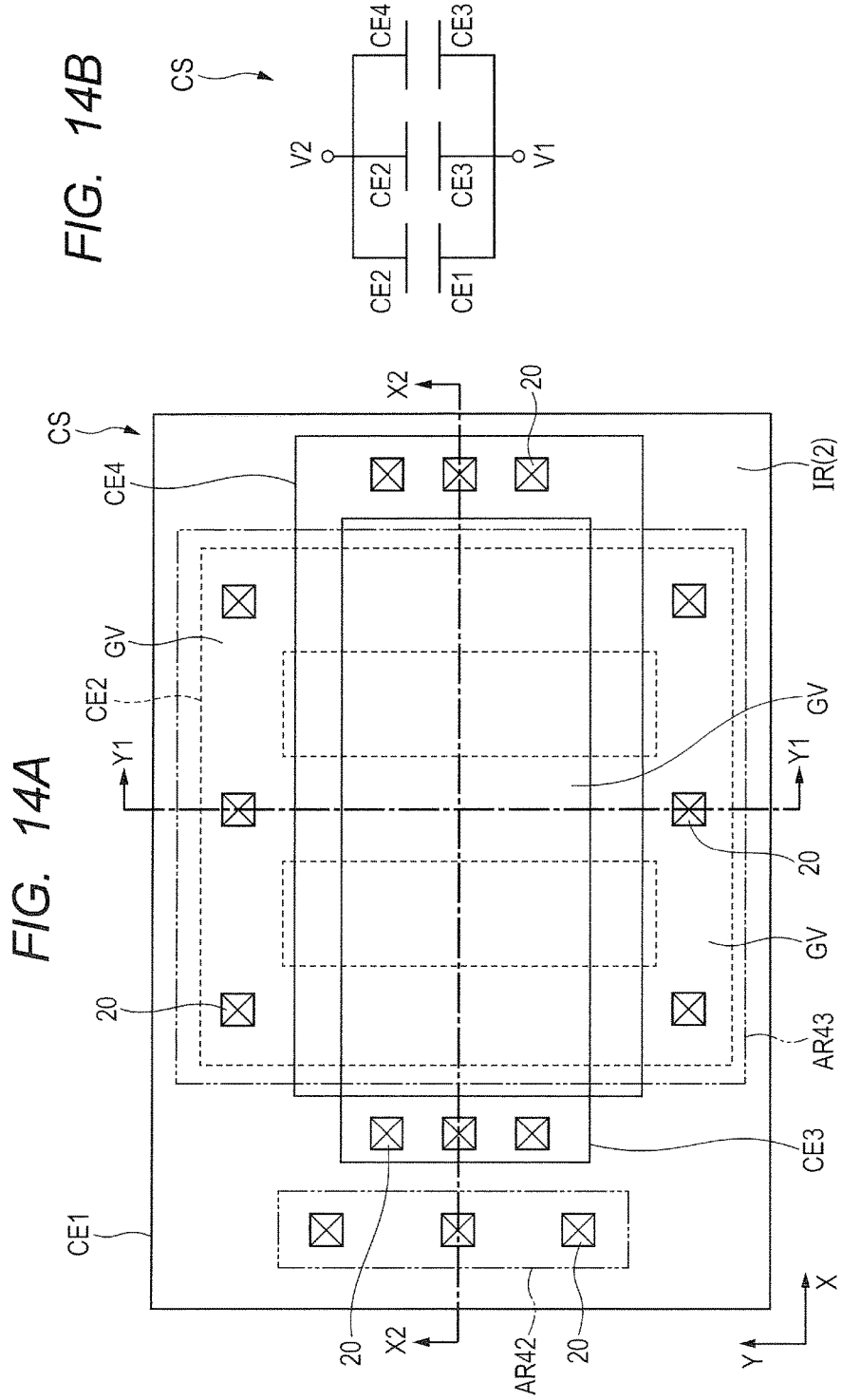

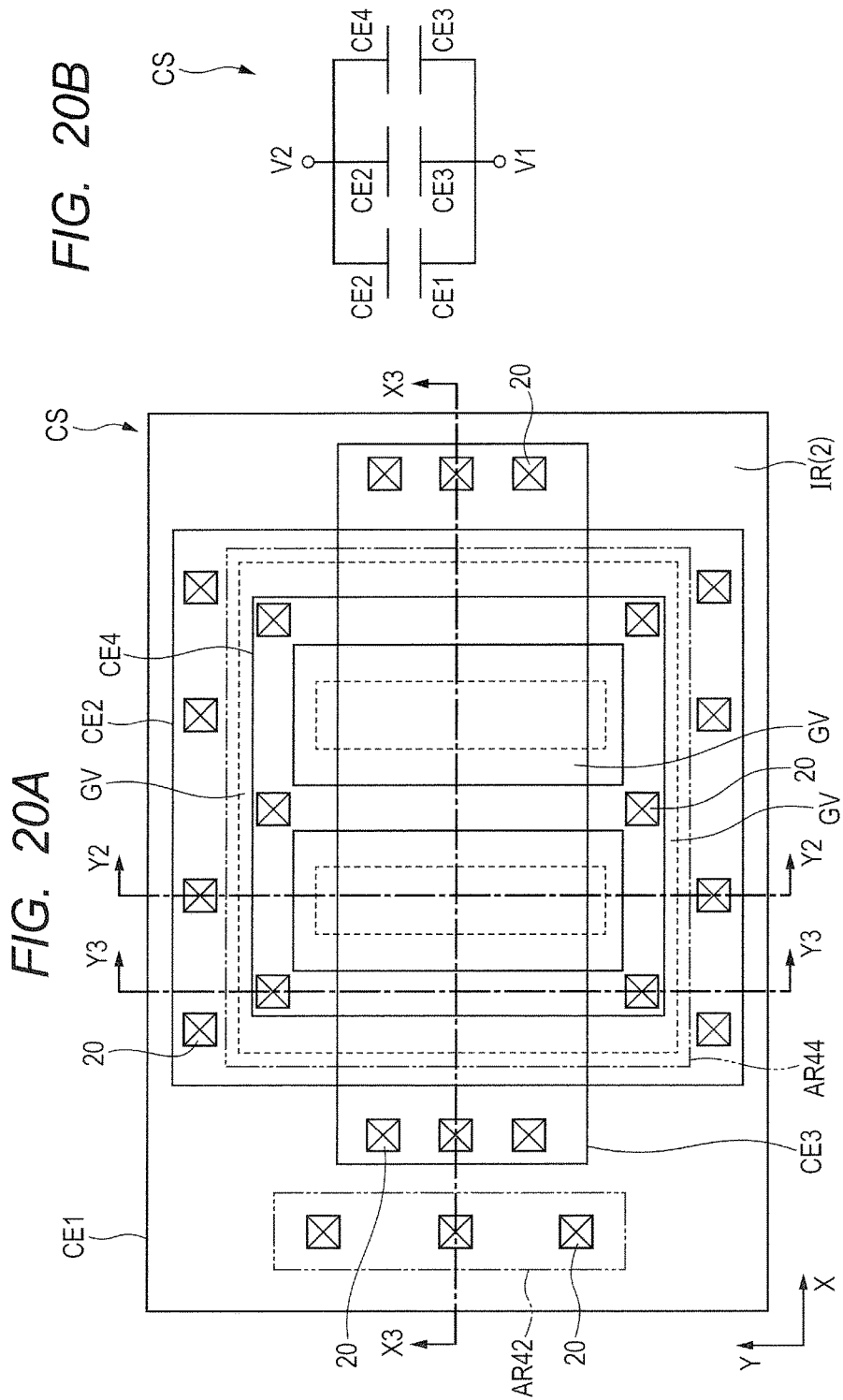

METHOD OF MANUFACTURING SEMICONDUCTOR DEVICE

CROSS-REFERENCE TO RELATED APPLICATIONS

The disclosure of Japanese Patent Application No. 2015-040931 filed on Mar. 3, 2015 including the specification, drawings and abstract is incorporated herein by reference in its entirety.

BACKGROUND

The present invention relates to a method of manufacturing a semiconductor device, which can be used appropriately as a method of manufacturing, e.g., a semiconductor device having a nonvolatile memory cell.

A semiconductor device having a memory cell region where a memory cell or the like in, e.g., a nonvolatile memory or the like is formed over a semiconductor substrate and a peripheral circuit region where a peripheral circuit made of, e.g., a MISFET (Metal Insulator Semiconductor Field Effect Transistor) or the like is formed over the semiconductor substrate is used widely.

For example, there is a case where, as a nonvolatile memory, a memory cell made of a split-gate cell using a MONOS (Metal-Oxide-Nitride-Oxide-Semiconductor) film is formed. The memory cell is formed of two MISFETs which are a control transistor having a control gate electrode and a memory transistor having a memory gate electrode. The memory transistor has a gate insulating film made of a laminated film including, e.g., a silicon dioxide film, a silicon nitride film, and a silicon dioxide film and referred to as an ONO (Oxide Nitride Oxide) film.

To perform electric write/erase operations to the nonvolatile memory, a voltage higher than a power supply voltage supplied from outside the semiconductor device is required so that a boosting circuit including a capacitive element is formed in the peripheral circuit region of the semiconductor device. In addition, a bypass capacitor (capacitive element) coupled between a power supply wire (Vcc) and a ground wire (Gnd) of the semiconductor device so as to stabilize a power supply is also embedded in the semiconductor device. As such capacitive elements, PIP (Polysilicon Insulator Polysilicon) capacitive elements each having excellent consistency with the manufacturing process of the memory cell are used.

In Japanese Unexamined Patent Publication No. 2009-99640 (Patent Document 1), a nonvolatile memory cell is disclosed which includes a control electrode (corresponding to the foregoing control gate electrode) 15, a memory gate electrode 26, and a laminated film (corresponding to the foregoing ONO film) provided between each of the control electrode 15 and a semiconductor substrate 10 and the memory gate electrode 26. In addition, a PIP capacitive element including a lower electrode 16, a capacitive insulating film 27, and an upper electrode 23 is also disclosed. Also, a manufacturing method is disclosed which forms each of the control electrode 15 of the memory cell and the lower electrode 16 of the capacitive element of a polysilicon film 14, forms each of the memory gate electrode 26 of the memory cell and the upper electrode 23 of the capacitive element of a polysilicon film 20, and forms the capacitive insulating film 27 of the capacitive element of the laminated film of the memory cell.

In Patent Document 1, a structure in which series-coupled first and second capacitive elements are stacked is also disclosed. The first capacitive element includes the semiconductor substrate as a first electrode and the lower electrode 16 formed over the semiconductor substrate via a gate insulating film 13 as a second electrode. Thus, a second capacitor including the lower electrode 16, the capacitive insulating film 27, and the upper electrode 23 (third electrode) is formed such that, over the lower electrode 16 (second electrode), the upper electrode 23 is formed via the capacitive insulating film 27.

In Japanese Unexamined Patent Publication No. 2003-309182 (Patent Document 2), a capacitor structure in which an uneven capacitor formation trench 4a is formed in the top surface of a capacitor formation region to thus increase the surface area of a capacitor and improve a capacitance per unit area is disclosed and a manufacturing method thereof is also disclosed.

RELATED ART DOCUMENTS

Patent Documents

[Patent Document 1]
  Japanese Unexamined Patent Publication No. 2009-99640
[Patent Document 2]
  Japanese Unexamined Patent Publication No. 2003-309182

SUMMARY

The semiconductor device having a nonvolatile memory cell studied by the present inventors has a nonvolatile memory cell including a control gate electrode made of a first-layer polysilicon film and a memory gate electrode including an ONO film and a second-layer polysilicon film in a memory cell region, while having a MISFET having a gate electrode made of a third-layer polysilicon film.

Accordingly, it becomes necessary to study a semiconductor device including a nonvolatile memory including a capacitive element having a novel structure in which a capacitance per unit area has been improved using polysilicon films in three layers.

Other problems and novel features of the present invention will become apparent from a statement in the present specification and the accompanying drawings.

According to an embodiment, a semiconductor device includes a capacitive element. The capacitive element includes a first capacitive electrode made of a semiconductor region formed in a semiconductor substrate, a first capacitive insulating film formed over a main surface of the semiconductor substrate so as to overlap the first capacitive electrode in plan view, and a second capacitive electrode made of a first polysilicon film formed over the first capacitive insulating film so as to overlap the first capacitive electrode in plan view. The semiconductor device further includes a second capacitive insulating film formed over the second capacitive electrode so as to cover the second capacitive electrode and a third capacitive electrode made of a second polysilicon film formed over the second capacitive insulating film so as to overlap the second capacitive electrode in plan view. The semiconductor device further includes a third capacitive insulating film formed over the third capacitive electrode so as to cover the third capacitive electrode, and a fourth capacitive electrode made of a third polysilicon film formed over the third capacitive insulating film so as to overlap the third capacitive electrode. To the first and third capacitive electrodes, a first potential is applied. To the second and fourth capacitive electrodes, a second potential different from the first potential is applied.

According to the embodiment, a semiconductor device can be provided which includes a nonvolatile memory including a capacitive element in which a capacitance per unit area has been improved.

BRIEF DESCRIPTION OF THE DRAWINGS

FIG. 14A is a main-portion plan view of a stacked capacitive element in Embodiment 2 and FIG. 14B is an illustrative view showing a circuit configuration of the stacked capacitive element in Embodiment 2;

FIG. 20A is a main-portion plan view of a stacked capacitive element in Embodiment 3 and FIG. 20B is an illustrative view showing a circuit configuration of the stacked capacitive element in Embodiment 3;

DETAILED DESCRIPTION

Figure 1:
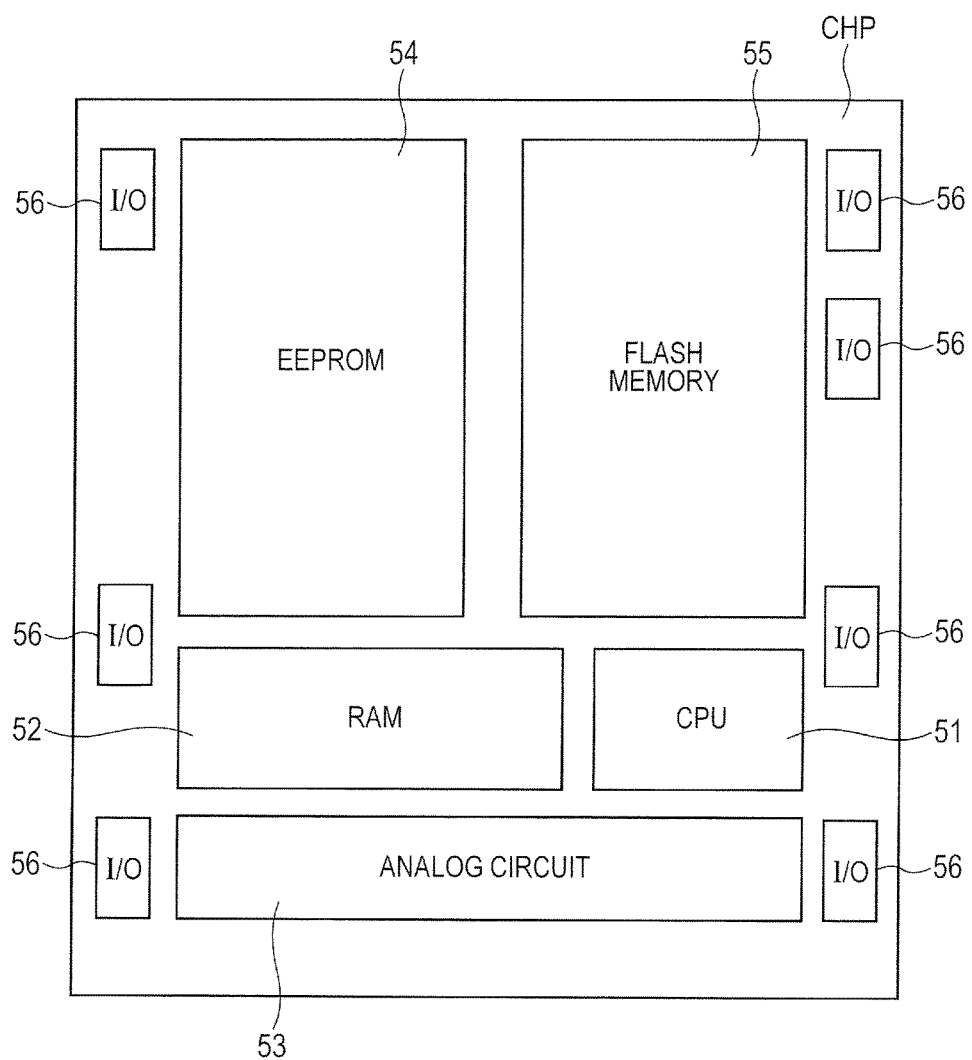
FIG. 1 is a view showing an example of a layout configuration of a semiconductor device in Embodiment 1.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Also, in the following embodiments, it goes without saying that the components thereof (including also elements, steps, and the like) are not necessarily indispensable unless particularly explicitly described otherwise or unless the components are considered to be obviously indispensable in principle. Likewise, when the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe representative embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration.

Embodiment 1

<Example of Layout Configuration of Semiconductor Chip>

Referring to the drawings, a description will be given of a semiconductor device (semiconductor integrated circuit device) having a nonvolatile memory in Embodiment 1. First, a description will be given of a layout configuration of the semiconductor device (semiconductor chip) formed with a system including the nonvolatile memory. FIG. 1 is a view showing an example of a layout configuration of a semiconductor chip CHP in Embodiment 1. In FIG. 1, the semiconductor chip CHP includes a CPU (Central Processing Unit) 51, a RAM (Random Access Memory) 52, an analog circuit 53, an EEPROM (Electrically Erasable Programmable Read Only Memory) 54, a flash memory 55, and an I/O (Input/Output) circuit 56 to form the semiconductor device.

The CPU (circuit) 51 is referred to also as a central arithmetic operation processing unit, which reads an instruction from a storage device and performs various arithmetic and control operations on the basis of the instruction.

The RAM (circuit) 52 is a memory which allows information stored therein to be read randomly, i.e., as needed therefrom or allows information to be stored to be written newly therein. The RAM 52 is referred to also as a randomly writable/readable memory. The RAM as an IC memory is subdivided into two types which are a DRAM (Dynamic RAM) using a dynamic circuit and an SRAM (Static RAM) using a static circuit. The DRAM is a randomly writable/readable memory which needs a memory retaining operation. The SRAM is a randomly writable/readable memory which does not need a memory retaining operation.

The analog circuit 53 is a circuit which handles a voltage or current signal continuously changing with time, i.e., a circuit which handles an analog signal. The analog circuit 53 includes, e.g., an amplification circuit, a conversion circuit, a modulation circuit, an oscillation circuit, a power supply circuit, and the like. The analog circuit 53 includes a plurality of capacitive elements.

An EEPROM 54 and a flash memory 55 are types of nonvolatile memories which are electrically rewritable in each of a write operation and an erase operation. The EEPROM 54 and the flash memory 55 are referred to also as electrically erasable/programmable read only memories. Each of memory cells in the EEPROM 54 and the flash memory 55 includes, e.g., a MONOS transistor or an MNOS (Metal Nitride Oxide Semiconductor) transistor for storage (memory). For a write operation and an erase operation to each of the EEPROM 54 and the flash memory 55, a Fowler-Nordheim tunneling phenomenon is used. Note that the write operation and the erase operation can also be performed using hot electrons and hot holes. Each of the write operation and the erase operation to the EEPROM 54 and the flash memory 55 needs a voltage higher than an external power supply voltage. Accordingly, each of the EEPROM 54 and the flash memory 55 includes a boosting circuit or the like and the boosting circuit includes a plurality of capacitive elements. The difference between the EEPROM 54 and the flash memory 55 is that the EEPROM 54 is, e.g., a nonvolatile memory to which an erase operation can be performed on a byte basis, while the flash memory 55 is, e.g., a nonvolatile memory to which an erase operation can be performed on a word-line basis. In general, in the flash memory 55, a program for executing various processes in the CPU 51 and the like are stored. On the other hand, in the EEPROM 54, various data items which are rewritten with high frequency are stored.

The I/O circuit 56 is an input/output circuit which outputs data from within the semiconductor chip CHP to an external device coupled to the semiconductor chip CHP and inputs data from the external device coupled to the semiconductor chip CHP into the semiconductor chip. A bypass capacitor (capacitive element) coupled between the power supply line (Vcc) of the semiconductor chip CHP and a ground wire (Gnd) is also placed in the I/O circuit 56.

In each of the EEPROM 54 and the flash memory 55, memory cells as a plurality of nonvolatile memories are arranged in rows and columns. Each of the CPU 1, the RAM 52, the analog circuit 53, the I/O circuit 56, and the respective portions of the EEPROM 54 and the flash memory 55 which are other than the memory cells are formed using a high-breakdown-voltage MISFET or a low-breakdown-voltage MISFET. The high-breakdown-voltage MISFET and the low-breakdown-voltage MISFET are formed respectively of an n-type MISFET and a p-type MISFET.

<Structure of Semiconductor Device>

Figure 2:
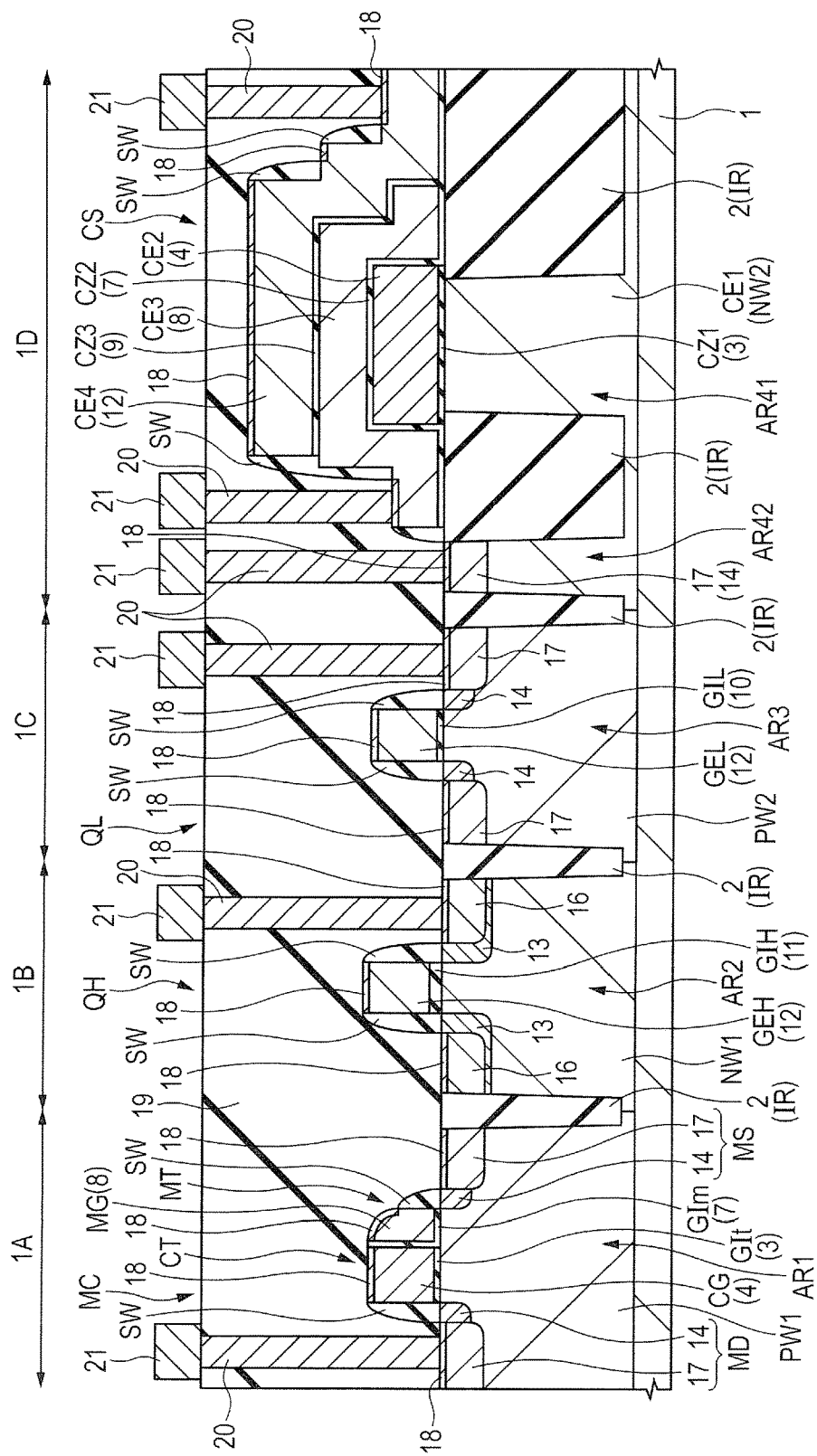
FIG. 2 is a main-portion cross-sectional view of the semiconductor device in Embodiment 1.

FIG. 2 is a main-portion cross-sectional view of the semiconductor device in Embodiment 1. FIG. 3A is a main-portion plan view of a stacked capacitive element. FIG. 3B is an illustrative view showing an example of a circuit configuration of the stacked capacitive element.

As shown in FIG. 2, the semiconductor device includes a semiconductor substrate 1. The semiconductor substrate 1 is a semiconductor wafer made of p-type monocrystalline silicon having a specific resistance of, e.g., about 1 to 10 Ωm or the like.

The semiconductor device has, as parts of the main surface of the semiconductor substrate 1, a memory cell region 1A and peripheral circuit regions 1B, 1C, and 1D. In the memory cell region 1A, a memory cell MC is formed. In the peripheral circuit region 1B, a MISFET QH as a p-channel high-breakdown-voltage MISFET is formed. In the peripheral circuit region 1C, a MISFET QL as an n-channel low-breakdown-voltage MISFET is formed. In the peripheral circuit region 1D, a stacked capacitive element CS is formed. The memory cell region 1A corresponds to the EEPROM 54 or the flash memory 55 in FIG. 1. The memory cell region 1A and the peripheral circuit regions 1B, 1C, and 1D need not be adjacent to each other.

First, a configuration of the memory cell MC formed in the memory cell region 1A will specifically be described.

In the memory cell region 1A, the semiconductor device has an active region AR1 and an isolation region IR. The isolation region IR is for isolating the element formed in the active region AR. In the isolation region IR, an isolation film 2 is formed. The active region AR1 is defined, i.e., demarcated by the isolation region IR and electrically isolated from another active region by the isolation region IR. In the active region AR1, a p-type well PW1 is formed. The p-type well PW1 has a p-type conductivity type.

As shown in FIG. 2, in the p-type well PW1 of the memory cell region 1A, the memory cell MC including a memory transistor MT and a control transistor CT is formed. In the memory cell region 1A, a plurality of the memory cells MC are actually formed in an array configuration. FIG. 2 shows a cross section of one of the memory cells MC.

The memory cell MC is a split-gate memory cell. That is, as shown in FIG. 2, the memory cell MC includes a control transistor CT having a control gate electrode CG and a memory transistor MT coupled in series to the control transistor CT and having a memory gate electrode MG.

As shown in FIG. 2, the memory cell MC includes an n-type semiconductor region MS, an n-type semiconductor region MD, the control gate electrode CG, and the memory gate electrode MG. Each of the n-type semiconductor regions MS and MD has an n-type conductivity type which is opposite to the p-type conductivity type. The memory cell MC also includes a gate insulating film GIt formed between the control gate electrode CG and the p-type well PW1 of the semiconductor substrate 1 and a gate insulating film GIm formed between the memory gate electrode MG and the p-type well PW1 of the semiconductor substrate 1 and between the memory gate electrode MG and the control gate electrode CG.

The control gate electrode CG and the memory gate electrode MG extend along the main surface of the semiconductor substrate 1 with the gate insulating film GIm being interposed between the respective side surfaces (side walls) thereof facing each other and are arranged side by side. The extending directions of the control gate electrode CG and the memory gate electrode MG are perpendicular to the surface of the paper sheet with FIG. 2. The control gate electrode CG is formed over the portion of the p-type well WP1 which is located between the semiconductor regions MD and MS, i.e., over the main surface of the semiconductor substrate 1 via the gate insulating film GIt. On the other hand, the memory gate electrode MG is formed over the portion of the p-type well PW1 which is located between the semiconductor regions MD and MS, i.e., over the main surface of the semiconductor substrate 1 via the gate insulating film GIm. The memory gate electrode MG is located closer to the semiconductor region MS, while the control gate electrode CG is located closer to the semiconductor region MD. The control gate electrode CG and the memory gate electrode MG are gate electrodes forming the memory cell MC, i.e., the nonvolatile memory.

The control gate electrode CG and the memory gate electrode MG are adjacent to each other with the gate insulating film GIm being interposed therebetween. The memory gate electrode MG is formed over the side surface, i.e., side wall of the control gate electrode CG via the gate insulating film GIm into a sidewall spacer shape. The gate insulating film GIm extends over the two regions which are the region between the memory gate electrode MG and the p-type well PW1 of the semiconductor substrate 1 and the region between the memory gate electrode MG and the control gate electrode CG.

The gate insulating film GIt is made of an insulating film 3. The insulating film 3 is made of a silicon dioxide film, a silicon nitride film, a silicon oxynitride film, or a high-dielectric-constant film having a specific permittivity higher than that of the silicon nitride film, i.e., a so-called High-k film. Note that, in the present application, when a High-k film or high-dielectric-constant film is mentioned, the High-k film or high-dielectric-constant film means a film having a dielectric constant (specific permittivity) higher than that of a silicon nitride film. As the insulating film 3, a metal oxide film such as, e.g., a hafnium oxide film, a zirconium oxide film, an aluminum oxide film, a tantalum oxide film, or a lanthanum oxide film can be used.

The gate insulating film IGm is made of an insulating film 7. The insulating film 7 is made of a laminated film including a silicon dioxide film, a silicon nitride film as a charge storage portion over the silicon dioxide film, and a silicon dioxide film over the silicon nitride film and referred to as an ONO film. Note that, as described above, the gate insulating film GIm between the memory gate electrode MG and the p-type well PW1 functions as the gate insulating film of the memory transistor MG. On the other hand, the gate insulating film GIm between the memory gate electrode MG and the control gate electrode CG functions as an insulating film for providing insulation, i.e., electrical isolation between the memory gate electrode MG and the control gate electrode CG.

Of the insulating film 7, the silicon nitride film is an insulating film for storing charges and functions as the charge storage portion. That is, the silicon nitride film is a trapping insulating film formed in the insulating film 7. Accordingly, the insulating film 7 can be regarded as an insulating film having the internal charge storage portion.

The silicon dioxide films located over and under the silicon nitride film can function as charge block layers which confine charges thereto. That is, by providing a structure in which the silicon nitride film is interposed between the upper and lower silicon dioxide films, the leakage of the charges stored in the silicon nitride film is prevented.

The control gate electrode CG is made of a conductor film 4. The conductor film 4 is made of silicon. For example, the conductor film 4 is made of, e.g., an n-type polysilicon film as a polycrystalline silicon film into which an n-type impurity has been introduced or the like. Specifically, the control gate electrode CG is made of the patterned conductor film 4.

The memory gate electrode MG is made of a conductor film 8. The conductor film 8 is made of silicon and formed of, e.g., an n-type polysilicon film as a polycrystalline silicon film into which an n-type impurity has been introduced or the like. The memory gate electrode MG is formed over the side wall of the control gate electrode CG adjacent to the memory gate electrode MG which is located on a first side of the control gate electrode CG.

The semiconductor region MS is a semiconductor region functioning as one of a source region and a drain region. The semiconductor region MD is a semiconductor region functioning as the other of the source region and the drain region. Here, the semiconductor region MS is the semiconductor region functioning as, e.g., the source region, while the semiconductor region MD is the semiconductor region functioning as, e.g., the drain region. Each of the semiconductor regions MS and MD is made of a semiconductor region into which an n-type impurity has been introduced and has an LDD (Lightly doped drain) structure.

The source semiconductor region MS includes an $n^-$-type semiconductor region 14 and an $n^+$-type semiconductor region 17 having an impurity concentration higher than that of the $n^-$-type semiconductor region 14. The drain semiconductor region MD includes the $n^-$-type semiconductor region 14 and the $n^+$-type semiconductor region 17 having an impurity concentration higher than that of the $n^-$-type semiconductor region 14. The $n^+$-type semiconductor region 17 has a junction depth deeper than that of the $n^-$-type semiconductor region 14 and an impurity concentration higher than that thereof.

Over the side wall of the control gate electrode CG which is closer to the drain region and over the side wall of the memory gate electrode MG which is closer to the source region, sidewall spacers SW each made of an insulating film such as a silicon dioxide film, a silicon nitride film, or a laminated film thereof are formed.

The $n^-$-type semiconductor region 14 included in the source semiconductor region MS is formed self-alignedly with the side surface of the memory gate electrode MG. The $n^+$-type semiconductor region 17 is formed self-alignedly with the side surface of the sidewall spacer SW. Accordingly, the lower-concentration $n^-$-type semiconductor region 14 is formed under the sidewall spacer SW over the side wall of the memory gate electrode MG, while the higher-concentration $n^+$-type semiconductor region 17 is formed outside the lower-concentration $n^-$-type semiconductor region 14.

The $n^-$-type semiconductor region 14 included in the drain semiconductor region MD is formed self-alignedly with the side surface of the control gate electrode CG. The $n^+$-type semiconductor region 17 is formed self-alignedly with the side surface of the sidewall spacer SW. Accordingly, the lower-concentration $n^-$-type semiconductor region 14 is formed under the sidewall spacer SW over the side wall of the control gate electrode CG, while the higher-concentration $n^+$-type semiconductor region 17 is formed outside the lower-concentration $n^-$-type semiconductor region 14. Consequently, the lower-concentration $n^-$-type semiconductor region 14 is formed so as to be adjacent to the p-type well PW1 as the channel region of the control transistor CT.

Under the gate insulating film GIm under the memory gate electrode MG, the channel region of the memory transistor is formed. Under the gate insulating film GIt under the control gate electrode CG, the channel region of the control transistor CT is formed.

Over each of the $n^+$-type semiconductor regions 17, i.e., over the upper surface of each of the $n^+$-type semiconductor regions 17, a metal silicide layer 18 has been formed using a salicide (Self Aligned Silicide) technique or the like. The metal silicide layer 18 is made of, e.g., a cobalt silicide layer, a nickel silicide layer, a platinum-added nickel silicide layer, or the like. The metal silicide layer 18 allows reductions in diffusion resistance and contact resistance. Note that the metal silicide layer 18 is formed also over each of the control gate electrode CG and the memory gate electrode MG.

Next, a specific description will be given of a configuration of the p-channel high-breakdown-voltage MISFET QH formed in the peripheral circuit region 1B.

In the peripheral circuit region 1B, the semiconductor device includes an active region AR2 and the isolation region IR. The structure and function of the isolation region IR are as described above. The active region AR2 is defined, i.e., demarcated by the isolation region IR and electrically isolated from another active region by the isolation region IR. In the active region AR2, an n-type well NW1 is formed. That is, the active region AR2 is the region where the n-type well NW1 is formed. The n-type well NW1 has an n-type conductivity type.

As shown in FIG. 2, the high-breakdown-voltage MISFET QH includes semiconductor regions each including a $p^-$-type semiconductor region 13 and a $p^+$-type semiconductor region 16, a gate insulating film GIH formed over the n-type well NW1, and a gate electrode GEH formed over the gate insulating film GIH. Each of the $p^-$-type semiconductor region 13 and the $p^+$-type semiconductor region 16 is formed in the upper-layer portion of the semiconductor substrate 1. Each of the $p^-$-type semiconductor region 13 and the $p^+$-type semiconductor region 16 has the p-type conductivity type opposite to the n-type conductivity type.

The gate insulating film GIH functions as the gate insulating film of the MISFET QH. The gate insulating film GIH is made of an insulating film 11. The insulating film 11 is made of a silicon dioxide film, a silicon nitride film, a silicon oxynitride film, or a high-dielectric-constant film having a specific permittivity higher than that of the silicon nitride film, i.e., a so-called High-k film. As the insulating film 11 made of the High-k film, a metal oxide film such as, e.g., a hafnium oxide film, a zirconium oxide film, an aluminum oxide film, a tantalum oxide film, or a lanthanum oxide film can be used.

The gate electrode GEH is made of a conductor film 12. The conductor film 12 is made of silicon and formed of, e.g., a p-type polysilicon film as a polycrystalline silicon film into which a p-type impurity has been introduced or the like. Specifically, the gate electrode GEH is made of the patterned conductor film 12. The conductor film 12 is formed of a conductor film different from the conductor film 4 included in the control gate electrode CG.

Each of the semiconductor regions including the $p^-$-type semiconductor region 13 and the $p^+$-type semiconductor region 16 is a source or drain semiconductor region (source region or drain region) into which a p-type impurity has been introduced and which has a DDD (Double Diffused Drain) structure. That is, the $p^-$-type semiconductor region 13 has a junction depth deeper than that of the $p^+$-type semiconductor region 16 and an impurity concentration higher than that thereof.

Over the side walls of the gate electrode GEH, the sidewall spacers SW each made of an insulating film such as a silicon dioxide film, a silicon nitride film, or a laminated film thereof are formed.

Over the $p^+$-type semiconductor region 16, i.e., over the upper surface of $p^+$-type semiconductor region 16, the metal silicide layer 18 is formed using a salicide technique or the like in the same manner as over the $n^+$-type semiconductor region 17 in the memory cell MC. Note that the metal silicide layer 18 is formed also over the gate electrode GEH.

Next, a configuration of the n-channel low-breakdown-voltage MISFET QL formed in the peripheral circuit region 1C will specifically be described.

In the peripheral circuit region 1C, the semiconductor device includes an active region AR3 and the isolation region IR. The structure and function of the isolation region IR are as described above. The active region AR3 is defined, i.e., demarcated by the isolation region IR and electrically isolated from another active region by the isolation region IR. In the active region AR3, a p-type well PW2 is formed. That is, the active region AR3 is a region where the p-type well PW2 is formed. The p-type well PW2 has a p-type conductivity type.

As shown in FIG. 2, the low-breakdown-voltage MISFET QL includes semiconductor regions each including the $n^-$-type semiconductor region 14 and the $n^+$-type semiconductor region 17, a gate insulating film GIL formed over the p-type well PW2, and a gate electrode GEL formed over the gate insulating film GIL. The $n^-$-type semiconductor region 14 and the $n^+$-type semiconductor region 17 are formed in the upper-layer portion of the p-type well PW2 of the semiconductor substrate 1. Each of the $n^-$-type semiconductor region 14 and the $n^+$-type semiconductor region 17 has the n-type conductivity type opposite to the p-type conductivity type.

The gate insulating film GIL functions as the gate insulating film of the MISFET QL. The gate insulating film GIL is made of an insulating film 10.

The gate electrode GEL is made of a conductor film made of the conductor film 12 and formed in the same layer as that of the conductor film 12 included in the gate electrode GEH of the MISFET QH.

Each of the semiconductor regions including the $n^-$-type semiconductor region 14 and the $n^+$-type semiconductor region 17 is a source or drain semiconductor region (source region or drain region) into which an n-type impurity has been introduced and has an LDD structure, similarly to the semiconductor regions MS and MD of the memory cell MC. That is, the $n^+$-type semiconductor region 17 has a junction depth deeper than that of the $n^-$-type semiconductor region 14 and an impurity concentration higher than that thereof.

Over the side walls of the gate electrode GEL, the sidewall spacers SW each made of an insulating film such as a silicon dioxide film, a silicon nitride film, or a laminated film thereof are formed.

Over each of the $n^+$-type semiconductor region 17, i.e., over the upper surface of each of the $n^+$-type semiconductor regions 17, the metal silicide layer 18 has been formed using a salicide technique or the like in the same manner as over each of the $n^+$-type semiconductor regions 17 in the memory cell MC. Note that the metal silicide layer 18 is formed also over the gate electrode GEL.

Preferably, the gate length of the high-breakdown-voltage MISFET QH is longer than the gate length of the low-breakdown-voltage MISFET QL. A drive voltage for the high-breakdown-voltage MISFET QH is higher than a drive voltage for the low-breakdown-voltage MISFET QL. The breakdown voltage of the high-breakdown-voltage MISFET QH is higher than the breakdown voltage of the low-breakdown-voltage MISFET QL.

Preferably, the film thickness of the gate insulating film GIH is larger than a film thickness TIL of the gate insulating film GIL. This allows the drive voltage for the high-breakdown-voltage MISFET QH to be higher than the drive voltage for the low-breakdown-voltage MISFET QL.

Next, a configuration of the stacked capacitive element CS formed in the peripheral circuit region 1D will specifically be described.

In the peripheral circuit region 1D, the semiconductor device has active regions AR41 and AR42 and the isolation region IR. The structure and function of the isolation region IR are as described above. Under the active regions AR41 and AR42 and the isolation region IR, an n-type well (n-type well region) AR42 is formed continuously. The active region AR42 is for supplying an intended potential to the n-type well NW2. In the active region NW2, the $n^+$-type semiconductor region 17 and the $n^-$-type semiconductor region 14 are provided. The n-type well NW2 is included in a first capacitive electrode CE1. The n-type well NW2 included in the first capacitive electrode CE1 is formed by the same step of forming the p-type MISFET QH in which the p-type MISFET QH is formed.

Over the active region AR41, a second capacitive electrode CE2 is formed via a first capacitive insulating film CZ1. The second capacitive electrode CE2 completely covers the active region AR41 in plan view and extends to the isolation region IR adjacent to the active region AR41. The first capacitive insulating film CZ1 can be formed of, e.g., the insulating film 3 in the same layer as that of the gate insulating film GIt. Preferably, the first capacitive insulating film CZ1 may be formed appropriately of an insulating film having a film thickness larger than that of the gate insulating film GIt. The second capacitive electrode CE2 is formed of the conductor film 4 in the same layer as that of the control gate electrode CG. The second capacitive electrode CE2 and the first capacitive insulating film CZ1 have equal shapes in plan view.

That is, in the active region AR41, a first capacitor including the first capacitive electrode CE1, the first capacitive insulating film CZ1, and the second capacitive electrode CE2 is formed.

A third capacitive electrode CE3 is formed so as to cover the upper and side surfaces of the second capacitive electrode CE2 via a second capacitive insulating film CZ2. In plan view, the third capacitive electrode CE3 has a portion overlapping the second capacitive electrode CE2 in plan view and portions protruding from the second capacitive electrode CE2 and extending over the isolation region IR. The third capacitive electrode CE3 is formed of a conductor film 8 in the same layer as that of the memory gate electrode MG. The second capacitive insulating film CZ2 is formed of the insulating film 7 in the same layer as that of the gate insulating film GIm. The third capacitive electrode CE3 and the second capacitive insulating film CZ2 have equal shapes in plan view.

That is, a second capacitor including the second capacitive electrode CE2, the second capacitive insulating film CZ2, and the third capacitive electrode CE3 is formed so as to overlap the first capacitor in plan view.

A fourth capacitive electrode CE4 is formed so as to cover the upper and side surfaces of the third capacitive electrode CE3 via a third capacitive insulating film CZ3. The fourth capacitive electrode CE4 has a portion overlapping the third capacitive electrode CE3 and portions protruding from the third capacitive electrode CE3 and extending over the isolation region IR. The fourth capacitive electrode CE4 is formed of the conductor film 12 in the same layer as that of the gate electrode GEH of the MISFET QH or the gate electrode GEL of the MISFET QL. The third capacitive insulating film CZ3 is made of an insulating film 9. The insulating film 9 is formed of a laminated film including, e.g., a silicon dioxide film and a silicon nitride film over the silicon dioxide film. The fourth capacitive electrode CE4 and the third capacitive insulating film CZ3 have equal shapes in plan view.

That is, a third capacitor including the third capacitive electrode CE3, the third capacitive insulating film CZ3, and the fourth capacitive electrode CE4 is formed so as to overlap the second capacitor in plan view. In the active region AR41, the stacked capacitive element CS in which the first, second, and third capacitors are stacked is formed.

Over the respective side walls of the third and second capacitive electrodes CE3 and CE2, the sidewall spacers SW are formed. Over the n+-type semiconductor region 17, the upper surface of the fourth capacitive electrode CE4, the upper surface of the third capacitive electrode CE3 exposed from the sidewall spacer SW, and the upper surface of the second capacitive electrode CE2, the metal silicide layers 18 are formed. Note that the metal silicide layer over the upper surface of the second capacitive electrode CE2 is not shown.

FIG. 3A is a main-portion plan view of the stacked capacitive element. FIG. 3B is an illustrative view showing a circuit configuration of the stacked capacitive element. Using FIGS. 3A and 3B, the configuration of the stacked capacitive element CS will be described.

As shown in FIG. 3A, the stacked capacitive element CS has a structure in which, e.g., the rectangular first capacitive electrode CE having longer sides in a lateral direction, the rectangular second capacitive electrode CE2 having longer sides in a vertical direction, the rectangular third capacitive electrode CE3 having longer sides in the lateral direction, and the rectangular fourth capacitive electrode CE4 having longer sides in the lateral direction are stacked. At the center portion of the first capacitive electrode CE1, the active region AR41 is located. The active region AR42 is located apart from the active region AR41. As described above, the active region AR42 is for supplying the intended potential to the n-type well NW2 included in the first capacitive electrode CE1. The locations of the active regions AR41 and AR42 are not limited to the foregoing. The shapes of the first, second, third, and fourth capacitive electrodes CE1, CE2, CE3, and CE4 are also not limited to rectangles.

Figure 3:
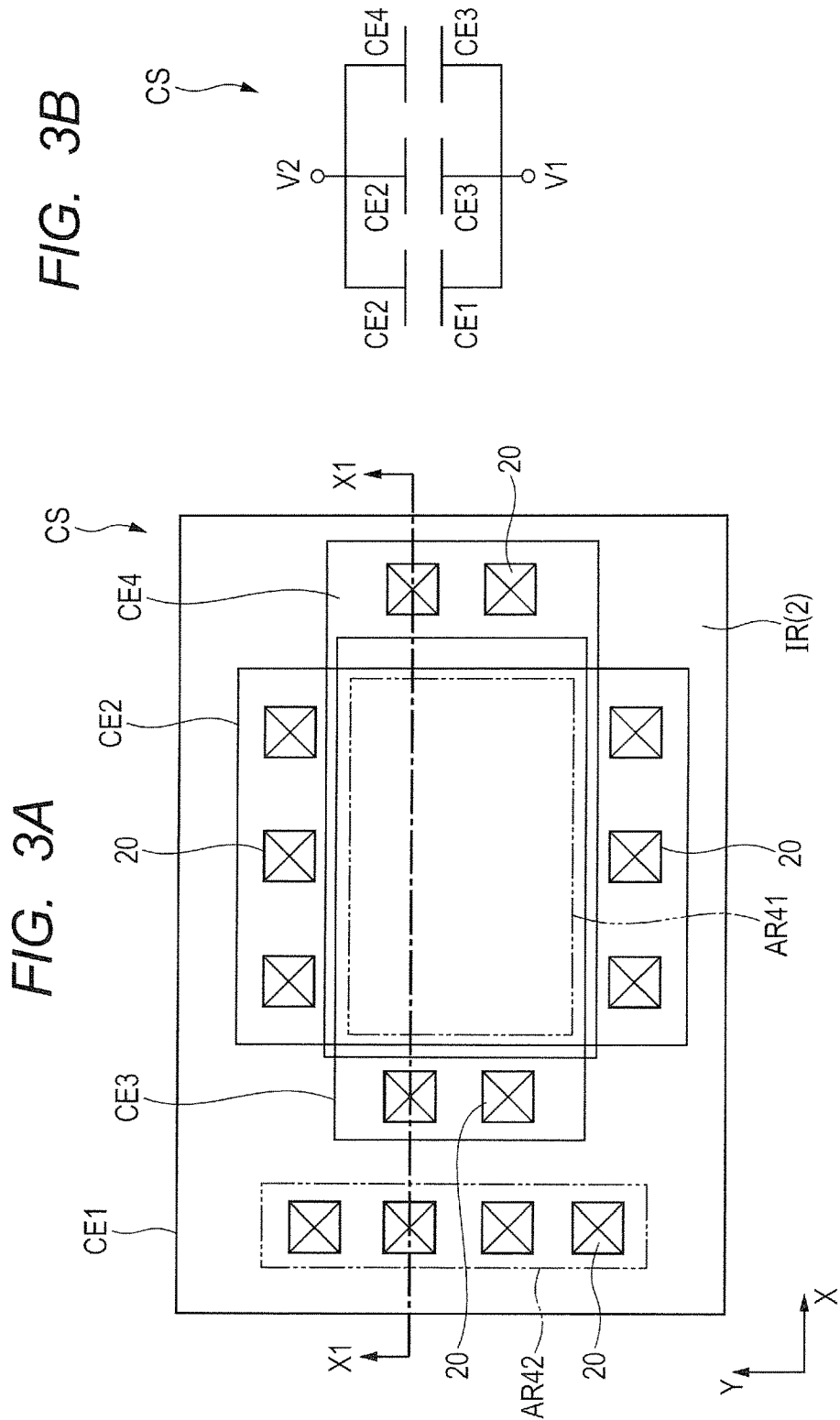
FIG. 3A is a main-portion plan view of a stacked capacitive element and FIG. 3B is an illustrative view showing a circuit configuration of the stacked capacitive element.

In the X- and Y-directions at the paper sheet with FIG. 3A, the second capacitive electrode CE2 is located so as to completely cover the active region AR41. Also, the third capacitive electrode CE3 is formed over the second capacitive electrode CE2 so as to completely cover the active region AR41. Also, the fourth capacitive electrode CE4 is formed over the third capacitive electrode CE3 so as to completely cover the active region AR41. The second capacitive electrode CE2 has a protruding portion which does not overlap the active region AR41 and the third and fourth capacitive electrodes CE3 and CE4 in the Y-direction. The third capacitive electrode CE3 has a protruding portion which does not overlap the active region AR41 and the second and fourth capacitive electrodes CE2 and CE4 in the X-direction. The fourth capacitive electrode CE4 has a protruding portion which does not overlap the active region AR41 and the second and third capacitive electrodes CE2 and CE3 in the X-direction. Note that the main-portion cross-sectional view of the stacked capacitive element CS shown in the peripheral circuit region 1D in FIG. 2 is a cross section along the line X1-X1 in FIG. 3.

As shown in FIG. 3B, the stacked capacitive element CS has a structure in which the first, second, and third capacitors are coupled in parallel to each other. The first capacitor includes the first and second capacitive electrodes CE1 and CE2. The second capacitor includes the second and third capacitive electrodes CE2 and CE3. The third capacitor includes the third and fourth capacitive electrodes CE3 and CE4. The first and second capacitors share the second capacitive electrode CE2. The second and third capacitors share the third capacitive electrode CE3. To the first and third capacitive electrodes CE1 and CE3, a first potential is applied. To the second and fourth capacitive electrodes CE2 and CE4, a second potential different from the first potential is applied. That is, the first, second, and third capacitors are coupled in parallel to each other.

Next, using FIG. 2, a configuration over the memory cell MC formed in the memory cell region 1A, over the MISFET QH formed in the peripheral circuit region 1B, over the MISFET QL formed in the peripheral circuit region 1C, and over the stacked capacitive electrode CS formed in the peripheral circuit region 1D will specifically be described.

Over the semiconductor substrate 1, an interlayer insulating film 19 is formed so as to cover the control gate electrode CG, the memory gate electrode MG, the gate electrode GEH, the gate electrode GEL, the fourth capacitive electrode CE4, and the sidewall spacers SW. The interlayer insulating film 19 is made of a laminated film including, e.g., a silicon nitride film and a silicon dioxide film over the silicon nitride film and has the planarized upper surface.

In the interlayer insulating film 19, contact holes (openings) are formed and, in the contact holes, conductive plug electrodes 20 are embedded.

Each of the plug electrodes 20 is formed of a thin barrier conductor film formed over the bottom portion and the side wall, i.e., side surface of the contact hole and a main conductor film located over the barrier conductor film and formed so as to be embedded in the contact hole. In FIG. 2, for simpler illustration, the barrier conductor film and the main conductor film each included in the plug electrode 20 are integrally shown. Note that the barrier conductor film included in the plug electrode 20 can be, e.g., a titanium (Ti) film, a titanium nitride (TiN) film, or a laminated film thereof and the main conductor film included in the plug electrode 20 can be, e.g., a tungsten (W) film.

The plug electrodes 20 embedded in the contact holes are electrically coupled to the n+-type semiconductor regions 17, the p+-type semiconductor regions 16, the third capacitive electrode CE3, the fourth capacitive electrode CE4, and the like. There is also the plug electrode 20 electrically coupled to the second capacitive electrode CE2, though not shown.

Over the interlayer insulating film 19, metal wires 21 are formed and electrically coupled to the plug electrodes 20. The metal wires 21 are formed of, e.g., tungsten (W) wires or aluminum (Al) wires. The metal wires 21 may also be embedded wires using copper (Cu) as a main conductive material.

<Method of Manufacturing Semiconductor Device>

Next, a description will be given of a method of manufacturing the semiconductor device in Embodiment 1.

Figure 4:
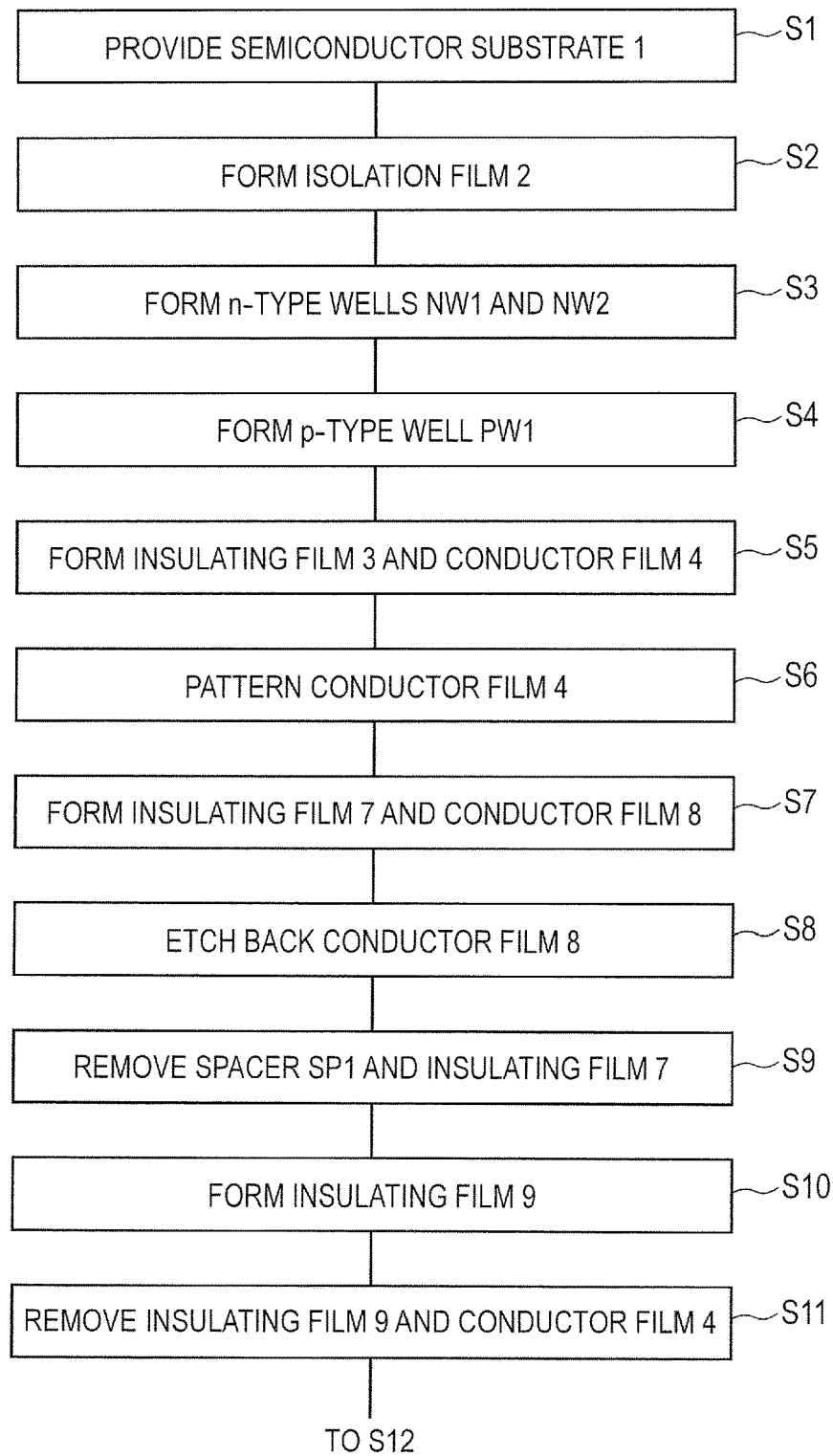
FIG. 4 is a process flow chart showing a part of the manufacturing process of the semiconductor device in Embodiment 1.
Figure 5:
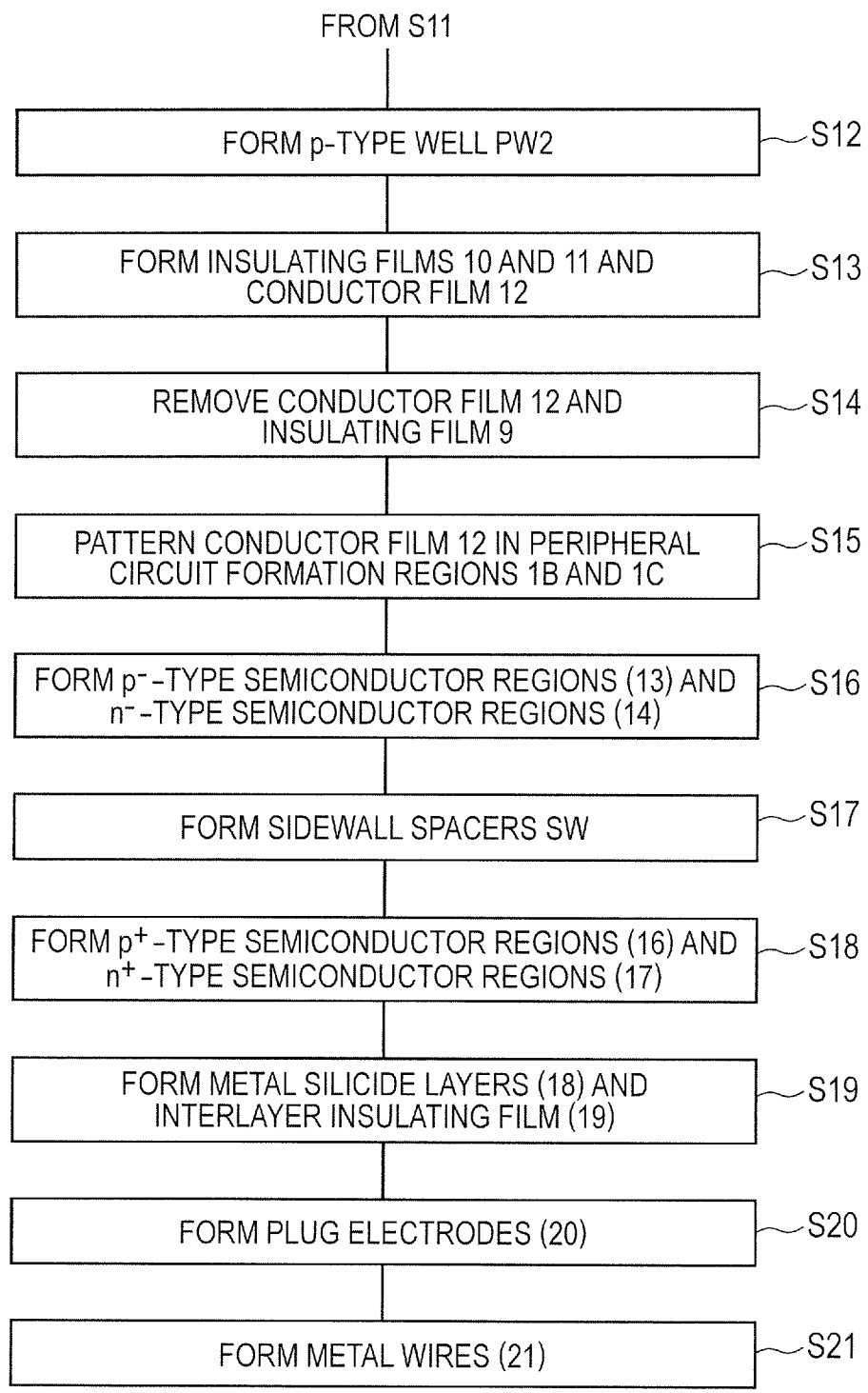
FIG. 5 is a process flow chart showing a part of the manufacturing process of the semiconductor device in Embodiment 1.

FIGS. 4 and 5 are process flow charts showing a part of the manufacturing process of the semiconductor device in Embodiment 1. FIGS. 6 to 13 are main-portion cross-sectional views of the semiconductor device in Embodiment 1 during the manufacturing process thereof. The cross-sectional views of FIGS. 6 to 13 are main-portion cross-sectional views of the memory cell region 1A and the peripheral circuit regions 1B, 1C, and 1D, which show the formation of the memory cell MC in the memory cell region 1A, the formation of the MISFET QH in the peripheral circuit region 1B, the formation of the MISFET QL in the peripheral circuit region 1C, and the formation of the stacked capacitive element CS in the peripheral circuit region 1D.

In Embodiment 1, a description will be given of the case where the n-channel control transistor CT and the n-channel memory transistor MT are formed in the memory cell region 1A. However, it is also possible to invert the conductivity type and form the p-channel control transistor CT and the p-channel memory transistor MT in the memory cell region 1A.

Likewise, in Embodiment 1, a description will be given of the case where the p-channel MISFET QH is formed in the peripheral circuit region 1B. However, it is also possible to invert the conductivity type and form the n-channel MISFET QH in the peripheral circuit region 1B. It is also possible to form a CMISFET (Complementary MISFET) or the like in the peripheral circuit region 1B. Likewise, in Embodiment 1, a description will be given also of the case where the n-channel MISFET QL is formed in the peripheral circuit region 1C, but it is also possible to invert the conductivity type and form the p-channel MISFET QL in the peripheral circuit region 1C. It is also possible to form a CMISFET or the like in the peripheral circuit region 1C.

Figure 6:
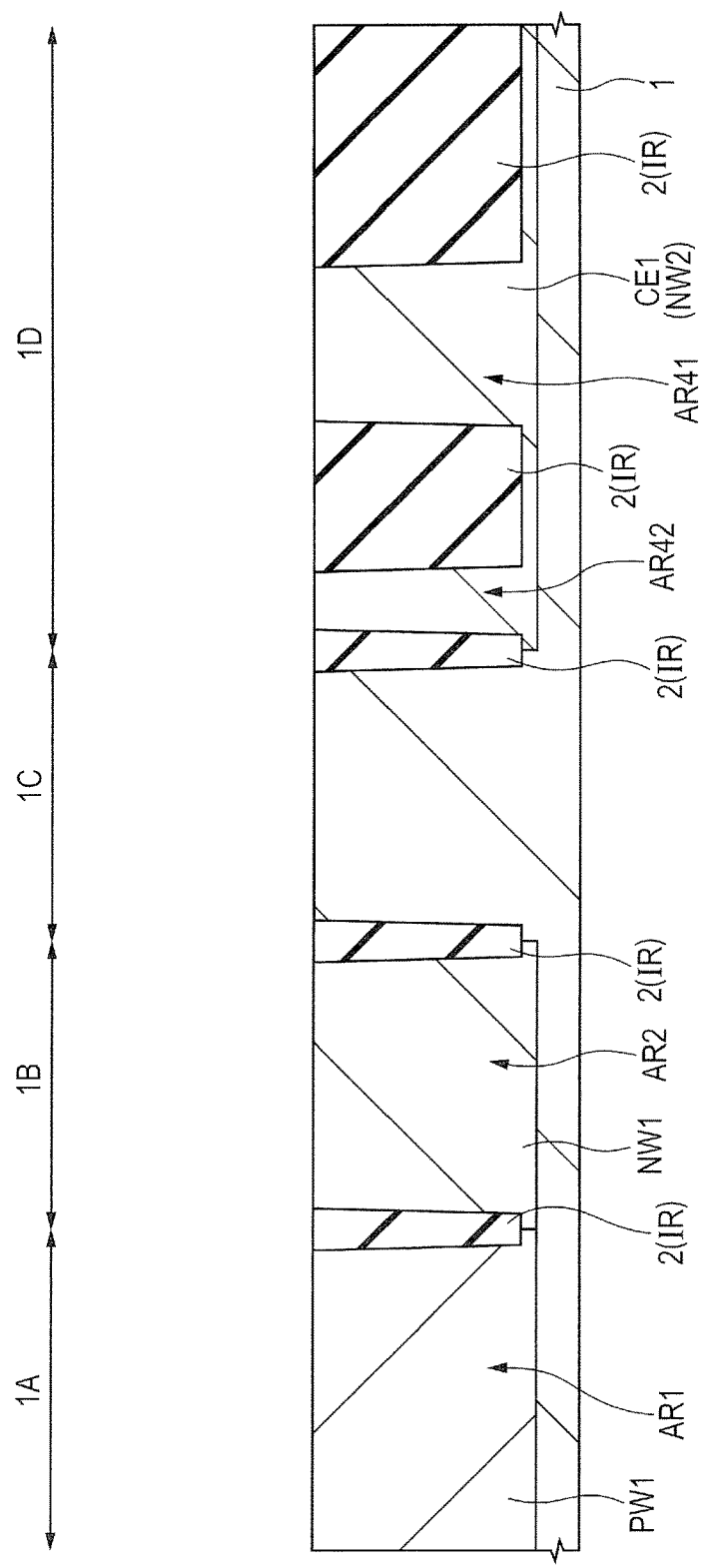
FIG. 6 is a main-portion cross-sectional view of the semiconductor device in Embodiment 1 during the manufacturing process thereof.

First, as shown in FIG. 6, the semiconductor substrate 1 as a semiconductor wafer made of p-type monocrystalline silicon having a specific resistance of, e.g., about 1 to 10 Ωcm is provided, i.e., prepared (Step S1 in FIG. 4).

Next, as shown in FIG. 6, the isolation film 2 is formed (Step S2 in FIG. 4). The isolation film 2 serves as the isolation region IR defining the active region AR1 in the memory cell region 1A of the main surface of the semiconductor substrate 1. The isolation film 2 also serves as the isolation region IR defining the active region AR2 in the peripheral circuit region 1B of the main surface of the semiconductor substrate 1. The isolation film 2 also serves as the isolation region IR defining the active region AR3 in the peripheral circuit region 1C of the main surface of the semiconductor substrate 1. The isolation film 2 also serves as the isolation region IR defining the active regions AR1 and AR42 in the peripheral circuit region 1D of the main surface of the semiconductor substrate 1.

The isolation film 2 is made of an insulator such as silicon dioxide and can be formed by, e.g., a STI (Shallow Trench Isolation) method. The insulating film 2 can be provided by, e.g., forming isolation trenches in the isolation regions IR and then selectively forming an insulating film made of, e.g., silicon dioxide in each of the isolation trenches.

Next, as shown in FIG. 6, in the peripheral circuit regions 1B and 1D, the n-type wells NW1 and NW2 are formed in the active regions AR2, AR41, and AR42 (Step S3 in FIG. 4). The n-type wells NW1 and NW2 can be formed by introducing an n-type impurity such as, e.g., phosphorus (P) into the semiconductor substrate 1 by an ion implantation method or the like. Each of the n-type wells NW1 and NW2 is formed to a predetermined depth from the main surface of the semiconductor substrate 1 to be deeper than the isolation trenches. That is, the n-type wells NW1 and NW2 are formed also under the isolation film 2. The n-type well NW2 serves as the first capacitive electrode CE1 of the stacked capacitive element CS.

Next, as shown in FIG. 6, in the memory cell region 1A, the p-type well PW1 is formed in the active region AR1 (Step S4 in FIG. 4). The p-type well PW1 can be formed by introducing a p-type impurity such as, e.g., boron (B) into the semiconductor substrate 1 by an ion implantation method or the like. The p-type well PW1 is formed to a predetermined depth from the main surface of the semiconductor substrate 1. Note that the order in which Steps S3 and S4 are performed can be reversed.

Figure 7:
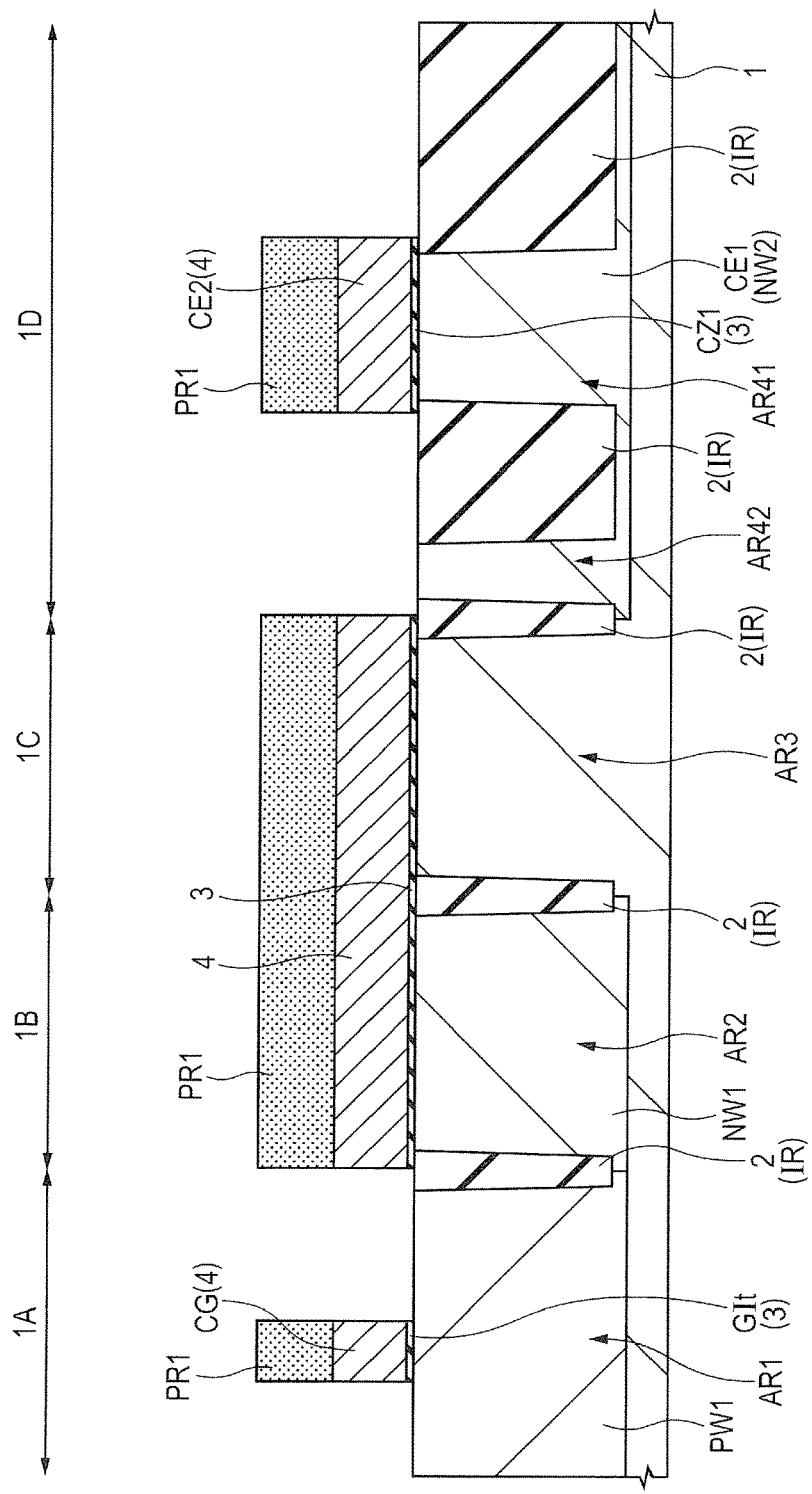
FIG. 7 is a main-portion cross-sectional view of the semiconductor device in Embodiment 1 during the manufacturing process thereof.

Next, as shown in FIG. 7, over the entire main surface of the semiconductor substrate 1, the insulating film 3 and the conductor film 4 are formed (Step S5 in FIG. 4).

In Step S5, first, over the memory cell region 1A and the peripheral circuit regions 1B, 1C, and 1D of the main surface of the semiconductor substrate 1, the insulating film 3 is formed. The insulating film 3 formed over the p-type well PW1 in the memory cell region 1A serves as an insulating film for the gate insulating film GIt of the memory cell MC. Over the peripheral circuit region 1D, the insulating film 3 serves as the first capacitive insulating film CZ1. The insulating film 3 can be formed using a thermal oxidation method, a sputtering method, an atomic layer deposition (ALD) method, a chemical vapor deposition (CVD) method, or the like.

When the film thickness of the first capacitive insulating film CZ1 is set larger than the film thickness of the gate insulating film GIt, after a thick insulating film for the first capacitive insulating film CZ1 is formed over the semiconductor substrate 1, the thick insulating film is selectively removed from the memory cell region 1A and then a thin insulating film for the gate insulating film GIt is formed over the memory cell region 1A.

In Step S5, next, as shown in FIG. 7, the conductor film 4 is formed over the insulating film 3 over the memory cell region 1A and the peripheral circuit regions 1B, 1C, and 1D. The conductor film 4 is made of a polycrystalline silicon film, i.e., polysilicon film. The conductor film 4 can be formed using a CVD method or the like. Alternatively, it is also possible to deposit an amorphous silicon film as the conductive film 4 and change the amorphous silicon film to a polycrystalline silicon film by the subsequent heat treatment. The film thickness of the conductor film 4 is set to 70 to 120 nm.

As the conductor film 4, a conductor film having a low resistivity due to, e.g., an n-type impurity such as phosphorus (P) or arsenic (As) or a p-type impurity such as boron (B) introduced therein is preferably used.

Next, as shown in FIG. 7, the conductor film 4 is patterned (Step S6 in FIG. 4). In Step S6, using, e.g., photolithography and etching, the conductor film 4 is patterned into a desired two-dimensional shape.

First, over the conductor film 4, a resist film PR1 is formed. The resist film PR1 has a pattern covering the area of the memory cell region 1A where the control gate electrode CG is to be formed and exposing the other portion thereof. The resist film PR1 also has a pattern covering the peripheral circuit regions 1B and 1C, covering the area of the peripheral circuit region 1D where the second capacitive electrode CE2 is to be formed, and exposing the other portion thereof.

Next, using the resist film PR1 as an etching mask, the conductor film 4 is etched by anisotropic dry etching or the like to be patterned. Thus, over the memory cell region 1A, the control gate electrode CG made of the conductor film 4 is formed and the gate insulating film GIt made of the insulating film 3 located between the control gate electrode CG and the p-type well PW1 of the semiconductor substrate 1 is formed. That is, over the memory cell region 1A, the control gate electrode CG is formed over the p-type well PW1 of the semiconductor substrate 1 via the gate insulating film GIt.

Also, over the peripheral circuit region 1D, the first capacitive insulating film CZ1 and the second capacitive electrode CE2 are formed so as to cover the active region AR42. On the other hand, over the peripheral circuit regions 1B and 1C, the conductor film 4 is left. Then, the resist film, i.e., the resist film PR1 is removed.

Note that, from the memory cell region 1A, the portion of the insulating film 3 which is uncovered with the control gate electrode CG is removed by performing the dry etching in Step S6 or performing wet etching after the dry etching in Step S6. As a result, at the portion of the memory cell region 1A where the control gate electrode CG is not formed, the p-type well PW1 of the semiconductor substrate 1 is exposed. From the peripheral circuit region 1D, the insulating film 3 exposed from the second capacitive electrode CE2 is also removed by similarly performing the dry etching in Step S6 or performing wet etching after the dry etching. In plan view, the first capacitive insulating film CZ1 has a pattern equal to that of the second capacitive electrode CE2.

In Step S7, first, over the memory cell region 1A and the peripheral circuit region 1B, 1C, and 1D of the main surface of the semiconductor substrate 1, the insulating film 7 for the gate insulating film GIm of the memory transistor MT is formed. At this time, over the exposed portion of the memory cell region 1A of the main surface of the semiconductor substrate 1 and the upper and side surfaces of the control gate electrode CG, the insulating film 7 is formed. Also, over the upper surfaces of the portions of the conductor film 4 which are left over the peripheral circuit regions 1B and 1C, the insulating film 7 is formed. Also, over the upper and side surfaces of the second capacitive electrode CE2 over the peripheral circuit region 1D and the peripheral circuit region 1D of the main surface of the semiconductor substrate 1, the insulating film 7 is formed. Over the peripheral circuit region 1D, the insulating film 7 serves as the second capacitive insulating film CZ2.

As described above, the insulating film 7 has the internal charge storage portion and is made of a laminated film in which the silicon dioxide film, the silicon nitride film, and the silicon dioxide film are formed upwardly in this order as insulating films.

Of the insulating film 7, the lower-layer silicon dioxide film can be formed by a thermal oxidation method or an ISSG (in-situ steam generation) oxidation method at a temperature of, e.g., about 1000 to 1100° C. Also, of the insulating film 7, the silicon nitride film can be formed by, e.g., a CVD method. Also, of the insulating film 7, the upper-layer silicon dioxide film can be formed by, e.g., a CVD method.

Note that, in Embodiment 1, the silicon nitride film is used as an insulating film having a trap level. However, the insulating film having a trap level is not limited to the silicon nitride film. For example, a high-dielectric-constant film having a dielectric constant higher than that of the silicon nitride film, such as an aluminum oxide (alumina) film, a hafnium oxide film, or a tantalum oxide film can be used.

In Step S7, next, the conductor film 8 is formed over the insulating film 7 over the memory cell region A and the peripheral circuit regions 1B, 1C, and 1D.

Preferably, the conductor film 8 is formed of, e.g., a polycrystalline silicon film, i.e., polysilicon film. The conductor film 8 can be formed using a CVD method or the like. It is also possible to deposit an amorphous silicon film as the conductor film 8 and then change the amorphous silicon film to a polycrystalline silicon film by the subsequent heat treatment. The film thickness of the conductor film 8 is controlled to 50 to 70 nm. The conductor film 8 is formed to have a film thickness smaller than the film thickness of the conductor film 4 or the conductor film 12 described later.

As the conductor film 8, a conductor film having a low resistivity due to an n-type impurity such as, e.g., phosphorus (P) or arsenic (As) or a p-type impurity such as boron (B) introduced therein is preferably used.

Figure 8:
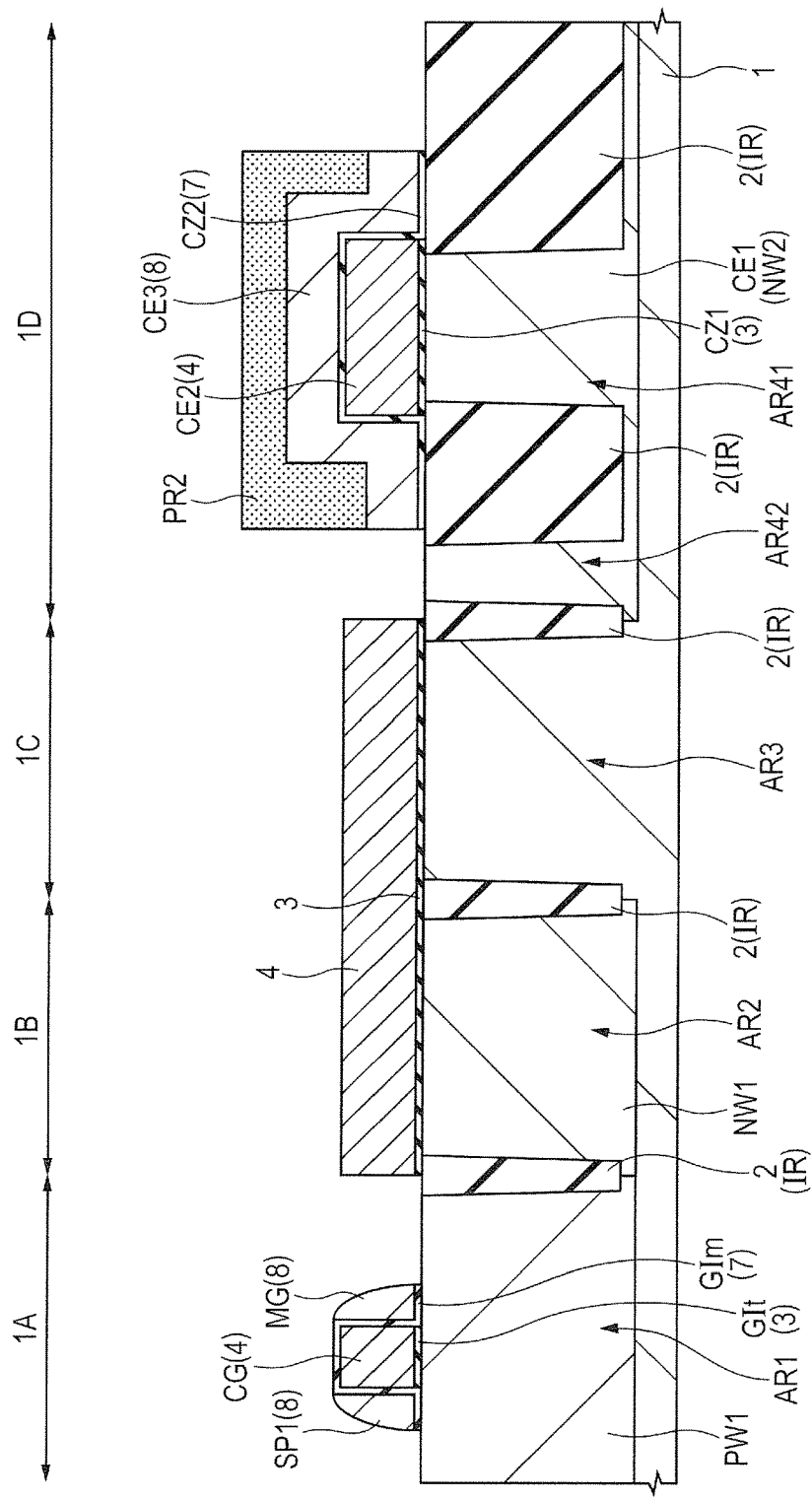
FIG. 8 is a main-portion cross-sectional view of the semiconductor device in Embodiment 1 during the manufacturing process thereof.

Next, as shown in FIG. 8, the conductor film 8 is etched back using an anisotropic dry etching technique to form the memory gate electrode MG and the third capacitive electrode CE3 (Step S8 in FIG. 4).

In Step S8, first, a resist film PR2 is formed using photolithography. The resist film PR2 has a pattern covering the portion of the peripheral circuit region 1D where the third capacitive electrode CE3 is to be formed and exposing the other region thereof. The resist film PR2 also has the pattern exposing the memory cell region 1A and the peripheral circuit regions 1B and 1C. Next, anisotropic dry etching is performed on the conductor film 8 to etch back the conductor film 8. As a result, the conductor film 8 is left in sidewall spacer shapes over the both side walls, i.e., side surfaces of the control gate electrode CG via the insulating films 7 to form the memory gate electrode MG and a spacer SP1.

In the etch-back process described above, the conductor film 8 and the insulating film 7 are removed from the peripheral circuit regions 1B and 1C. On the other hand, the conductor film 8 is left only over the portion of the peripheral circuit region 1D which is covered with the resist film PR2 to form the third capacitive electrode CE3. Since the insulating film 7 exposed from the third capacitive electrode CE3 is also removed from the peripheral circuit region 1D, the second capacitive insulating film CZ2 has a pattern equal to that of the third capacitive electrode CD3 in plan view.

Figure 9:
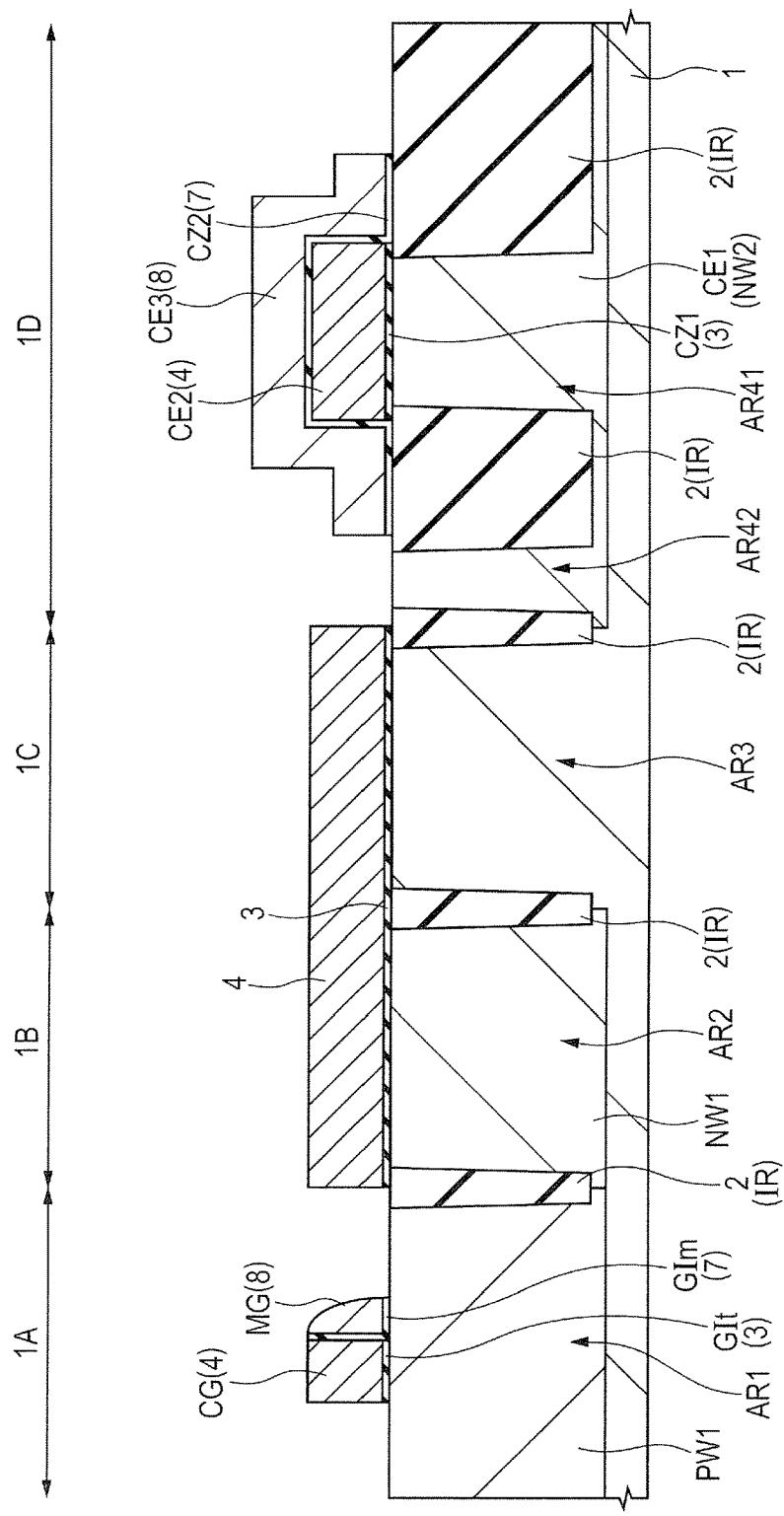
FIG. 9 is a main-portion cross-sectional view of the semiconductor device in Embodiment 1 during the manufacturing process thereof.

Next, as shown in FIG. 9, the spacer SP1 and the insulating film 7 are removed (Step S9 in FIG. 4).

In Step S9, first, a resist film (not shown) which covers the memory gate electrode MG and exposes the spacer SP1 is formed over the semiconductor substrate 1. Then, by dry etching using the formed resist film as an etching mask, the spacer SP1 is removed. On the other hand, the memory gate electrode MG that has been covered with the resist film is not etched but is left. Then, the resist film is removed. The resist film (not shown) covers the peripheral circuit regions 1B, 1D, and 1D.

In Step S9, next, the portion of the insulating film 7 which is uncovered with the memory gate electrode MG is removed by etching such as, e.g., wet etching. At this time, over the memory cell region 1A, the insulating film 7 located between the memory gate electrode MG and the p-type well PW1 and between the memory gate electrode MG and the control gate electrode CG is not removed but is left, while the insulating film 7 located over the other region is removed. At this time, over the memory cell region 1A, the gate insulating film GIm including the portion of the insulating film 7 which is left between the memory gate electrode MG and the p-type well PW1 and the portion of the insulating film 7 which is left between the memory gate electrode MG and the control gate electrode CG is formed.

Next, over the semiconductor substrate, the insulating film 9 is formed (Step S10 in FIG. 4).

In Step S10, first, over the memory cell region 1A and the peripheral circuit regions 1B, 1C, and 1D of the main surface of the semiconductor substrate 1, the insulating film 9 is formed. The insulating film 9 is formed so as to cover the exposed portion of the memory cell region 1A of the main surface the semiconductor substrate 1, the control gate electrode CG, and the memory gate electrode MG. The insulating film 9 is also formed so as to cover the portions of the conductor film 4 which are left over the peripheral circuit regions 1B and 1C, the peripheral circuit region 1D of the main surface of the semiconductor substrate 1, and the second and third capacitive electrodes CE2 and CE3.

The insulating film 9 includes a laminated film including, e.g., a silicon dioxide film and a silicon nitride film over the silicon dioxide film. The silicon dioxide film is formed by a thermal oxidation method or an ISSG oxidation method. The silicon nitride film can be formed using, e.g., a CVD method or the like.

The insulating film 9 is a protective film (protective insulating film) for the memory cell MC which is formed so as to cover the memory cell MC. The insulating film 9 is formed so as to cover the control gate electrode CG, the gate insulating films GIt and GIm, and the memory gate electrode MG over the memory cell region 1A and the memory cell region 1A of the main surface of the semiconductor substrate 1 (p-type well PW1). In the steps including and subsequent to Step S11 shown in FIG. 4, the MISFET QH is formed in the peripheral circuit region 1B and the MISFET QL is formed in the peripheral circuit region 1C. In the steps of forming the MISFETs QH and QL, treatments such as thermal oxidation (e.g., Step S13) and etching (e.g., Step S15) are performed. The insulating film 9 is provided so as to prevent the control gate electrode CG, the memory gate electrode MG, the gate insulating films GIt and GIm which are formed over the memory cell region 1A, the main surface of the semiconductor substrate 1, and the like from being oxidized or etched during the treatments such as thermal oxidation and etching mentioned above.

The insulating film 9 serves as the third capacitive insulating film CZ3 of the stacked capacitive element CS over the peripheral circuit region 1D.

Figure 10:
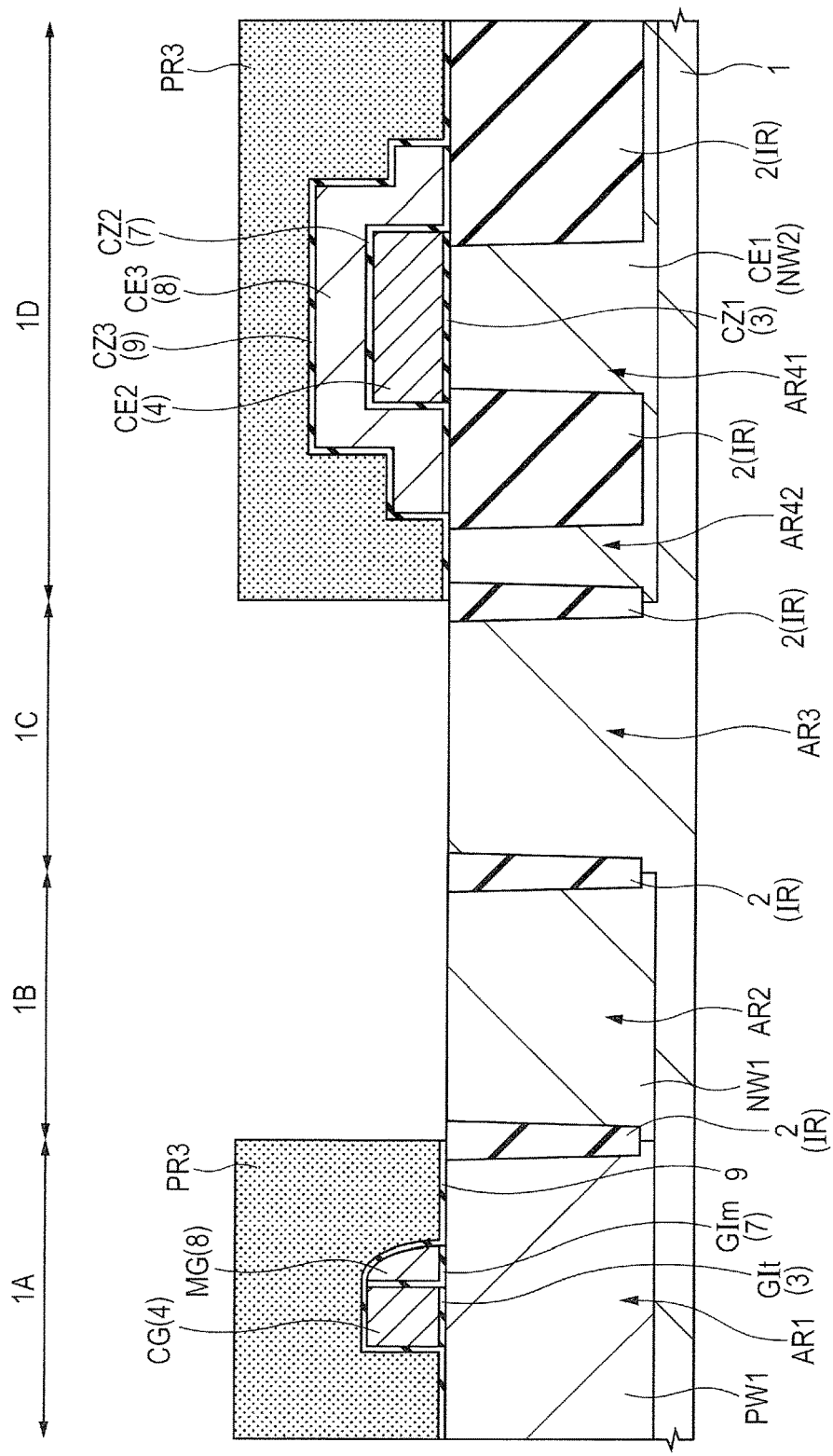
FIG. 10 is a main-portion cross-sectional view of the semiconductor device in Embodiment 1 during the manufacturing process thereof.

Next, as shown in FIG. 10, from the peripheral circuit regions 1B an 1C, the insulating film 9 and the conductor film 4 are removed (Step S11 in FIG. 5).

In Step S11, as shown in FIG. 10, a resist film PR3 having a pattern covering the memory cell region 1A and the peripheral circuit region 1D and exposing the peripheral circuit regions 1B and 1C is formed. Then, using the resist film PR3 as an etching mask, the insulating film 9 and the conductor film 4 are removed by etching such as, e.g., dry etching. Thus, as shown in FIG. 10, the conductive film 4 can completely be removed from the peripheral circuit regions 1B and 1C. The insulating film 3 is removed also from the peripheral circuit regions 1B and 1C. Then, the resist film PR3 is removed, while the insulating film 9 is left over the memory cell region 1A and the peripheral circuit region 1D.

Figure 11:
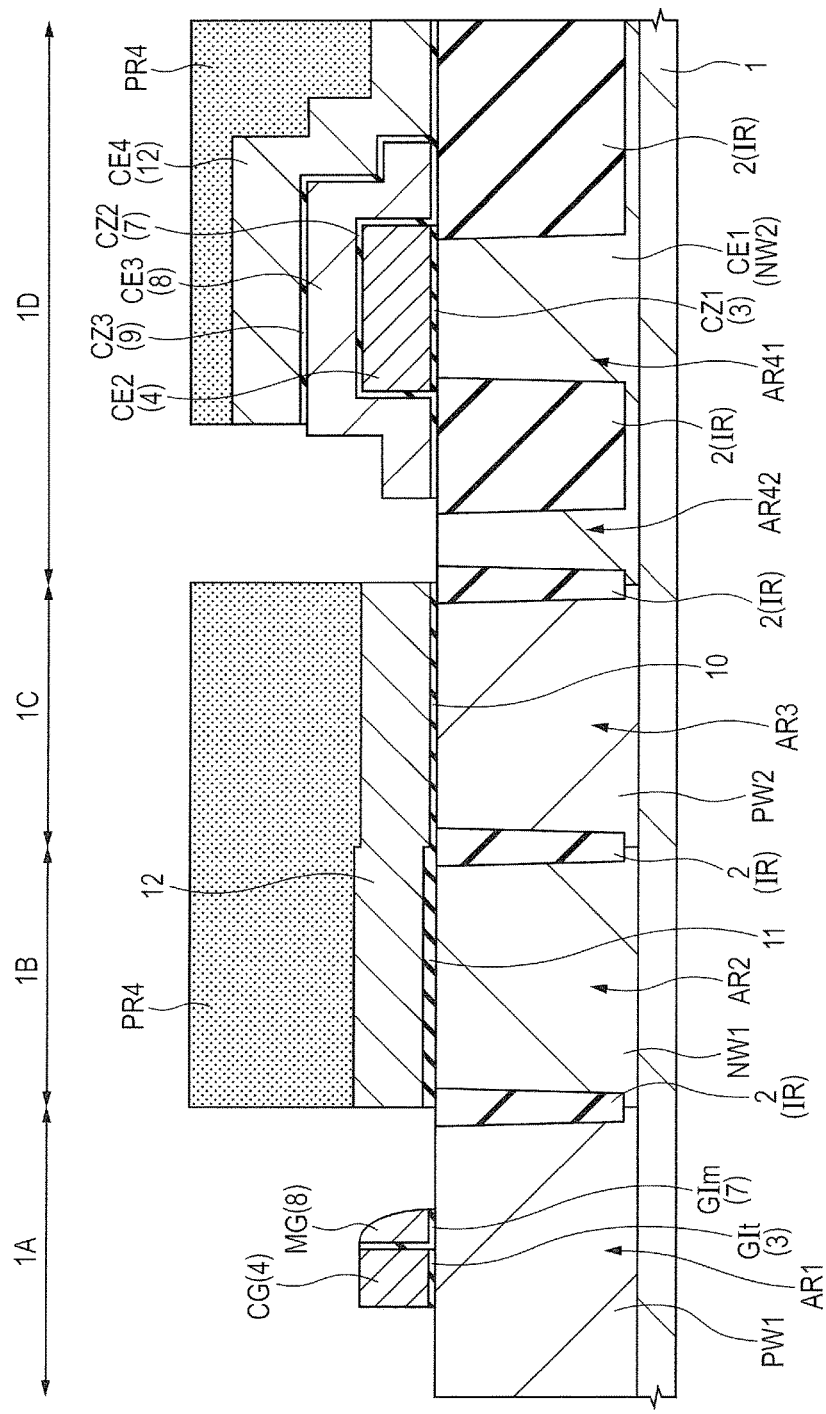
FIG. 11 is a main-portion cross-sectional view of the semiconductor device in Embodiment 1 during the manufacturing process thereof.

Next, as shown in FIG. 11, in the active region AR3 of the peripheral circuit region 1C, the p-type well PW2 is formed (Step S12 in FIG. 5). Similarly to the p-type well PW1, the p-type well PW2 can be formed by introducing a p-type impurity such as, e.g., boron (B) into the semiconductor substrate 1 by an ion implantation method or the like. The p-type well PW2 is formed from the main surface of the semiconductor substrate 1 to a predetermined depth.

Next, as shown in FIG. 11, over the entire main surface of the semiconductor substrate 1, the insulating films 10 and 11 and the conductor film 12 are formed (Step S13 in FIG. 5).

In Step S13, first, as shown in FIG. 11, over the peripheral circuit regions 1B and 1C, the insulating films 11 and 10 are formed. The insulating film 11 is for the gate insulating film GIH of the MISFET QH. The insulating film 10 is for the gate insulating film GIL of the MISFET QL. Accordingly, the film thickness of the insulating film 11 is larger than the film thickness of the insulating film 10. The insulating film 11 is formed over the n-type well NW1, while the insulating film 10 is formed over the p-type well PW2.

The insulating films 11 and 10 can be formed by, e.g., a thermal oxidation method. In this case, each of the insulating films 11 and 10 is made of a silicon dioxide film. However, it may also be possible to perform nitridation treatment on the silicon dioxide film to provide a silicon oxynitride film. The insulating film 11 may also be formed by, e.g., an ISSG oxidation method.

In Step S13, next, over the semiconductor substrate 1, the conductor film 12 is formed. The conductor film 12 is for forming the gate electrode GEH of the MISFET QH, the gate electrode GEL of the MISFET QL, and the fourth capacitive electrode CE4.

Preferably, the conductor film 12 is made of a polycrystalline silicon film, i.e., polysilicon film. The conductor film 12 can be formed using a CVD method or the like. It is also possible to deposit an amorphous film as the conductor film 12 and change the amorphous silicon film to a polycrystalline silicon film by the subsequent heat treatment. The film thickness of the conductor film 12 is controlled to 70 to 120 nm, which is larger than the film thickness of the conductor film 8.

As the conductor film 12, a conductor film having a lower resistivity due to an n-type impurity such as, e.g., phosphorus (P) or arsenic (As) or a p-type impurity such as boron (B) introduced therein. For example, it is preferable to introduce a p-type impurity into the conductor film 12 over the peripheral circuit region 1B and introduce an n-type impurity into the conductor film 12 over the peripheral circuit region 1C.

Next, as shown in FIG. 11, the conductor film 12 is removed from the memory cell region 1A, while the fourth capacitive electrode CE4 is formed over the peripheral circuit region 1D (Step S14 in FIG. 5).

In Step S14, first, a resist film PR4 having a pattern exposing the memory cell region 1A, covering the peripheral circuit regions 1B and 1C, covering the area of the peripheral circuit region 1D where the fourth capacitive electrode CE4 is to be formed, and exposing the other area thereof is formed.

Next, using the resist film PR4 as an etching mask, the conductor film 12 is etched by, e.g., dry etching or the like to be removed. Thus, as shown in FIG. 11, the portion of the conductor film 12 which has been left over the memory cell region 1A is removed and the insulating film 9 is also removed. Over the peripheral circuit region 1D, using the resist film PR4, the conductor film 12 and the insulating film 9 are patterned to thus be able to form the fourth capacitive electrode CE4 and the third capacitive insulating film CZ3. Then, the portion of the resist film PR4 which has been left over the peripheral circuit regions 1B and 1C is removed.

Figure 12:
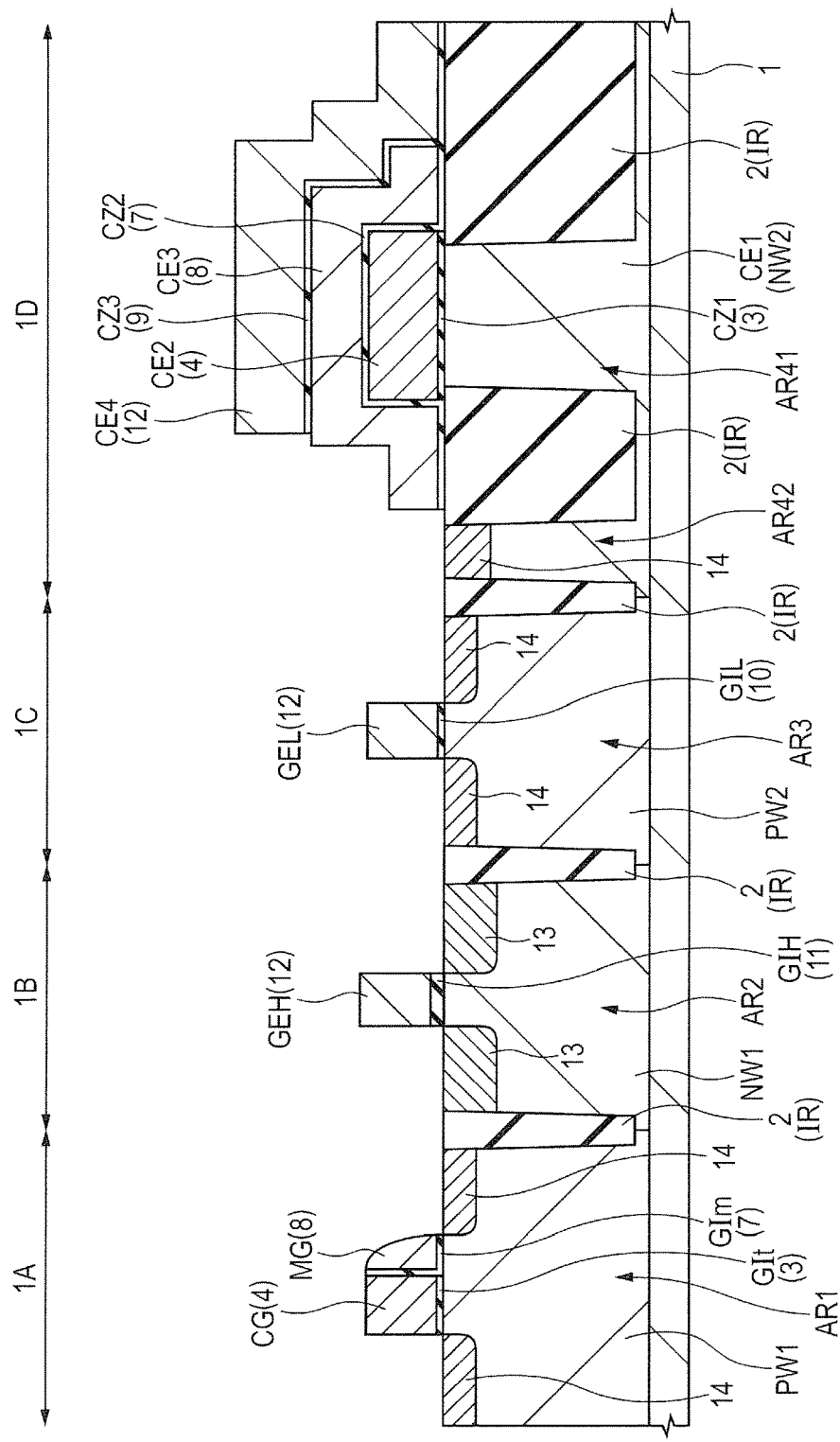
FIG. 12 is a main-portion cross-sectional view of the semiconductor device in Embodiment 1 during the manufacturing process thereof.

Next, as shown in FIG. 12, over the peripheral circuit regions 1B and 1C, the conductor film 12 is patterned (Step S15 in FIG. 5).

First, over the main surface of the semiconductor substrate 1, a resist film (not shown) is formed. The resist film has a pattern covering the memory cell region 1A and the peripheral circuit region 1D, covering the area of the peripheral circuit region 1B where the gate electrode GEH is to be formed, exposing the other portion thereof, covering the area of the peripheral circuit region 1C where the gate electrode GEL is to be formed, and exposing the other portion thereof.

Next, using the foregoing resist film, the conductor film 12 is etched by, e.g., anisotropic etching or the like to be patterned.

As a result, over the peripheral circuit region 1B, the gate electrode GEH made of the conductor film 12 is formed and the gate insulating film GIH made of the insulating film 11 located between the gate electrode GEH and the n-type well NW1 of the semiconductor substrate 1 is formed. Over the peripheral circuit region 1C, the gate electrode GEL made of the conductor film 12 is formed and the gate insulating film GIL made of the insulating film 10 located between the gate electrode GEL and the p-type well PW2 of the semiconductor substrate 1 is formed. Then, the foregoing resist film is removed. Note that the fourth capacitive electrode CE4, the gate electrode GEH, and the gate electrode GEL may also be patterned in the same step.

Next, as shown in FIG. 12, the $n^-$-type semiconductor regions 14 and the $p^-$-type semiconductor regions 13 are formed using an ion implantation method or the like (Step S16 in FIG. 5). In Step S16, an n-type impurity such as, e.g., arsenic (As) or phosphorus (P) is introduced into the p-type wells PW1 and PW2 and the n-type well NW2 of the semiconductor substrate 1 using the control gate electrode CG, the memory gate electrode MG, the gate electrode GEL, and the isolation film 2 as a mask. Thus, the $n^-$-type semiconductor regions 14 are formed. Also, e.g., boron (B) is introduced as a p-type impurity into the n-type well NW1 of the semiconductor substrate 1 using the gate electrode GEH and the isolation film 2 as a mask. Thus, the $p^-$-type semiconductor regions 13 are formed.

At this time, in the memory cell region 1A, the $n^-$-type semiconductor regions 14 are formed by self-alignment with the respective side surfaces of the memory gate electrode MG and the control gate electrode CG. Also, in the peripheral circuit region 1C, the $n^-$-type semiconductor regions 14 are formed by self-alignment with the side surfaces of the gate electrode GEL. Also, in the peripheral circuit region 1D, the $n^-$-type semiconductor regions 14 are formed by self-alignment with the isolation film 2. On the other hand, in the peripheral circuit region 1B, the $p^-$-type semiconductor regions 13 are formed by self-alignment with the side surfaces of the gate electrode GEH.

Figure 13:
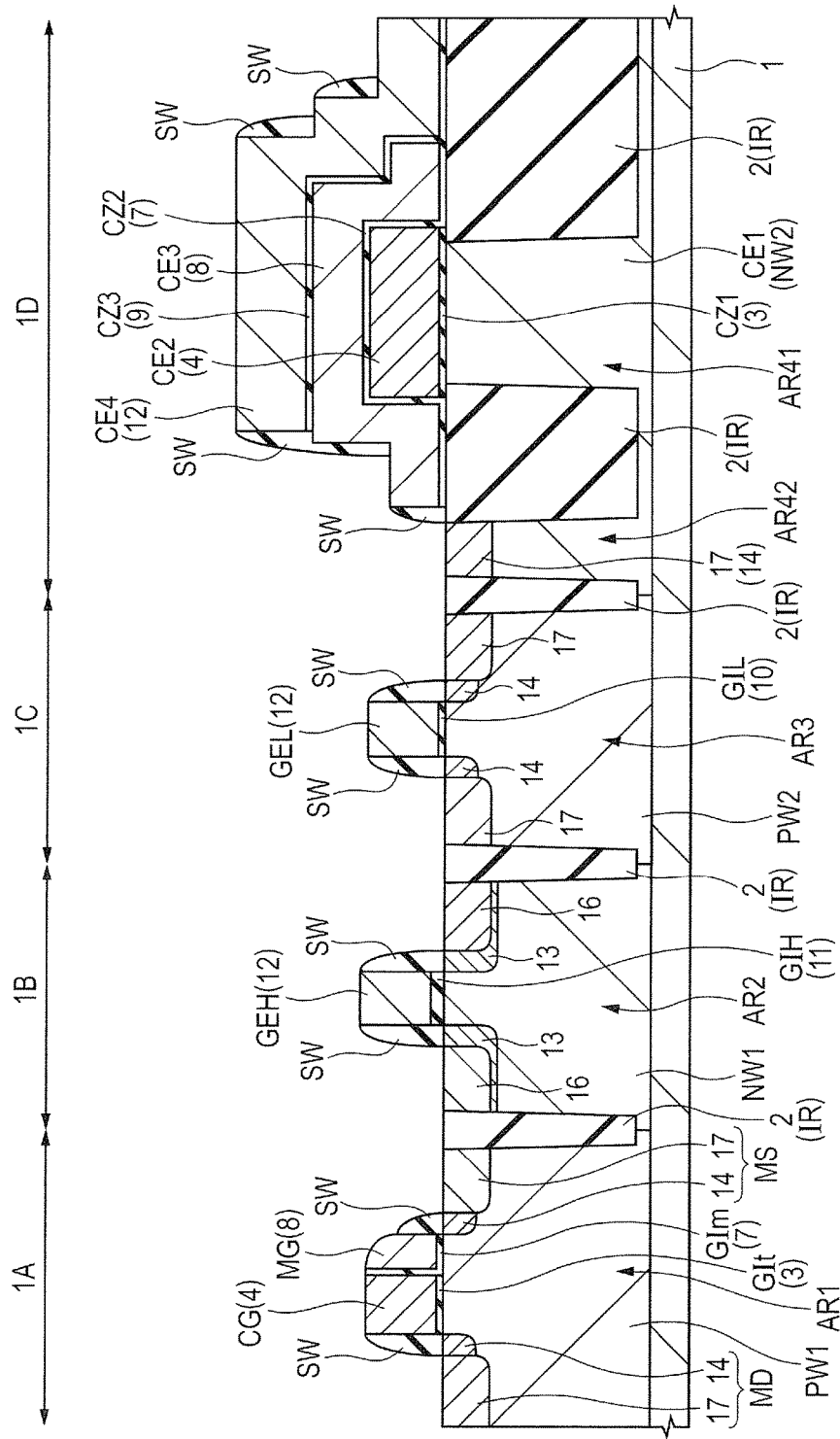
FIG. 13 is a main-portion cross-sectional view of the semiconductor device in Embodiment 1 during the manufacturing process thereof.

Next, as shown in FIG. 13, over the side walls of the control gate electrode CG, over the side walls of the memory gate electrode MG, over the side walls of the gate electrode GEH, over the side walls of the gate electrode GEL, over the side walls of the third capacitive electrode CE3, and over the side walls of the fourth capacitive electrode CE4, the sidewall spacers SW are formed (Step S17 in FIG. 5). At the same time, the sidewall spacers SW are formed also over the side walls of the second capacitive electrode CE2, though not shown.

First, over the entire main surface of the semiconductor substrate 1, an insulating film for the sidewall spacers SW is formed. The formed insulating film is etched back by, e.g., anisotropic etching. Thus, over the side walls of the control gate electrode CG, over the side walls of the memory gate electrode MG, over the side walls of the gate electrode GEH, over the side walls of the gate electrode GEL, over the side walls of the third capacitive electrode CE3, and over the side walls of the fourth capacitive electrode CE4, the insulating film is selectively left to form the sidewall spacers SW. Each of the sidewall spacers SW is made of an insulating film such as a silicon dioxide film, a silicon nitride film, or a laminated film thereof.

Next, as shown in FIG. 13, the $n^+$-type semiconductor regions 17 and the $p^+$-type semiconductor regions 16 are formed using an ion implantation method or the like (Step S18 in FIG. 5). In Step S18, an n-type impurity such as, e.g., arsenic (As) or phosphorus (P) is introduced into the p-type wells PW1 and PW2 and the n-type well NW2 using the control gate electrode CG, the memory gate electrode MG, the gate electrode GEL, the sidewall spacers SW over the side walls thereof, and the isolation film 2 as a mask to thus form the $n^+$-type semiconductor regions 17. On the other hand, e.g., boron (B) is introduced as a p-type impurity into the n-type well NW1 of the semiconductor substrate 1 using the gate electrode GEH, the sidewall spacers SW formed over the side walls thereof, and the isolation film 2 as a mask to thus form the $p^+$-type semiconductor regions 16.

At this time, in the memory cell region 1A, the $n^+$-type semiconductor regions 17 are formed by self-alignment with the sidewall spacers SW over the respective side walls of the control gate electrode CG and the memory gate electrode MG. Also, in the peripheral circuit region 1C, the $n^+$-type semiconductor regions 17 are formed by self-alignment with the sidewall spacers SW over the both side walls of the gate electrode GEL. Also, in the peripheral circuit region 1B, the $p^+$-type semiconductor regions 16 are formed by self-alignment with the sidewall spacers SW over the both side walls of the gate electrode GEH. Also, in the peripheral circuit region 1D, the $n^+$-type semiconductor regions 17 are formed in the n-type well NW2 by self-alignment with the isolation film 2. Since the $n^+$-type semiconductor regions 17 are formed deeper than the $n^-$-type semiconductor regions 14, in FIG. 13, only the $n^+$-type semiconductor regions 17 are shown.

Thus, as shown in FIG. 2, in the memory cell region 1A, the memory cell MC including the control transistor CT and the memory transistor MT is formed. That is, the control gate electrode CG, the gate insulating film GIt, the memory gate electrode MG, and the gate insulating film GIm form the memory cell MC as the nonvolatile memory.

Also, as shown in FIG. 2, in the peripheral circuit region 1B, the high-breakdown-voltage MISFET QH is formed and, in the peripheral circuit region 1C, the low-breakdown-voltage MISFET QL is formed. That is, the gate electrode GEH and the gate insulating film GIH form the high-breakdown-voltage MISFET QH, while the gate electrode GEL and the gat insulating film GIL form the low-breakdown-voltage MISFET QL. Over the peripheral circuit region 1D, the first, second, and third capacitors are formed. The first capacitor includes the first capacitive electrode CE1, the first capacitive insulating film CZ1, and the second capacitive electrode CE2. The second capacitor includes the second capacitive electrode CE2, the second capacitive insulating film CZ2, and the third capacitive electrode CE3. The third capacitor includes the third capacitive electrode CE3, the third capacitive insulating film CZ3, and the fourth capacitive electrode CE4. The first, second, and third capacitors are positioned in stacked relation to form the stacked capacitive element CS.

Next, as shown in FIG. 2, the metal silicide layers 18 and the interlayer insulating film 19 are formed (Step S19 in FIG. 5).

In Step S19, first, as shown in FIG. 2, the metal silicide layers 18 are formed. By performing a known salicide process, as shown in FIG. 2, the respective metal silicide layers 18 are formed over the $n^+$-type semiconductor regions 17 and the $p^+$-type semiconductor regions 16.

The metal silicide layers 18 are formed also over the respective upper surfaces of the control gate electrode CG, the memory gate electrode MG, the gate electrode GEH, the gate electrode GEL, the third capacitive electrode CE3, and the fourth capacitive electrode CE4. The metal silicide layer 18 is formed also over the upper surface of the second capacitive electrode CE2, though not shown. The metal silicide layers 18 can be, e.g., cobalt silicide layers, nickel silicide layers, or platinum-added nickel silicide layers.

In Step S19, next, as shown in FIG. 2, the interlayer insulating film 19 is formed. The interlayer insulating film 19 is formed so as to cover the control gate electrode CG, the gate insulating film GIm, the memory gate electrode MG, the gate electrodes GEH and GEL, the second capacitive electrode CE2, the third capacitive electrode CE3, the fourth capacitive electrode CE4, and the sidewall spacers SW. The interlayer insulating film 19 is made of a single-layer silicon dioxide film, a laminated film including a silicon nitride film and a silicon dioxide film, or the like. After the interlayer insulating film 19 is formed by, e.g., a CVD method, the upper surface of the interlayer insulating film 19 is planarized by, e.g., a CMP (Chemical Mechanical Polishing) method.

Next, as shown in FIG. 2, the plug electrodes 20 are formed to extend through the interlayer insulating film 19 (Step S20 in FIG. 5). First, using a resist film (not shown) formed over the interlayer insulating film 19 using photolithography as an etching mask, the interlayer insulating film 19 is dry-etched to be formed with contact holes. Next, after a conductor film is formed in the contact holes, the conductor film over the interlayer insulating film 19 is removed therefrom by a CMP method to form the plug electrodes 20 in the contact holes.

The contact holes and the plug electrodes 20 embedded therein are formed over the $n^+$-type semiconductor regions 17 and over the $p^+$-type semiconductor regions 16. The plug electrodes 20 are formed also over the third capacitive electrode CD3 and over the fourth capacitive electrode CE4. As shown in FIG. 3A, the plug electrode 20 is formed also over the second capacitive electrode CE2.

Next, in Step S21 in FIG. 5, as shown in FIG. 2, the plurality of metal wires 21 are formed over the interlayer insulating film 9.

<Main Characteristic Features and Effects of Embodiment 1>

The stacked capacitive element CS has a structure in which the second capacitive electrode CE2 is stacked over the first capacitive electrode CE1 made of the n-type well NW2 (semiconductor region) via the first capacitive insulating film CZ1, the third capacitive electrode CE3 is stacked over the second capacitive electrode CE2 via the second capacitive insulating film CZ2, and the fourth capacitive electrode CE4 is stacked over the third capacitive electrode CE3 via the third capacitive insulating film CZ3. That is, the first, second, third, and fourth capacitive electrodes CE1, CE2, CE3, and CE4 have regions overlapping each other in plan view. Each of the electrodes overlaps the active region AR41 in plan view.

The first capacitive electrode CE1, the first capacitive insulating film CZ1, and the second capacitive electrode CE2 are included in the first capacitor. The second capacitive electrode CE2, the second capacitive insulating film CZ2, and the third capacitive electrode CE3 are included in the second capacitor. The third capacitive electrode CE3, the third capacitive insulating film CZ3, and the fourth capacitive electrode CE4 are included in the third capacitor. The stacked capacitive element CS includes the first, second, and third capacitors which are coupled in parallel to each other.

Thus, the staked capacitive element CS has a configuration in which the plurality of capacitors including the plurality of electrodes overlapping each other are coupled in parallel to each other. This can improve a capacitance per unit area and form the small-size large-capacitance capacitive element.

Since the capacitive electrodes and the capacitive insulating films of the stacked capacitive element CS are formed using the semiconductor regions, the conductor films, and the insulating films which are included in the memory cell MC and the MISFETs (both of the high-breakdown-voltage MISFET and the low-breakdown-voltage MISFET), the semiconductor device having the large-capacitance stacked capacitive element CS can be provided without increasing the steps in the manufacturing process of the semiconductor device.

The second capacitive insulating film CZ2 is formed using the insulating film 7 including the silicon nitride film. This can increase the capacitance value of the second capacitor. The capacitive insulating film CZ3 also includes the silicon nitride film. This can increase the capacitance value of the third capacitor.

The second capacitive insulating film CZ2 is formed using the insulating film 7 including the silicon dioxide film and the silicon nitride film. This allows the stacked capacitive element CS with a reduced leakage current to be provided. The capacitive insulating film CZ3 also includes the silicon dioxide film and the silicon nitride film and therefore achieves the same effect.

Embodiment 2

Embodiment 2 is a modification of Embodiment 1. In Embodiment 2, portions common to those in Embodiment 1 are designated by the same reference numerals. In Embodiment 2, in the grooves formed in the main surface of a semiconductor substrate, parts of first and second capacitive electrodes are formed. The structures of the memory cell MC, the MISFET QH, and the MISFET QL and the manufacturing methods thereof are the same as in Embodiment 1. Accordingly, a description will be given herein of the structure of the stacked capacitive element formed in the peripheral circuit region 1D and the manufacturing method thereof.

<Structure of Semiconductor Device>

Figure 15A:
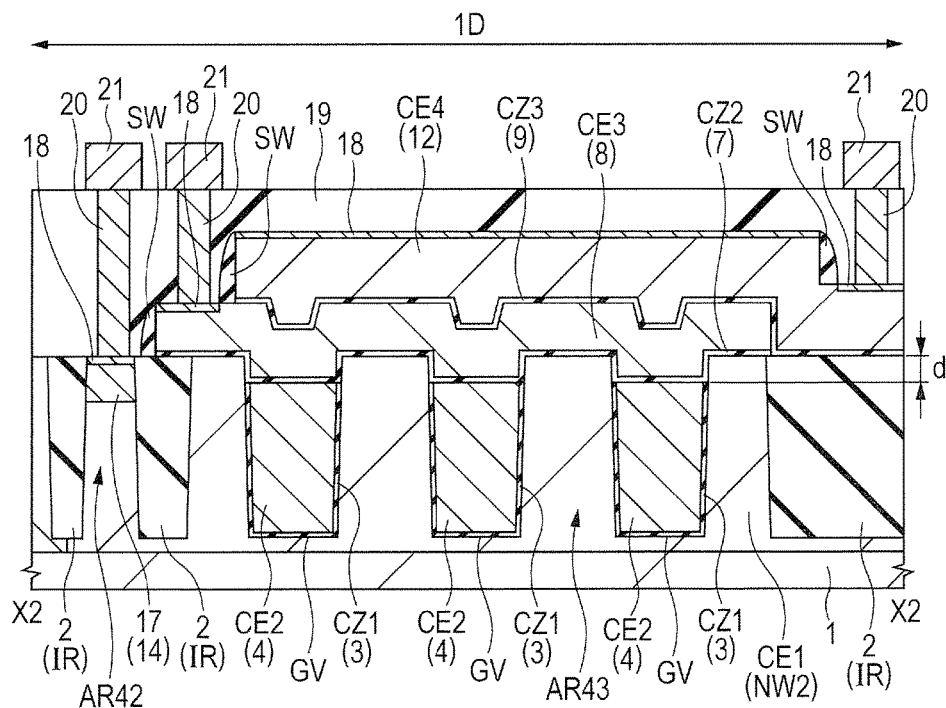
FIG. 15A is a main-portion cross-sectional view of the stacked capacitive element along the line X2-X2 in FIG. 14A
Figure 15B:
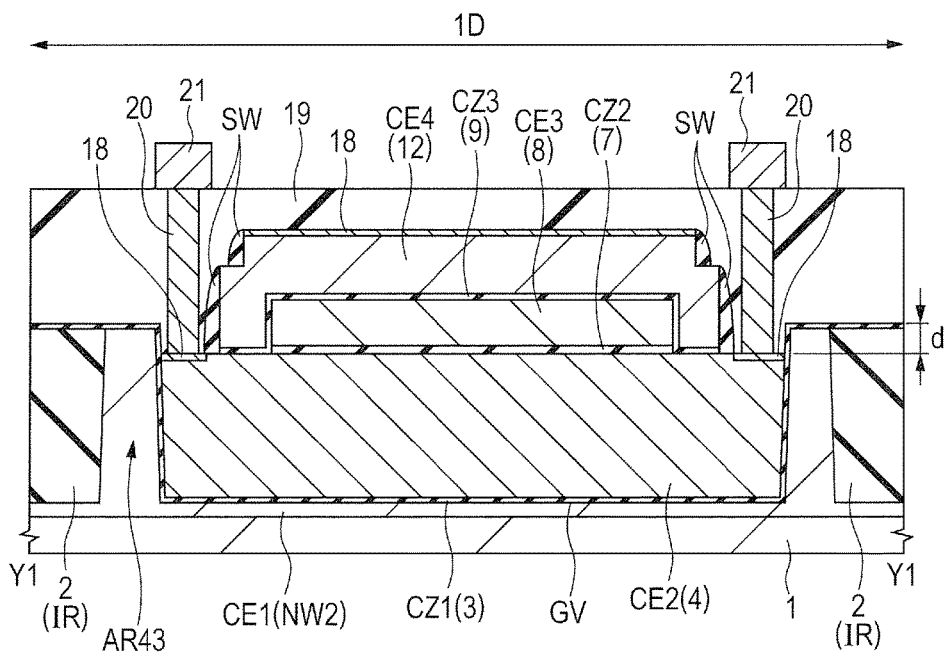
FIG. 15B is a main-portion cross-sectional view of the stacked capacitive element along the line Y1-Y1 in FIG. 14A.

FIG. 14A is a main-portion plan view of the stacked capacitive element. FIG. 14B is an illustrative view showing an example of the circuit configuration of the stacked capacitive element. FIG. 15A is a main-portion cross-sectional view along the line X2-X2 in FIG. 14A. FIG. 15B is a main-portion cross-sectional view along the line Y1-Y1 in FIG. 14A.

As shown in FIG. 14A, the stacked capacitive element CS has a structure in which a rectangular first capacitive electrode CE1 having longer sides in a lateral direction, a rectangular second capacitive electrode CE2 having longer sides in a vertical direction, a rectangular third capacitive electrode CE3 having longer sides in the lateral direction, and a rectangular fourth capacitive electrode CE4 having longer sides in the lateral direction are stacked. At the center portion of the first capacitive electrode CE1, an active region AR43 is located. The active region AR42 is located apart from the active region AR43. As described above, the active region AR42 is for supplying the intended potential to the n-type well NW2 included in the first capacitive electrode CE1. The locations of the active regions AR43 and AR42 are not limited to the foregoing. The shapes of the first, second, third, and fourth capacitive electrodes CE1, CE2, CE3, and CE4 are also not limited to rectangles.

In the X- and Y-directions at the paper sheet with FIG. 14A, the active region AR43 is located so as to completely cover the second capacitive electrode CE2. Within the active region AR43, an annular groove GV having an intended width is formed. The annular groove GV includes two grooves GV extending in parallel to each other in the X-direction and two grooves GV extending in parallel to each other in the Y-axis direction, which are coupled to each other. Between the two grooves GV extending in the Y-direction, another groove GV is formed to couple the two grooves GV extending in the X-direction. In FIG. 14A, the outer shape of the groove GV is represented by the broken line.

The second capacitive electrode CE2 is formed only in the groove GV and in the region enclosed by the broken lines adjacent to each other in FIG. 14A. The third capacitive electrode CE3 is located over the second capacitive electrode CE2 to extend in the X-direction and cross the grooves GV extending in the Y-direction. The fourth capacitive electrode CE4 is located over the third capacitive electrode CE3 to extend in the X-direction and cross the grooves GV extending in the Y-direction. The fourth capacitive electrode CE4 is wider than the third capacitive electrode CE3 in the Y-direction to completely cover the third capacitive electrode CE3.

The second capacitive electrode CE2 has a protruding portion which does not overlap the third and fourth capacitive electrodes CE3 and CE4 in the Y-direction. The third capacitive electrode CE3 has a protruding portion which does not overlap the active region AR43 and the second fourth capacitive electrodes CE2 and CE4 in the X-direction. The fourth capacitive electrode CE4 has a protruding portion which does not overlap the active region AR43 and the second and third capacitive electrodes CE2 and CE3 in the X-direction.

The circuit configuration shown in FIG. 14B is the same as that shown in FIG. 3B.

As shown in FIG. 15A or 15B, in the peripheral circuit region 1D, the semiconductor device has the active regions AR43 and AR42 and the isolation region IR. Under the active regions AR43 and AR42 and the isolation regions IR, the n-type well NW2 is formed continuously. In the active region AR43, the groove GV is formed to extend inward from the main surface of the semiconductor substrate 1. The groove GV is defined by the side walls and the bottom surface thereof. The n-type well NW2 is formed deeper than the groove GV so as to cover the side walls of the groove GV and surround the groove GV. The n-type well NW2 forms the first capacitive electrode CE1.

In the groove GV, the second capacitive electrode CE2 made of the conductor film 4 is formed via the first capacitive insulating film CZ1 made of the insulating film 3. Over the side walls and the bottom surface of the groove GV, the first capacitive insulating film CZ1 is formed. In the groove GV, the second capacitive electrode CE2 is embedded up to a predetermined depth. However, the upper end (upper surface) of the second capacitive electrode CE2 is lower in level than the main surface of the semiconductor substrate 1 by a distance d. The first capacitor including the first capacitive electrode CE1, the first capacitive insulating film CZ1, and the second capacitive electrode CE2 is formed along the bottom surface and the side wall of the groove GV. Accordingly, the capacitance value of the first capacitor can be increased to be larger than in Embodiment 1.

In the groove GV, over the second capacitive electrode CE2, the third capacitive electrode CE3 made of the conductor film 8 extends via the second capacitive insulating film CZ2 made of the insulating film 7. In the region where the second and third capacitive electrodes CE2 and CE3 face each other, the second capacitor including the second capacitive electrode CE2, the second capacitive insulating film CZ2, and the third capacitive electrode CE3 is formed.

The film thickness of the conductor film 8 is set smaller than that of, e.g., the conductor film 4 or 12. Accordingly, as shown in FIG. 15A, in the upper surface of the third capacitive electrode CE3, recessed portions are formed at positions corresponding to the grooves GV. Over the third capacitive electrode CE3, the third capacitive insulating film CZ3 made of the insulating film 9 and the fourth capacitive electrode CE4 made of the conductor film 12 are formed. In the region where the third and fourth capacitive electrodes CE3 and CE4 face each other, the third capacitor including the third capacitive electrode CE3, the third capacitive insulating film CZ3, and the fourth capacitive electrode CE4 is formed. In the recessed portions in the upper surface of the third capacitive electrode CE3 also, the fourth capacitive electrode CE4 is formed via the third capacitive insulating film CZ3. By also using the side walls of the recessed portions, the capacitance value of the third capacitor is increased. As shown in FIGS. 15A and 15B, the fourth capacitive electrode CE4 also covers the side surface of the third capacitive electrode CE3 via the third capacitive insulating film CZ3.

As shown in FIG. 15B, the second capacitive electrode CE2 formed in the grooves GV is coupled to the metal electrode 21 via the plug electrode 20 embedded in the opening formed in the interlayer insulating film 19. Since the second capacitive electrode CE2 has an upper end (upper surface) lower in level than the main surface of the semiconductor substrate 1, the depth of the opening in which the plug electrode 20 coupled to the second capacitive electrode CE2 is formed can be set shallower than the depth of the opening in which the plug electrode 20 coupled to the first capacitive electrode CE1 is formed in Embodiment 1 (FIG. 2). Since the depth of the opening can be set shallower, the processing accuracy of the opening is improved to also improve the manufacturing yield. To be more specific, in the case of Embodiment 2, the depth of the opening is approximately the sum of the film thickness of the third capacitive electrode CE3, the film thickness of the fourth capacitive electrode CE4, and the film thickness of the interlayer insulating film 19 over the fourth capacitive electrode CE4. By contrast, in Embodiment 1, the depth of the opening is approximately the sum of the film thickness of the second capacitive electrode CE2, the film thickness of the third capacitive electrode CE3, the film thickness of the fourth capacitive electrode CE4, and the film thickness of the interlayer insulating film 19 over the fourth capacitive electrode CE4. That is, in Embodiment 2, the depth of the opening can be set shallower than that in Embodiment 1 by a dimension equivalent to the film thickness of the second capacitive electrode CE2. Note that the deepest opening in Embodiment 1 is the opening in which the plug electrode 20 coupled to the first capacitive electrode CE1 is formed (the same applies also to an opening for the source or drain region of the memory cell MC or the MISFET QH or QL). The deepest opening in Embodiment 2 is the opening in which the plug electrode 20 coupled to the first capacitive electrode CE1 is formed.

<Method of Manufacturing Semiconductor Device>

Figure 16A:
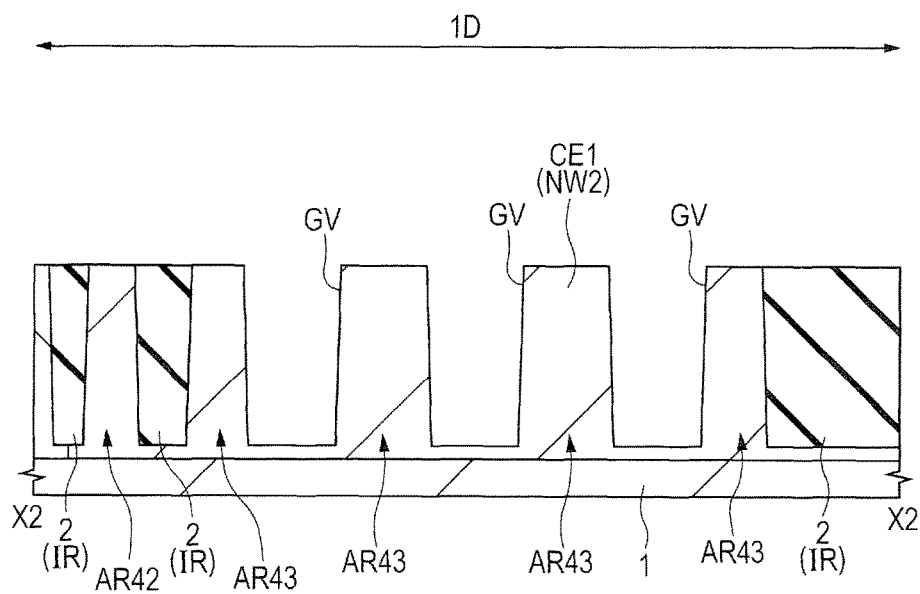
FIG. 16A is a main-portion cross-sectional view of the stacked capacitive element along the line X2-X2 in FIG. 14A during the manufacturing process thereof and FIG. 16B is a main-portion cross-sectional view of the stacked capacitive element along the line Y1-Y1 in FIG. 14A during the manufacturing process thereof.
Figure 16B:
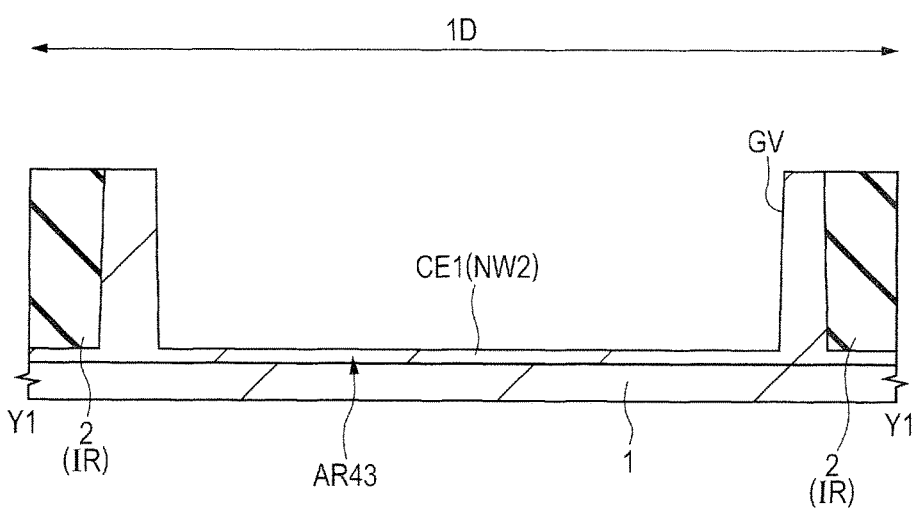
Figure 17A:
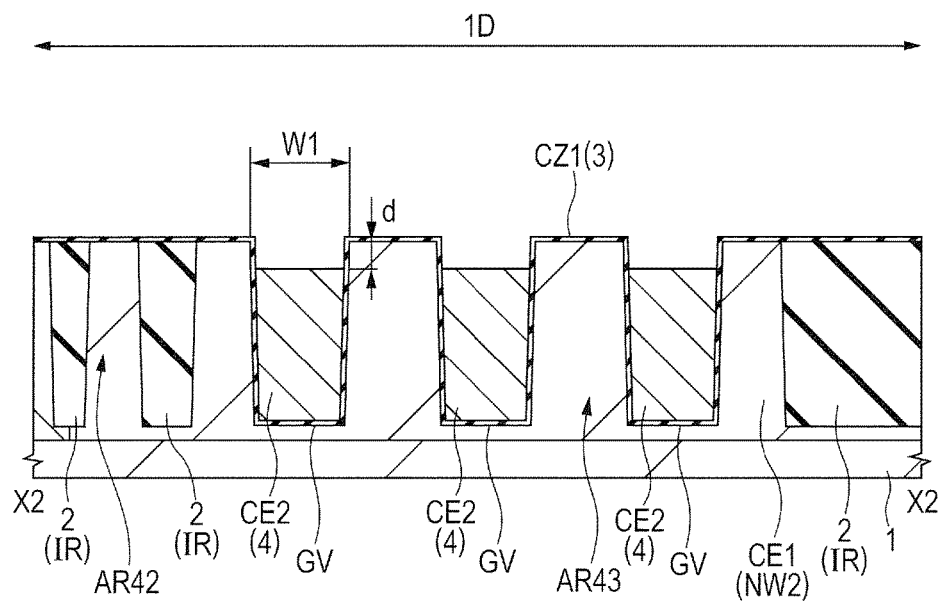
FIG. 17A is a main-portion cross-sectional view of the stacked capacitive element along the line X2-X2 in FIG. 14A during the manufacturing process thereof and FIG. 17B is a main-portion cross-sectional view of the stacked capacitive element along the line Y1-Y1 in FIG. 14A during the manufacturing process thereof.
Figure 17B:
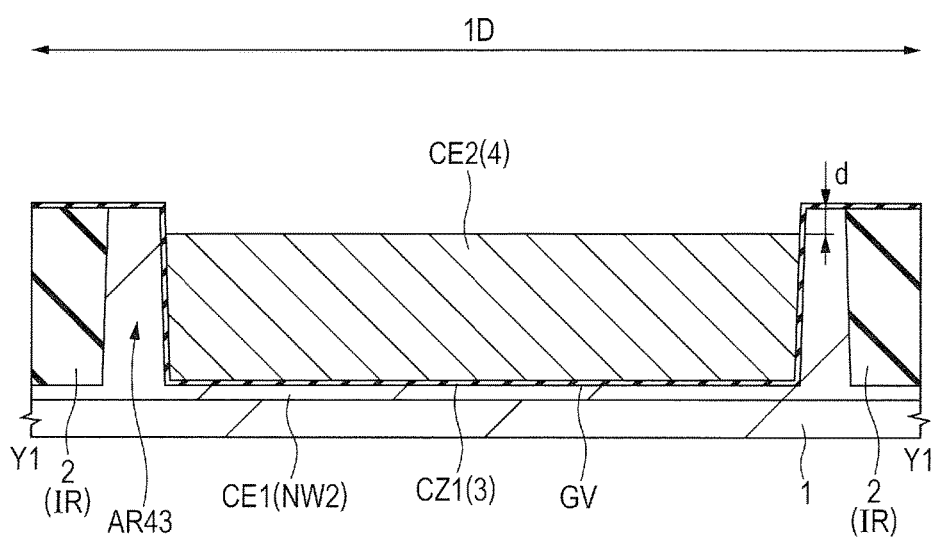
Figure 18A:
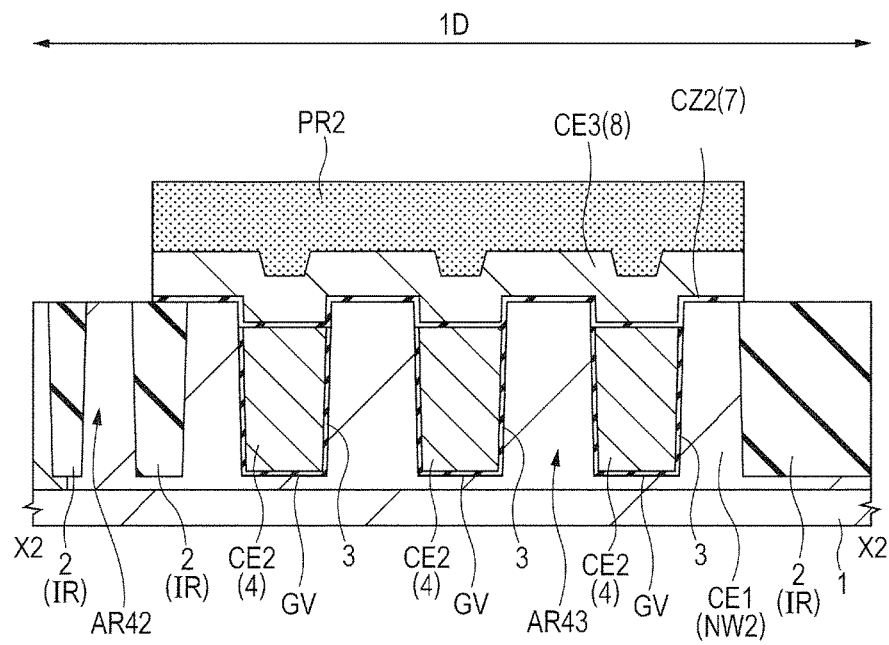
FIG. 18A is a main-portion cross-sectional view of the stacked capacitive element along the line X2-X2 in FIG. 14A during the manufacturing process thereof and FIG. 18B is a main-portion cross-sectional view of the stacked capacitive element along the line Y1-Y1 in FIG. 14A during the manufacturing process thereof.
Figure 18B:
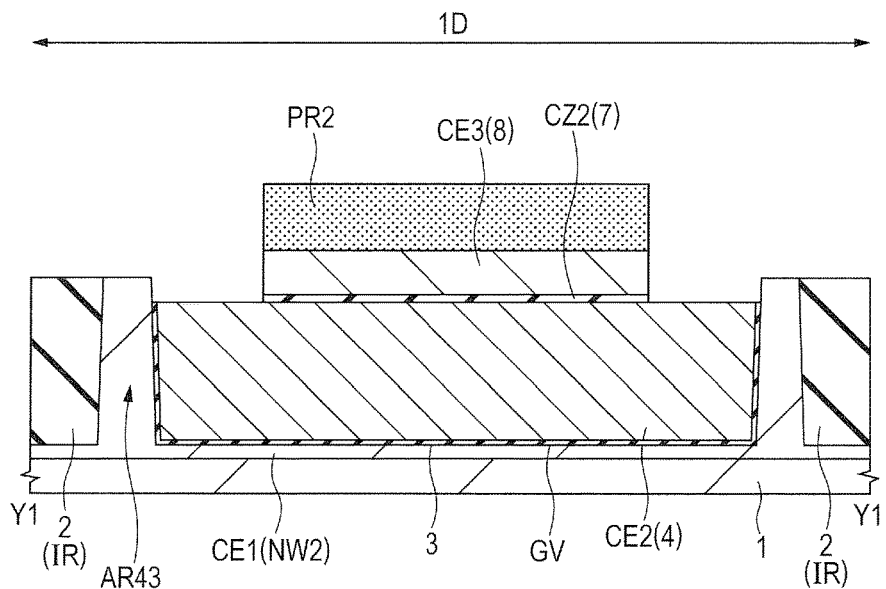

Next, using FIGS. 16 to 19, a method of manufacturing the semiconductor device in Embodiment 2 will be described. As described above, in FIGS. 16 and 19, a description will be given only of the peripheral circuit region 1D. FIGS. 16A, 17A, 18A, and 19A are main-portion cross-sectional views of the semiconductor device in Embodiment 2 during the manufacturing process thereof, which correspond to FIG. 15A. FIGS. 16B, 17B, and 18B are main-portion cross-sectional views of the semiconductor device in Embodiment 2, which correspond to FIG. 15B.

A process flow showing a part of the manufacturing process of the semiconductor device in Embodiment 2 is the same as in FIGS. 4 and 5. Note that, in Embodiment 2, Step S22 of "forming the grooves GV" is additionally provided between Steps S2 and S3.

In the same manner as in Embodiment 1, Steps S1 and S2 are performed. However, in Embodiment 2, a capacitive element formation trench is also formed in the peripheral circuit region 1D in addition to the isolation trench. The two-dimensional pattern of the capacitive element formation trench is shown by the broken line in FIG. 14A. That is, in Step S2, the capacitive element formation trench is also formed at the same time as the isolation trench is formed and, in the isolation trench and the capacitive element formation trench, an insulating film made of a silicon dioxide film is embedded. Then, as shown in FIGS. 16A and 16B, the insulating film in the capacitive element formation trench is selectively removed therefrom to form the grooves GV. At this time, the isolation film in the isolation trench is not removed but is left.

Next, as shown in FIGS. 16A and 16B, in the peripheral circuit region 1D, the n-type well NW2 is formed in the active regions AR43 and AR42. This process step corresponds to Step S3 in FIG. 4. The n-type well NW2 is formed in the active regions AR43 and AR42 and is also formed under the isolation film 2. The n-type well NW2 is integrally formed in the active regions AR43 and AR42. In addition, the n-type well NW2 is formed so as to surround the side wall and the bottom surface of the groove GV. The n-type well NW2 serves as the first capacitive electrode CE1.

Next, after Step S4 in FIG. 4 is performed, Step S5 is performed. As shown in FIGS. 17A and 17B, over the bottom surface and the side wall of the groove GV and the top surface of the semiconductor substrate 1, the first capacitive insulating film CZ1 made of the insulating film 3 is formed. Next, over the first capacitive insulating film CZ1, the conductor film 4 is formed, and then Step S6 is performed. In the peripheral circuit region 1D, the conductor film 4 is left only in the groove GV to form the second capacitive electrode CE2.

A width W1 of the groove GV is set smaller than double the film thickness of the conductor film 4. As a result, when the conductor film 4 made of a polysilicon film is deposited, the groove GV is completely filled therewith. The second capacitive electrode CE2 is formed by anisotropic dry etching in Step S6 such that the upper end (upper surface) thereof is lower in level than the main surface of the semiconductor substrate by a distance d (>0). That is, the conductor film 4 remains only in the groove GV. In Embodiment 1, in Step S6, the resist film PR1 is provided over the peripheral circuit region 1D. By contrast, in Embodiment 2, the peripheral circuit region 1D is not covered with the resist film PR1 so that the conductor film 4 is exposed.

Next, Steps S7 and S8 are performed. In the same manner as in Embodiment 1, over the second capacitive electrode CE2, the insulating film 7 and the conductor film 8 are deposited. Then, as shown in FIGS. 18A and 18B, over the conductor film 8, the resist film PR2 having a pattern covering the portion of the conductor film 8 where the third capacitive electrode CE3 is to be formed and exposing the other region thereof is formed. Using the resist film PR2 as a mask, the conductor film 8 is patterned to form the third capacitive electrode CE3. Then, the insulating film 7 is etched into the same pattern as that of the third capacitive electrode CE3 to form the second capacitive insulating film CZ2. In the groove GV, the upper end of the second capacitive electrode CE2 is lower in level than the main surface of the semiconductor substrate 1. Consequently, over the groove GV, in the top surface of the third capacitive electrode CE3, the recessed portions are formed.

Next, Step S9 is performed. Then, in the same manner as in Embodiment 1, Step S10 is performed to form the insulating film 9 over the semiconductor substrate 1. Over the peripheral circuit region 1D, the insulating film 9 is formed so as to cover the main surface of the semiconductor substrate 1 and the third capacitive electrode CE3.

Figure 19A:
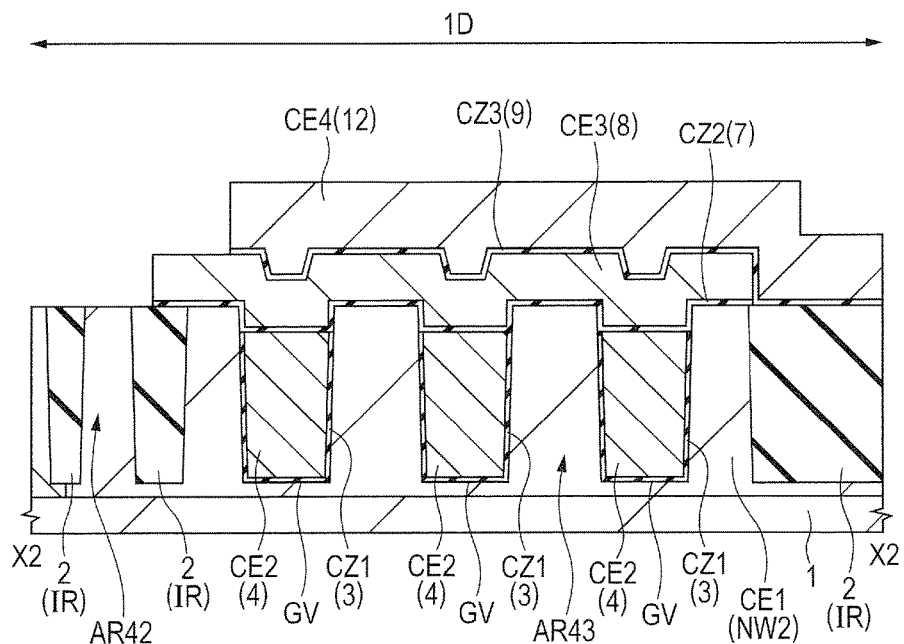
FIG. 19A is a main-portion cross-sectional view of the stacked capacitive element along the line X2-X2 in FIG. 14A during the manufacturing process thereof and FIG. 19B is a main-portion cross-sectional view of the stacked capacitive element along the line Y1-Y1 in FIG. 14A during the manufacturing process thereof.
Figure 19B:
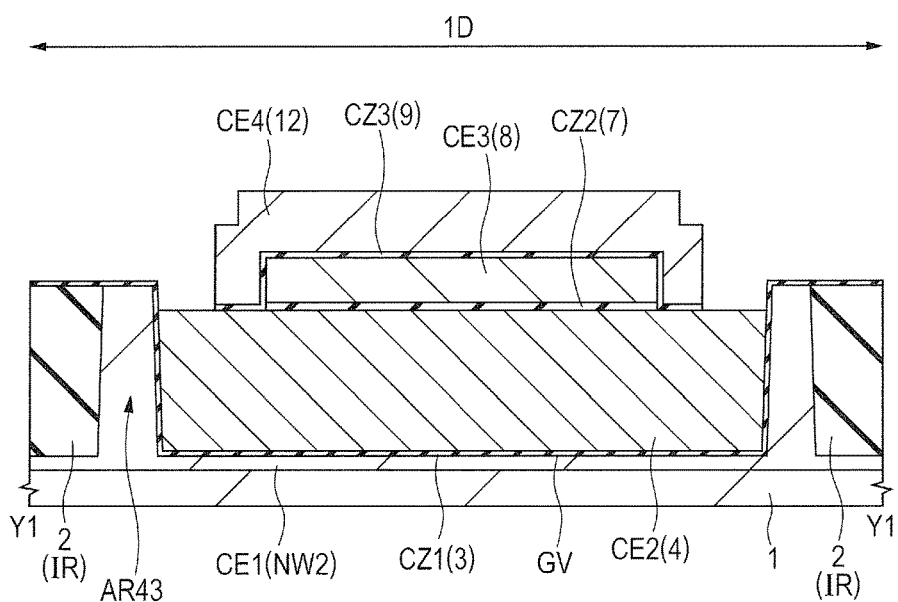

Next, after Steps S10 to S12 are performed, Step S13 is performed. In the step of forming the conductor film 12 in Step S13, in the same manner as in Embodiment 1, the conductor film 12 is formed over the insulating film 9 over the peripheral circuit region 1D. Next, as shown in FIGS. 19A and 19B, in the same manner as in Embodiment 1, Step S14 is performed to form the fourth capacitive electrode CE4 and the third capacitive insulating film CZ3 over the peripheral circuit region 1D. Here, the third capacitive insulating film CZ3 and the fourth capacitive electrode CE4 are formed also in the recessed portions formed in the top surface of the third capacitive electrode CE3.

Next, in the same manner as in Embodiment 1, Steps S15 to S21 are performed to complete the semiconductor device in Embodiment 2 shown in FIGS. 15A and 15B.

<Main Characteristic Features and Effects of Embodiment 2>

According to Embodiment 2, the second capacitive electrode CE2 of the stacked capacitive element CS is formed along the bottom surfaces and the side walls of the grooves GV. This can increase the capacitance value of the first capacitor.

In addition, the top surface of the third capacitive electrode CE3 has the recessed portions and the third capacitive insulating film CZ3 and the fourth capacitive electrode CE4 are formed in the recessed portions. This can increase the capacitance value of the third capacitor.

Since the second capacitor electrode CE2 is formed in the grooves GV and the plug electrode 20 coupled to the second capacitive electrode CE2 is formed in the grooves GV, the opening in the interlayer insulating film 19 in which the plug electrode 20 is provided can be made shallow. This can improve the processing accuracy of the opening to also improve the manufacturing yield.

Embodiment 3

A semiconductor device in Embodiment 3 is a modification of Embodiment 2. The portions of the semiconductor device in Embodiment 3 common to those of the semiconductor device in Embodiment 2 are designated by the same reference numerals. In a stacked capacitive element in Embodiment 3, first, second, and third capacitive electrodes are formed along the side walls of the grooves formed in the main surface of a semiconductor substrate. The structures of the memory cell MC and the MISFETs QH and QL and the manufacturing methods thereof are the same as in Embodiment 2 (i.e., the same as in Embodiment 1). Accordingly, a description will be given herein of the structure of the stacked capacitive element formed in the peripheral circuit region 1D and the manufacturing method thereof.

<Structure of Semiconductor Device>

Figure 21A:
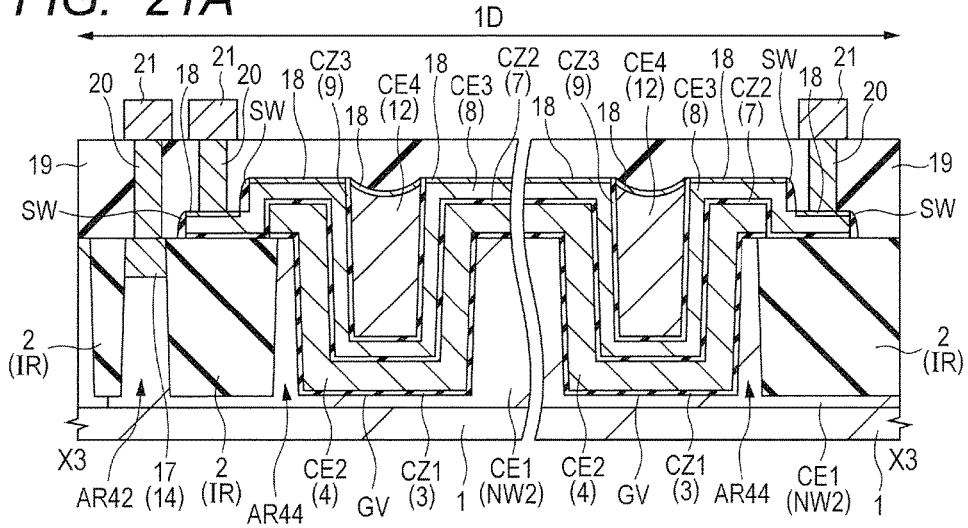
FIG. 21A is a main-portion cross-sectional view of the stacked capacitive element along the line X3-X3 in FIG. 20A.
Figure 21B:
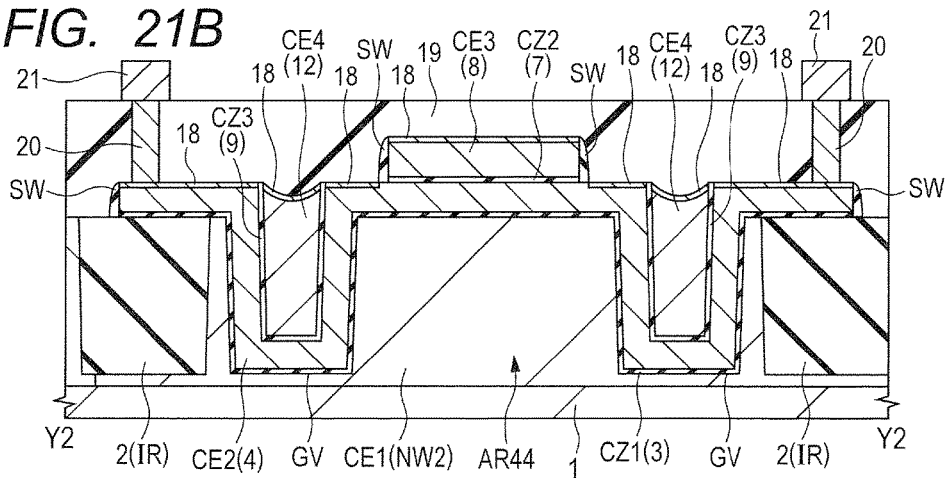
FIG. 21B is a main-portion cross-sectional view of the stacked capacitive element along the line Y2-Y2 in FIG. 20A.
Figure 21C:
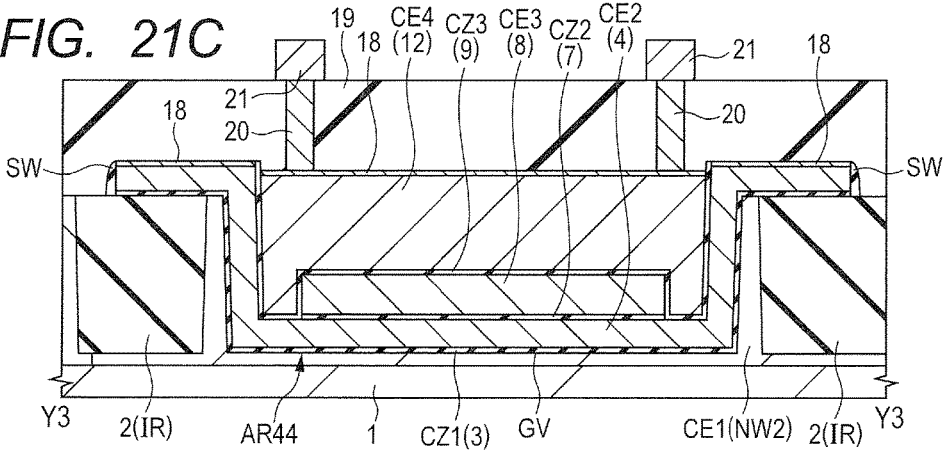
FIG. 21C is a main-portion cross-sectional view of the stacked capacitive element along the line Y3-Y3 in FIG. 20A.

FIG. 20A is a main-portion plan view of the stacked capacitive element. FIG. 20B is an illustrative view showing an example of a circuit configuration of the stacked capacitive element. FIG. 21A is a main-portion cross-sectional view of the stacked capacitive element along the line X3-X3 in FIG. 20A. FIG. 21B is a main-portion cross-sectional view of the stacked capacitive element along the line Y2-Y2 in FIG. 20A. FIG. 21C is a main-portion cross-sectional view of the stacked capacitive element along the line Y3-Y3 in FIG. 20C.

As shown in FIG. 20A, the stacked capacitive element CS has a structure in which the rectangular first capacitive electrode CE1 having longer sides in a lateral direction, the rectangular second capacitive electrode CE2 having longer sides in a vertical direction, the rectangular third capacitive electrode CE3 having longer sides in the lateral direction, and the rectangular fourth capacitive electrode CE4 having longer sides in the lateral direction are stacked. At the center portion of the first capacitive electrode CE1, an active region AR44 is located. The active region AR42 is located apart from the active region AR44. As described above, the active region AR42 is for supplying the intended potential to the n-type well NW2 included in the first capacitive electrode CE1. The locations of the active regions AR44 and AR42 are not limited to the foregoing. The shapes of the first, second, third, and fourth capacitive electrodes CE1, CE2, CE3, and CE4 are also not limited to rectangles.

In the X- and Y-directions at the paper sheet with FIG. 20A, the second capacitive electrode CE2 is located so as to completely cover the active region AR44. In the active region AR44, the annular groove GV having the intended width is formed. The annular groove GV includes two grooves extending in parallel to each other in the X-direction and two grooves extending in parallel to each other in the Y-axis direction, which are coupled to each other. Between the two grooves GV extending in the Y-direction, another groove GV is formed to couple the two grooves GV extending in the X-direction. In FIG. 20A, the outer shape of the groove GV is represented by the broken line.

The second capacitive electrode CE2 is formed along the bottom surface and the side wall of the groove GV to extend to over the main surface of the semiconductor substrate 1. The third capacitive electrode CE3 is located over the second capacitive electrode CE2 to extend in the X-direction and cross the groove GV extending in the Y-direction. The third capacitive electrode CE3 is also formed along the bottom surface and the side wall of the groove GV to extend to over the main surface of the semiconductor substrate 1. The fourth capacitive electrode CE4 is located over the third capacitive electrode CE3 and formed in the groove GV to have a reduced pattern of the groove GV.

The second capacitive electrode CE2 has a protruding portion which does not overlap the third and fourth capacitive electrodes CE3 and CE4 in the Y-direction. The third capacitive electrode CE3 has a protruding portion which does not overlap the active region AR44 and the second and fourth capacitive electrodes CE2 and CE4 in the X-direction. The fourth capacitive electrode CE4 has a protruding portion which does not overlap the third capacitive electrode CE3 in the Y-direction.

The circuit configuration shown in FIG. 20B is the same as in FIG. 3B.

As shown in FIG. 21A, 21B, or 21C, in the peripheral circuit region 1D, the semiconductor device has the active regions AR44 and AR42 and the isolation regions IR. Under the active regions AR44 and AR42 and the isolation regions IR, the n-type well NW2 is formed continuously. In the active region AR44, the groove GV is formed to extend inward from the main surface of the semiconductor substrate 1. The groove GV is defined by the side wall and the bottom surface thereof. The n-type well NW2 is formed deeper than the groove GV so as to cover the side wall of the trench GV and surround the groove GV. The n-type well NW2 is included in the first capacitive electrode CE1.

As shown in FIG. 21A, in the groove GV, the second capacitive electrode CE2 made of the conductor film 4 is formed via the first capacitive insulating film CZ1 made of the insulating film 3. The second capacitive electrode CE2 is formed along the side wall and the bottom surface of the groove GV. Between the second capacitive electrode CE2 and the semiconductor substrate 1, the first capacitive insulating film CZ1 is interposed. The first capacitor including the first capacitive electrode CE1, the first capacitive insulating film CZ1, and the second capacitive electrode CE2 is formed along the bottom surface and the side wall of the groove GV.

In the groove GV, the third capacitive electrode CE3 made of the conductor film 8 is formed via the second capacitive insulating film CZ2 made of the insulating film 7. The third capacitive electrode CE3 is formed along the side wall and the bottom surface of the groove GV. Between the third and second capacitive electrodes CE3 and CE2, the second capacitive insulating film CZ2 is interposed. The second capacitor including the second capacitive electrode CE2, the second capacitive insulating film CZ2, and the third capacitive electrode CE3 is formed along the bottom surface and the side wall of the groove GV.

Also, in the groove GV, the fourth capacitive electrode CE4 made of the conductor film 12 is formed via the third capacitive insulating film CZ3 made of the insulating film 9. The fourth capacitive electrode CE4 is formed along the side wall and the bottom surface of the groove GV. Between the fourth and third capacitive electrodes CE4 and CE3, the third capacitive insulating film CZ3 is interposed. The third capacitor including the third capacitive electrode CE3, the third capacitive insulating film CZ3, and the fourth capacitive electrode CE4 is formed along the bottom surface and the side wall of the groove GV.

By forming the first, second, and third capacitors using the side wall of the groove GV, the capacitance values of the first, second, and third capacitors can be increased. In Embodiment 3, the width of the groove GV in the X-direction is formed wider than that of the groove GV in Embodiment 2.

In FIGS. 21A, 21B, and 21C, over the side walls of the second, third, and fourth capacitive electrodes CE2, CE3, and CE4, the sidewall spacers SW are formed. Over the respective top surfaces (upper surfaces) of the second, third, and fourth capacitive electrodes CE2, CE3, and CE4 over the semiconductor region 17 and the semiconductor region 17, the metal silicide layers 18 are formed.

To allow the conductor films 4, 8, and 12 to be formed in the groove GV, the width of the groove GV shown in FIG. 21A is larger than double the sum of the respective film thicknesses of the conductor film 4 (second capacitive electrode CE2) and the conductor film 8 (third capacitive electrode CE3). Also, to allow the conductor film 12 (fourth capacitive electrode CE4) to be embedded in the groove GV after the formation of the conductor film 4 (second capacitive electrode CE2) and the conductor film 8 (third capacitive electrode CE3) in the groove GV, the width of the groove GV is set smaller than double the sum of the respective film thicknesses of the conductor film 4 (second capacitive electrode CE2), the conductor film 8 (third capacitive electrode CE3), and the conductor film 12 (fourth capacitive electrode CE4).

(Method of Manufacturing Semiconductor Device)

Figure 22A:
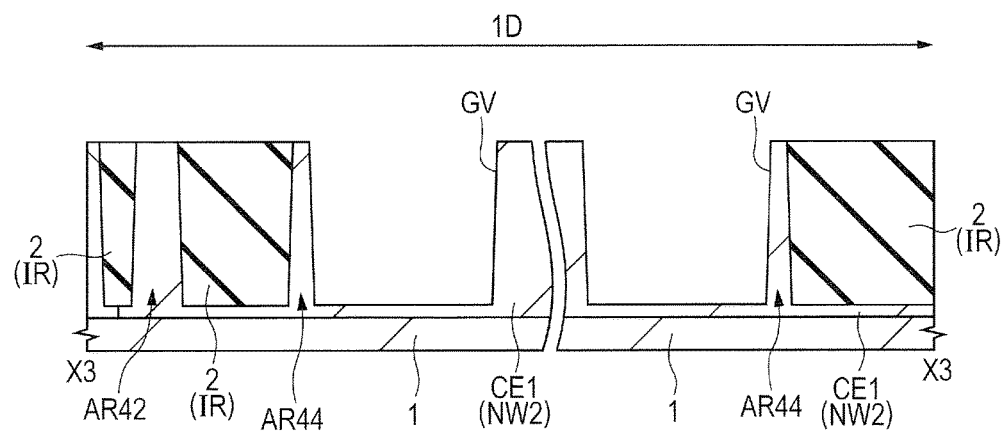
FIG. 22A is a main-portion cross-sectional view of the stacked capacitive element along the line X3-X3 in FIG. 20A during the manufacturing process thereof.
Figure 22B:
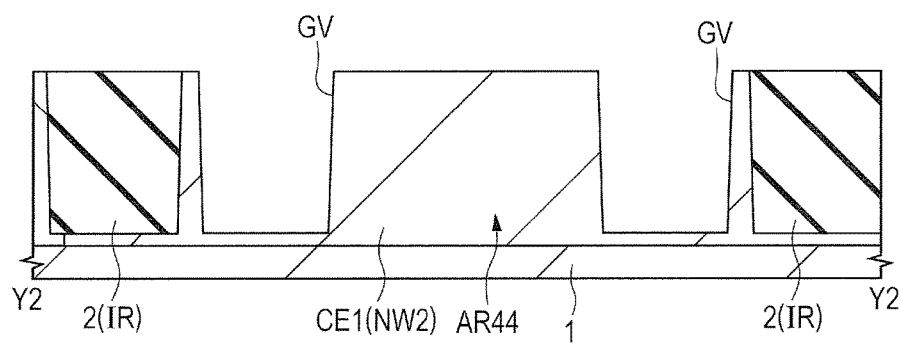
FIG. 22B is a main-portion cross-sectional view of the stacked capacitive element along the line Y2-Y2 in FIG. 20A during the manufacturing process thereof.
Figure 22C:
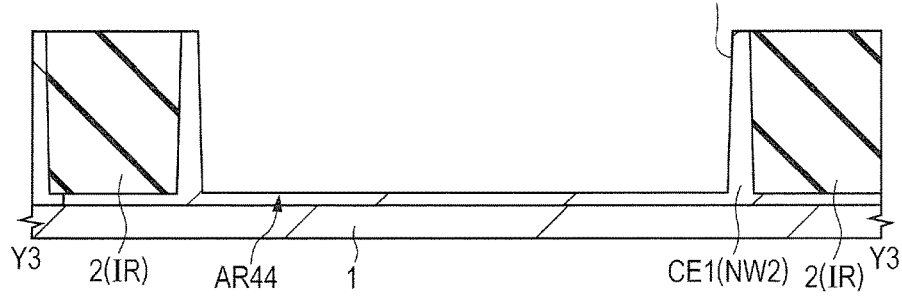
FIG. 22C is a main-portion cross-sectional view of the stacked capacitive element along the line Y3-Y3 in FIG. 20A during the manufacturing process thereof.
Figure 23A:
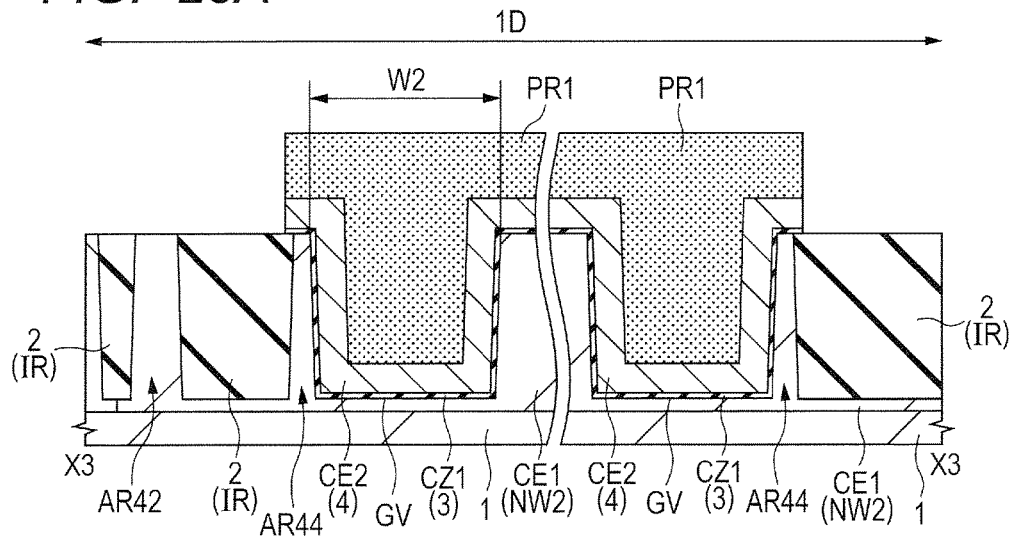
FIG. 23A is a main-portion cross-sectional view of the stacked capacitive element along the line X3-X3 in FIG. 20A during the manufacturing process thereof.
Figure 23B:
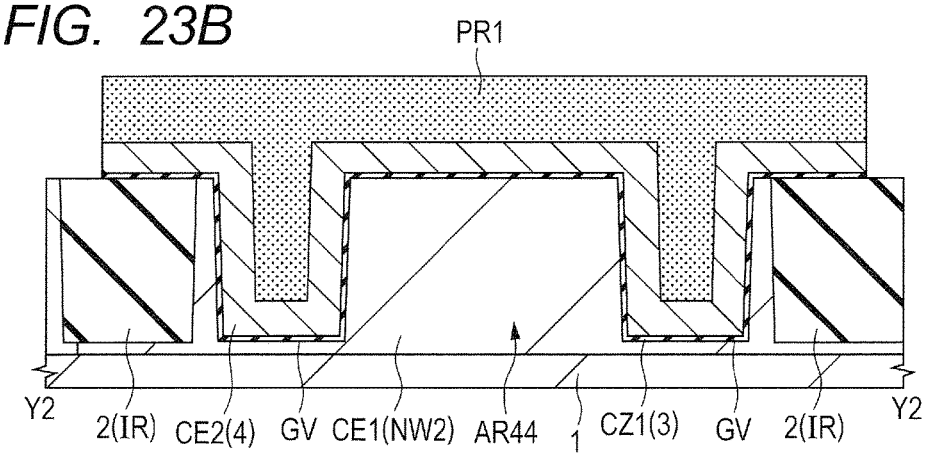
FIG. 23B is a main-portion cross-sectional view of the stacked capacitive element along the line Y2-Y2 in FIG. 20A during the manufacturing process thereof.
Figure 23C:
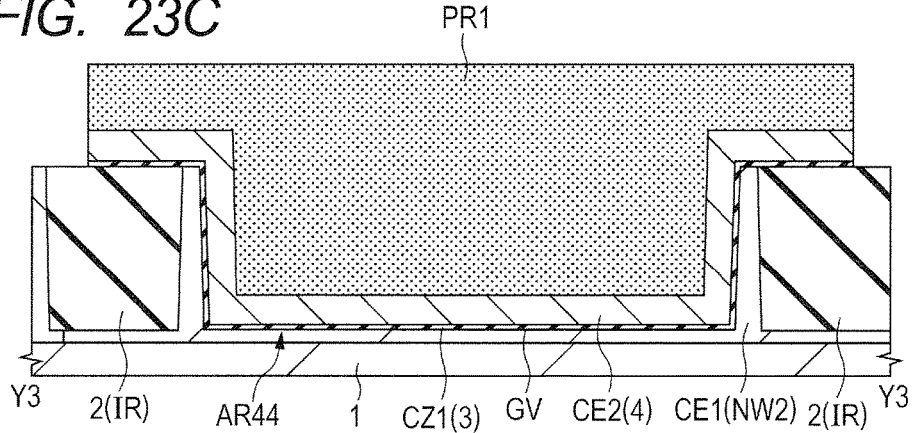
FIG. 23C is a main-portion cross-sectional view of the stacked capacitive element along the line Y3-Y3 in FIG. 20A during the manufacturing process thereof.
Figure 24A:
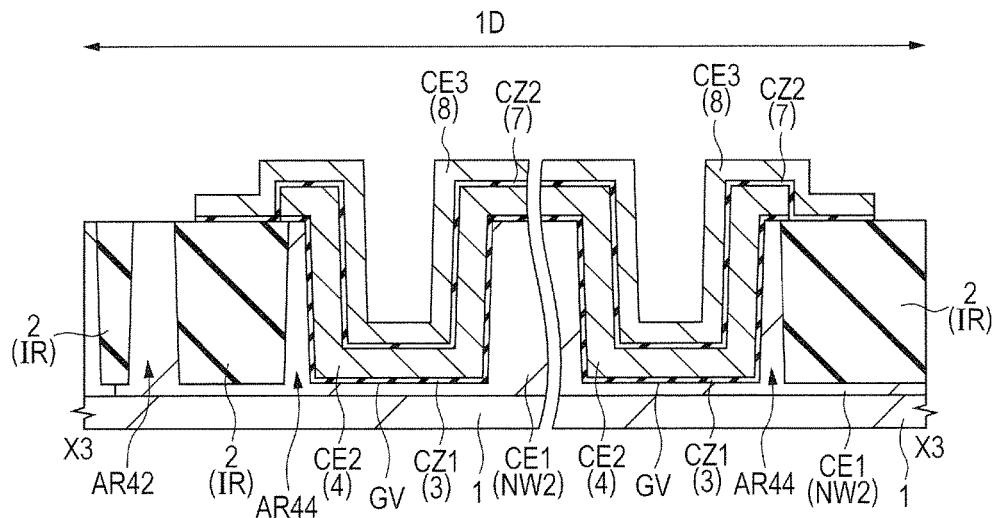
FIG. 24A is a main-portion cross-sectional view of the stacked capacitive element along the line X3-X3 in FIG. 20A during the manufacturing process thereof.
Figure 24B:
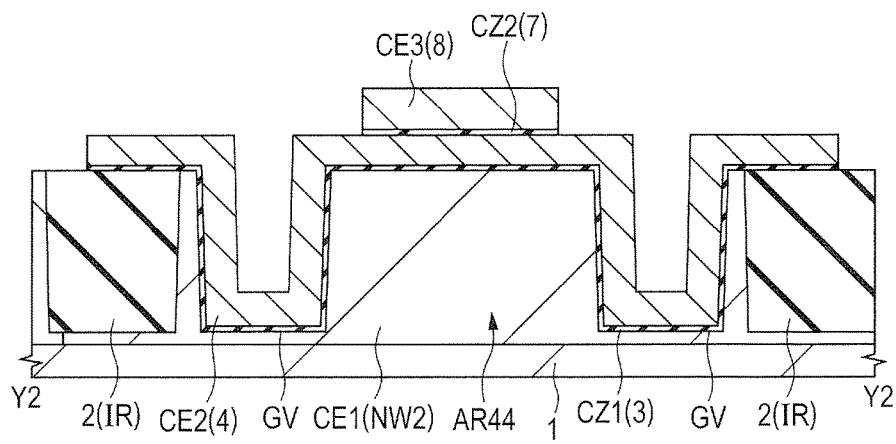
FIG. 24B is a main-portion cross-sectional view of the stacked capacitive element along the line Y2-Y2 in FIG. 20A during the manufacturing process thereof.
Figure 24C:
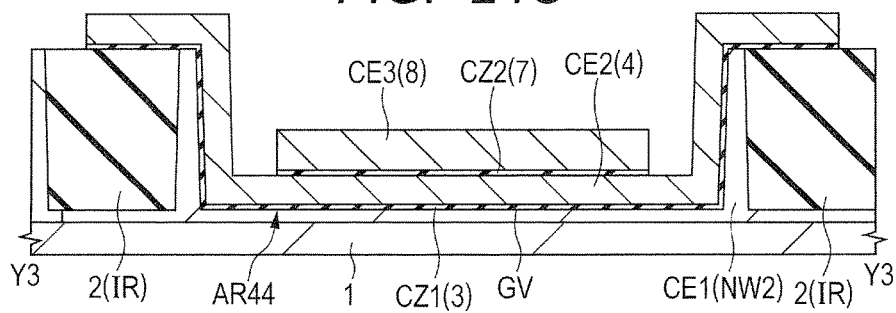
FIG. 24C is a main-portion cross-sectional view of the stacked capacitive element along the line Y3-Y3 in FIG. 20A during the manufacturing process thereof.

Next, using FIGS. 22 to 25, a method of manufacturing the stacked capacitive element as a part of the semiconductor device in Embodiment 3 will be described. As described above, in FIGS. 22 to 25, the description will be given only of the peripheral circuit region 1D. FIGS. 22A, 23A, 24A, and 25A are main-portion cross-sectional views of the stacked capacitive element in Embodiment 3 during the manufacturing process thereof, which correspond to FIG. 21A. FIGS. 22B, 23B, 24B, and 25B are main-portion cross-sectional views of the stacked capacitive element in Embodiment 3 during the manufacturing process thereof, which correspond to FIG. 21B. FIGS. 22C, 23C, 24C, and 24C are main-portion cross-sectional views of the stacked capacitive element in Embodiment 3, which correspond to FIG. 21C.

A process flow showing a part of the manufacturing process of the semiconductor device in Embodiment 3 is the same as in Embodiment 2.

In the same manner as in Embodiment 2, Steps S1 and S2 are performed. Note that, in the same manner as in Embodiment 2, in addition to the isolation trench, the capacitive element formation trench is also formed in the peripheral circuit region 1D. The two-dimensional pattern of the capacitive element formation trench is shown by the broken line in FIG. 20A. That is, the capacitive element formation trench is also formed at the same time as when the isolation trench is formed and, in the capacitive element formation trench also, an insulating film made of a silicon dioxide film is embedded. Then, as shown in FIGS. 22A, 22B, and 22C, the insulating film in the capacitive element formation trench is selectively removed therefrom to form the groove GV. At this time, the isolation film 2 in the isolation trench is not removed but is left.

Next, as shown in FIGS. 22A, 22B, and 22C, in the peripheral circuit region 1D, the n-type well NW2 is formed in the active regions AR44 and AR42. This step corresponds to Step S3 in FIG. 4. The n-type well NW2 is formed in the active regions AR44 and AR42 and is also formed under the isolation film 2. The n-type well NW2 is integrally formed in the active regions AR44 and AR42. In addition, the n-type well NW2 is formed so as to surround the side wall and the bottom surface of the groove GV. The n-type well NW2 serves as the first capacitive electrode CE1.

Next, after Step S4 in FIG. 4 is performed, Step S5 is performed. As shown in FIGS. 23A, 23B, and 23C, over the bottom surface and the side wall of the groove GV and the top surface of the semiconductor substrate 1, the first capacitive insulating film CZ1 made of the insulating film 3 is formed. Next, over the first capacitive insulating film CZ1, the conductor film 4 is formed and then Step S6 is performed. In the peripheral circuit region 1D, the conductor film 4 is left along the bottom surface and the side wall of the groove GV to form the second capacitive electrode CE2.

A width W2 of the groove GV is set larger than double the film thickness of the conductor film 4. As a result, when the conductor film 4 made of a polysilicon film is deposited, the groove VB is not filled therewith. That is, the conductor film 4 is formed along the bottom and side surfaces of the groove GV. In the same manner as in Embodiment 1, in Step S6, the resist film PR1 corresponding to the area of the peripheral circuit region 1D where the second capacitive electrode CE2 is to be formed is provided and then the conductor film 4 is patterned.

Next, Steps S7 and S8 are performed. In the same manner as in Embodiment 2, over the second capacitive electrode CE2, the insulating film 7 and the conductor film 8 are deposited. Then, over the conductor film 8, a resist film (not shown) having a pattern covering the portion of the conductor film 8 where the third capacitive electrode CE3 is to be formed and exposing the other region is formed. Using the resist film as a mask, the conductor film 8 is patterned to form the third capacitive electrode CE3, as shown in FIGS. 24A, 24B, and 24C. Then, the insulating film 7 is etched into the same pattern as that of the third capacitive electrode CE3 to form the second capacitive insulating film CZ2.

Since the width W2 of the groove GV is sufficiently large, the third capacitive electrode CE3 is formed along the bottom surface and the side wall of the groove GV. Even after the formation of the third capacitive electrode CE3, the groove GV is not filled therewith.

Next, Step S9 is performed. Then, in the same manner as in Embodiment 2, Step S10 is performed to form the insulating film 9 over the semiconductor substrate 1. Over the peripheral circuit region 1D, the insulating film 9 is formed so as to cover the main surface of the semiconductor substrate 1 and the third capacitive electrode CE3.

Figure 25A:
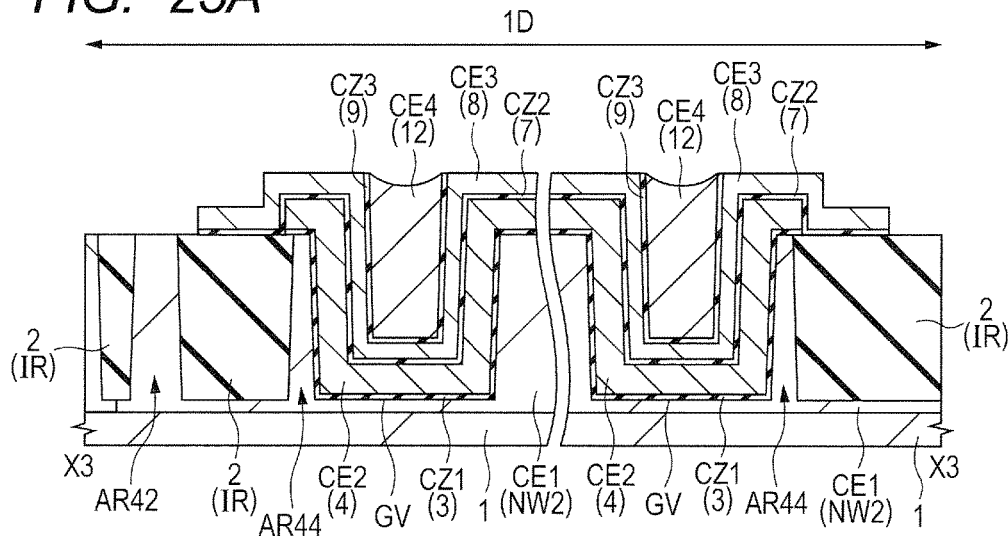
FIG. 25A is a main-portion cross-sectional view of the stacked capacitive element along the line X3-X3 in FIG. 20A during the manufacturing process thereof.
Figure 25B:
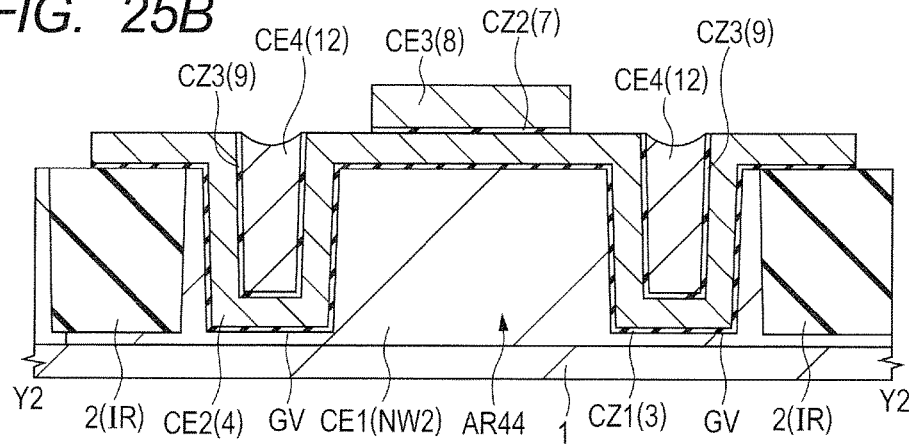
FIG. 25B is a main-portion cross-sectional view of the stacked capacitive element along the line Y2-Y2 in FIG. 20A during the manufacturing process thereof.
Figure 25C:
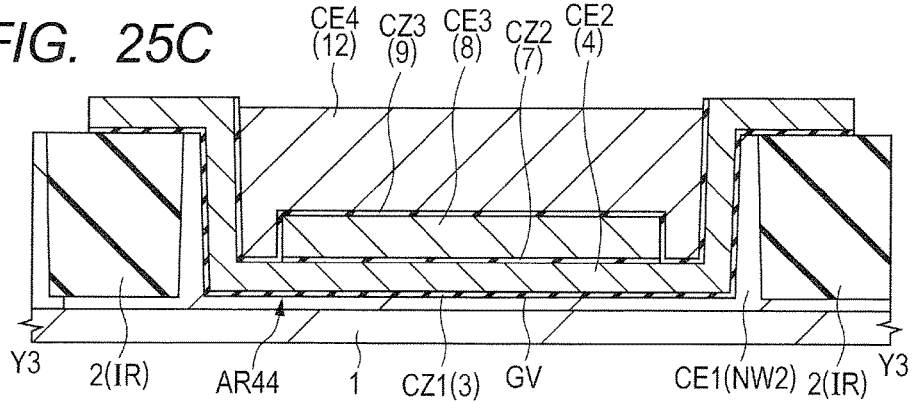
FIG. 25C is a main-portion cross-sectional view of the stacked capacitive element along the line Y3-Y3 in FIG. 20A during the manufacturing process thereof.

Next, after Steps S10 to S12 are performed, Step S13 is performed. In the step of forming the conductor film 12 in Step S13, in the same manner as in Embodiment 2, the conductor film 12 is formed over the insulating film 9 over the peripheral circuit region 1D. Next, as shown in FIGS. 25A, 25B, and 25C, Step S14 is performed to form the fourth capacitive electrode CE4 and the third capacitive insulating film CZ3 over the peripheral circuit region 1D. Here, the third capacitive insulating film CZ3 and the fourth capacitive electrode CE4 are formed in the grooves GV.

Next, in the same manner as in Embodiment 2, Steps S15 to S21 are performed to complete the semiconductor device in Embodiment 3 shown in FIGS. 21A, 21B, and 21C.

<Main Characteristic Features and Effects of Embodiment 3>

According to Embodiment 3, not only the first capacitor, but also the second and third capacitors are formed using the side walls of the grooves GV. This can also increase the capacitance values of the second and third capacitors.

In addition, by forming not only the first capacitor but also the second and third capacitors in the groove GV, the opening in the interlayer insulating film 19 can be made shallower. This can improve the processing accuracy of the opening to also improve the manufacturing yield.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

The following is provided as additional description of parts of the content of the description of the foregoing embodiments.

(Note 1)

Provided is a method of manufacturing a semiconductor device including: a memory cell formed in a first region of a main surface of a semiconductor substrate; a first MISFET formed in a second region of the main surface; and a capacitive element formed in a third region of the main surface. The memory cell includes a control gate electrode formed over the main surface of the semiconductor substrate via a first gate insulating film and a memory gate electrode formed over the main surface of the semiconductor substrate via a second gate insulating film. The second gate insulating film has a charge storage portion and is also interposed between the control gate electrode and the memory gate electrode. The first MISFET includes a first gate electrode formed over the main surface of the semiconductor substrate. The capacitive element includes a first capacitive electrode formed in the semiconductor substrate, a second capacitive electrode formed over the main surface of the semiconductor substrate to overlap the first capacitive electrode in plan view, a third capacitive electrode formed over the second capacitive electrode to overlap the second capacitive electrode in plan view, a fourth capacitive electrode formed over the third capacitive electrode to overlap the third capacitive electrode in plan view, a first capacitive insulating film interposed between the first and second capacitive electrodes, a second capacitive insulating film interposed between the second and third capacitive electrodes, and a third capacitive insulating film interposed between the third and fourth capacitive electrodes. The method includes the steps of: (a) providing the semiconductor substrate having the first, second, and third regions; (b) forming a first semiconductor region serving as the first capacitive electrode in the third region of the semiconductor substrate; (c) forming a first insulating film over the third region of the top surface of the semiconductor substrate to form the first capacitive insulating film; (d) forming a second insulating film over the first region of the top surface of the semiconductor substrate to form the first gate insulating film; (e) forming a first polysilicon film over the semiconductor substrate to form the control gate electrode over the first gate insulating film over the first region and form the second capacitive electrode over the first capacitive insulating film over the third region; (f) forming a third insulating film over the semiconductor substrate to form a second gate insulating film over the first region of the main surface of the semiconductor substrate and over a side surface of the control gate electrode over the first region and form the second capacitive insulating film over the second capacitive electrode over the third region; (g) forming a second polysilicon film over the semiconductor substrate to form the memory gate electrode over the second gate insulating film over the first region and form the third capacitive electrode over the second capacitive insulating film over the third region; (h) forming a fourth insulating film so as to cover the control gate electrode and the memory gate electrode over the first region and cover the third capacitive electrode over the third region and forming the third capacitive insulating film over the third region; and (i) forming a third polysilicon film over the semiconductor substrate to form the first gate electrode over the second region and form the fourth capacitive electrode over the third capacitive insulating film over the third region.

(Note 2)

In the method of manufacturing the semiconductor device according to Note 1, the first insulating film has a film thickness smaller than that of the second insulating film.

(Note 3)

In the method of manufacturing the semiconductor device according to Note 1, the third insulating film is made of a laminated film including a first silicon dioxide film, a first silicon nitride film formed over the first silicon dioxide film, and a second silicon dioxide film formed over the first silicon nitride film.

(Note 4)

In the method of manufacturing the semiconductor device according to Note 1, the fourth insulating film includes a second silicon nitride film.

(Note 5)

Provided is a method of manufacturing a semiconductor device including: a memory cell formed in a first region of a main surface of a semiconductor substrate; a first MISFET formed in a second region of the main surface; and a capacitive element formed in a third region of the main surface. The memory cell includes a control gate electrode formed over the main surface of the semiconductor substrate via a first gate insulating film and a memory gate electrode formed over the main surface of the semiconductor substrate via a second gate insulating film. The second gate insulating film has a charge storage portion and is also interposed between the control gate electrode and the memory gate electrode. The first MISFET includes a first gate electrode formed over the main surface of the semiconductor substrate. The capacitive element includes a first capacitive electrode formed in the semiconductor substrate, a second capacitive electrode formed over the main surface of the semiconductor substrate to overlap the first capacitive electrode in plan view, a third capacitive electrode formed over the second capacitive electrode to overlap the second capacitive electrode in plan view, a fourth capacitive electrode formed over the third capacitive electrode to overlap the third capacitive electrode in plan view, a first capacitive insulating film interposed between the first and second capacitive electrodes, a second capacitive insulating film interposed between the second and third capacitive electrodes, and a third capacitive insulating film interposed between the third and fourth capacitive electrodes. The method includes the steps of: (a) providing the semiconductor substrate having the first, second, and third regions; (b) forming a plurality of grooves in the first, second, third regions of the main surface of the semiconductor substrate, forming an isolation insulating film in each of the grooves, and removing the isolation insulating film in the groove in the third region therefrom to expose a side wall of the groove; (c) forming, in the third region of the semiconductor substrate, a first semiconductor region serving as the first capacitive electrode such that the groove is surrounded thereby; (d) forming a first insulating film over the side wall of the groove in the third region to form the first capacitive insulating film; (e) forming a second insulating film over the first region of the top surface of the semiconductor substrate to form the first gate insulating film; (f) forming a first polysilicon film over the semiconductor substrate to form the control gate electrode over the first gate insulating film over the first region and form the second capacitive electrode over the first capacitive insulating film over the third region; (g) forming a third insulating film over the semiconductor substrate to form a second gate insulating film over the first region of the main surface of the semiconductor substrate and over a side surface of the control gate electrode over the first region and form the second capacitive insulating film over the second capacitive electrode over the third region; (h) forming a second polysilicon film over the semiconductor substrate to form the memory gate electrode over the second gate insulating film over the first region and form the third capacitive electrode over the second capacitive insulating film over the third region; (i) forming a fourth insulating film so as to cover the control gate electrode and the memory gate electrode over the first region and cover the third capacitive electrode over the third region and forming the third capacitive insulating film over the third region; and (j) forming a third polysilicon film over the semiconductor substrate to form the first gate electrode over the second region and form the fourth capacitive electrode over the third capacitive insulating film over the third region.

(Note 6)

In the method of manufacturing the semiconductor device according to Note 5, each of the grooves has a width smaller than double a film thickness of the first polysilicon film.

(Note 7)

In the method of manufacturing the semiconductor device according to Note 6, the second capacitive electrode has an upper end lower in level than the main surface of the semiconductor substrate.

(Note 8)

In the method of manufacturing the semiconductor device according to Note 7, the third capacitive electrode has an upper surface having a recessed portion at a position corresponding to the groove.

(Note 9)

In the method of manufacturing the semiconductor device according to Note 8, the third capacitive insulating film and the fourth capacitive electrode are formed in the recessed portion.

(Note 10)

In the method of manufacturing the semiconductor device according to Note 9, the second polysilicon film has a film thickness smaller than that of the third polysilicon film.

(Note 11)

The method of manufacturing the semiconductor device according to Note 7 further includes: (k) forming an interlayer insulating film so as to cover the fourth capacitive electrode; (l) forming an opening in the interlayer insulating film such that the opening reaches the second capacitive electrode; (m) forming a plug electrode in the opening; and (n) forming, over the interlayer insulating film, a metal wire coupled to the plug electrode.

(Note 12)

In the method of manufacturing the semiconductor device according to Note 5, the groove has a width larger than double a sum of a film thickness of the first polysilicon film and a film thickness of the second polysilicon film.

(Note 13)

In the method of manufacturing the semiconductor device according to Note 12, the second and third capacitive electrodes are formed along the side wall of the groove.

(Note 14)

In the method of manufacturing the semiconductor device according to Note 13, the fourth capacitive electrode is formed in the groove.

(Note 15)

Provided is a method of manufacturing a semiconductor device including: a first capacitive electrode formed in a semiconductor substrate; a second capacitive electrode formed over a main surface of the semiconductor substrate to overlap the first capacitive electrode in plan view; a third capacitive electrode formed over the second capacitive electrode to overlap the second capacitive electrode in plan view; a fourth capacitive electrode formed over the third capacitive electrode to overlap the third capacitive electrode in plan view; a first capacitive insulating film interposed between the first and second capacitive electrodes; a second capacitive insulating film interposed between the second and third capacitive electrodes; and a third capacitive insulating film interposed between the third and fourth capacitive electrodes. The method includes the steps of: (a) providing the semiconductor substrate; (b) forming, in the semiconductor substrate, a first semiconductor region serving as the first capacitive electrode; (c) forming a first insulating film over the main surface of the semiconductor substrate to form the first capacitive insulating film; (d) forming a first polysilicon film over the semiconductor substrate to form the second capacitive electrode over the first capacitive insulating film; (e) forming a second insulating film over the semiconductor substrate to form the second capacitive insulating film over the second capacitive electrode; (f) forming a second polysilicon film over the semiconductor substrate to form the third capacitive electrode over the second capacitive insulating film; (g) forming a third insulating film over the semiconductor substrate to form the third capacitive insulating film over the third capacitive electrode; and (h) forming a third polysilicon film over the semiconductor substrate to form the fourth capacitive electrode over the third capacitive insulating film.

(Note 16)

Provided is a method of manufacturing a semiconductor device including: a first capacitive electrode formed in a semiconductor substrate; a second capacitive electrode formed over the semiconductor substrate to overlap the first capacitive electrode in plan view; a third capacitive electrode formed over the second capacitive electrode to overlap the second capacitive electrode in plan view; a fourth capacitive electrode formed over the third capacitive electrode to overlap the third capacitive electrode in plan view; a first capacitive insulating film interposed between the first and second capacitive electrodes; a second capacitive insulating film interposed between the second and third capacitive electrodes; and a third capacitive insulating film interposed between the third and fourth capacitive electrodes. The method includes the steps of: (a) providing the semiconductor substrate; (b) forming, in a main surface of the semiconductor substrate, a groove having a side wall; (c) forming, in the semiconductor substrate, a first semiconductor region serving as the first capacitive electrode such that the groove is surrounded thereby; (d) forming a first insulating film over the side wall of the groove to form the first capacitive insulating film; (e) forming a first polysilicon film over the semiconductor substrate to form the second capacitive electrode over the first capacitive insulating film; (f) forming a second insulating film over the semiconductor substrate to form the second capacitive insulating film over the second capacitive electrode; (g) forming a second polysilicon film over the semiconductor substrate to form the third capacitive electrode over the second capacitive insulating film; (h) forming a third insulating film over the semiconductor substrate to form the third capacitive insulating film over the third capacitive electrode; and (i) forming a third polysilicon film over the semiconductor substrate to form the fourth capacitive electrode over the third capacitive insulating film.

(Note 17)

In the method of manufacturing the semiconductor device according to Note 16, the second capacitive electrode has an upper end lower in level than the main surface of the semiconductor substrate.

(Note 18)

In the method of manufacturing the semiconductor device according to Note 17, the third capacitive electrode has an upper surface having a recessed portion at a position corresponding to the groove and the third capacitive insulating film and the fourth capacitive electrode are formed in the recessed portion.

(Note 19)

In the method of manufacturing the semiconductor device according to Note 18, the second polysilicon film has a film thickness smaller than that of the third polysilicon film.

(Note 20)

In the method of manufacturing the semiconductor device according to Note 16, the groove has a width larger than double a sum of a film thickness of the first polysilicon film and a film thickness of the second polysilicon film.

(Note 21)

In the method of manufacturing the semiconductor device according to Note 20, the second and third capacitive electrodes are formed along the side wall of the groove.

(Note 22)

In the method of manufacturing the semiconductor device according to Note 21, the fourth capacitive electrode is formed in the groove.

What is claimed is:

1. A semiconductor device, comprising:
  (a) a semiconductor substrate having a main surface;
  (b) a first capacitive electrode made of a semiconductor region formed in the semiconductor substrate;
  (c) a first capacitive insulating film formed over the main surface of the semiconductor substrate so as to directly overlap the first capacitive electrode in plan view;
  (d) a second capacitive electrode directly formed over the first capacitive insulating film so as to overlap the first capacitive electrode in plan view;
  (e) a second capacitive insulating film directly formed over the second capacitive electrode so as to cover the second capacitive electrode;
  (f) a third capacitive electrode directly formed over the second capacitive insulating film above the second capacitive electrode and at a side of the second capacitive electrode so as to overlap the second capacitive electrode in plan view, the third capacitive electrode being formed along an entire vertical portion of a side of the second capacitive electrode;
  (g) a third capacitive insulating film directly formed over the third capacitive electrode so as to cover the third capacitive electrode; and
  (h) a fourth capacitive electrode directly formed over the third capacitive insulating film so as to overlap the third capacitive electrode in plan view, the fourth capacitive electrode being formed along an entire vertical portion of a side of the third capacitive electrode.

2. The semiconductor device according to claim 1, wherein the second capacitive insulating film is made of a laminated film including a first silicon dioxide film, a first silicon nitride film formed over the first silicon dioxide film, and a second silicon dioxide film formed over the first silicon nitride film.

3. The semiconductor device according to claim 1, wherein the third capacitive insulating film includes a silicon nitride film.

4. The semiconductor device according to claim 1, wherein the second capacitive electrode has a first upper surface and a first side surface, and
wherein the second capacitive insulating film and the third capacitive electrode are formed so as to cover the first upper surface and the first side surface.

5. The semiconductor device according to claim 1, wherein the third capacitive electrode has a second upper surface and a second side surface, and
wherein the third capacitive insulating film and the fourth capacitive electrode are formed so as to cover the second upper surface and the second side surface.

6. A semiconductor device, comprising:
  (a) a semiconductor substrate having a main surface and a groove formed in the main surface;
  (b) a first capacitive electrode made of a semiconductor region formed in the semiconductor substrate so as to surround the groove;
  (c) a first capacitive insulating film formed over a side wall of the groove;
  (d) a second capacitive electrode formed over the first capacitive insulating film so as to be embedded in the groove;
  (e) a second capacitive insulating film formed over the second capacitive electrode so as to cover the second capacitive electrode;
  (f) a third capacitive electrode formed over the second capacitive insulating film so as to overlap the second capacitive electrode in plan view;
  (g) a third capacitive insulating film formed over the third capacitive electrode so as to cover the third capacitive electrode; and
  (h) a fourth capacitive electrode formed over the third capacitive insulating film so as to overlap the third capacitive electrode in plan view.

7. The semiconductor device according to claim 6, wherein the groove has a width smaller than double a film thickness of the second capacitive electrode.

8. The semiconductor device according to claim 7, wherein the second capacitive electrode has an upper end lower in level than the main surface of the semiconductor substrate.

9. The semiconductor device according to claim 8, wherein an upper surface of the third capacitive electrode has a recessed portion at a position corresponding to the groove, and
wherein the third capacitive insulating film and the fourth capacitive electrode are formed in the recessed portion.

10. The semiconductor device according to claim 9, wherein the third capacitive electrode has a film thickness smaller than a film thickness of the fourth capacitive electrode.

11. The semiconductor device according to claim 6, further comprising:
  (i) an interlayer insulating film covering the fourth capacitive electrode and having a first opening reaching the second capacitive electrode;
  (j) a first plug electrode formed in the first opening; and
  (k) a first metal wire formed over the interlayer insulating film and coupled to the first plug electrode.

12. The semiconductor device according to claim 11, wherein the first plug electrode is located in the groove in plan view.

13. A semiconductor device, comprising:
  (a) a semiconductor substrate having a main surface and a groove formed in the main surface;
  (b) a first capacitive electrode made of a semiconductor region formed in the semiconductor substrate so as to surround the groove;
  (c) a first capacitive insulating film formed over a side wall of the groove;
  (d) a second capacitive electrode formed over the first capacitive insulating film along the side wall of the groove;
  (e) a second capacitive insulating film formed over the second capacitive electrode along the side wall of the groove;
  (f) a third capacitive electrode formed over the second capacitive insulating film along the side wall of the groove;
  (g) a third capacitive insulating film formed over the third capacitive electrode along the side wall of the groove; and
  (h) a fourth capacitive electrode formed over the third capacitive insulating film in the groove.

14. The semiconductor device according to claim 13, wherein the groove has a width larger than double a sum of a film thickness of the second capacitive electrode and a film thickness of the third capacitive electrode.

15. The semiconductor device according to claim 14, wherein the groove has the width smaller than double a sum of the film thickness of the second capacitive electrode, the film thickness of the third capacitive electrode, and a film thickness of the fourth capacitive electrode.

* * * * *